US006274823B1

(12) United States Patent
Khandros et al.

(10) Patent No.: US 6,274,823 B1
(45) Date of Patent: ***Aug. 14, 2001

(54) INTERCONNECTION SUBSTRATES WITH RESILIENT CONTACT STRUCTURES ON BOTH SIDES

(75) Inventors: Igor Y. Khandros, Peekskill, NY (US); Gaetan L. Mathieu, Carmel, NH (US)

(73) Assignee: FormFactor, Inc., Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/735,812

(22) Filed: Oct. 21, 1996

Related U.S. Application Data

(63) Continuation of application No. 08/340,144, filed on Nov. 15, 1994, now Pat. No. 5,917,707, which is a continuation-in-part of application No. 08/152,812, filed on Nov. 16, 1993, now Pat. No. 5,476,211.

(51) Int. Cl.$^7$ .................................................. H01R 9/09
(52) U.S. Cl. .......................... 174/261; 174/260; 174/267; 439/91; 439/81; 361/773; 361/774; 361/776
(58) Field of Search ..................................... 174/261, 267, 174/260; 439/74, 91, 591, 66, 81; 361/769, 772, 773, 774, 776, 760, 763, 777, 779, 260

(56) References Cited

U.S. PATENT DOCUMENTS

| | | | |
|---|---|---|---|
| 2,869,040 | * | 1/1959 | Pifer ...................................... 174/261 |
| 2,923,859 | | 2/1960 | Worth et al. .......................... 317/101 |
| 3,047,683 | | 7/1962 | Shlesinger, Jr. ........................ 200/26 |
| 3,070,650 | | 12/1962 | Stearns .................................. 174/88 |

(List continued on next page.)

FOREIGN PATENT DOCUMENTS

| | | |
|---|---|---|
| 1026876 | 3/1958 | (DE) . |
| 2232794 | 1/1973 | (DE) . |
| 25 08 702 A1 | 9/1976 | (DE) . |

(List continued on next page.)

OTHER PUBLICATIONS

"Method of Testing Chips and Joining Chips to Substrates" Research Disclosure, No. 322, Feb. 1, 1991, p. 130, XP000169195.

"Bimetal VLSI Chip Interconnections" IBM Technical Disclosure Bulletin, vol 29, No. 11, Apr. 1987, pp. 5021–5022, XP002040446.

(List continued on next page.)

*Primary Examiner*—Jeffrey Gaffin
*Assistant Examiner*—Kamand Cuneo
(74) *Attorney, Agent, or Firm*—Blakely, Sokoloff, Taylor & Zafman

(57) ABSTRACT

An interconnection contact structure assembly including an electronic component having a surface and a conductive contact carried by the electronic component and accessible at the surface. The contact structure includes an internal flexible elongate member having first and second ends and with the first end forming a first intimate bond to the surface of said conductive contact terminal without the use of a separate bonding material. An electrically conductive shell is provided and is formed of at least one layer of a conductive material enveloping the elongate member and forming a second intimate bond with at least a portion of the conductive contact terminal immediately adjacent the first intimate bond. The component carries the contact structures on both sides, the spacing of the structures on the first side being different than that of the second side.

15 Claims, 19 Drawing Sheets

U.S. PATENT DOCUMENTS

| | | | |
|---|---|---|---|
| 3,075,282 | 1/1963 | McConville | 29/155.55 |
| 3,202,489 | 8/1965 | Bender et al. | 29/195 |
| 3,258,736 | 6/1966 | Crawford et al. | 339/252 |
| 3,281,751 | 10/1966 | Blair | 339/17 |
| 3,286,340 | 11/1966 | Kritzler et al. | 29/471.1 |
| 3,296,692 | 1/1967 | Griffin | 29/472.9 |
| 3,302,067 | 1/1967 | Jackson et al. | 317/101 |
| 3,344,228 | 9/1967 | Woodland et al. | 174/107 |
| 3,368,114 | 2/1968 | Campbell et al. | 317/101 |
| 3,373,481 | 3/1968 | Lins et al. | 29/471.3 |
| 3,389,457 | 6/1968 | Goldman et al. | 29/580 |
| 3,390,308 | 6/1968 | Marley | 317/100 |
| 3,392,442 | 7/1968 | Napier et al. | 29/628 |
| 3,397,451 | 8/1968 | Avedissian et al. | 29/589 |
| 3,426,252 | 2/1969 | Lepselter | 317/234 |
| 3,429,040 | 2/1969 | Miller | 29/626 |
| 3,460,238 | 8/1969 | Christy et al. | 227/111 |
| 3,467,765 | 9/1969 | Croft | 174/94 |
| 3,472,365 | 10/1969 | Tiedema | 206/56 |
| 3,474,297 | 10/1969 | Bylander | 317/101 |
| 3,487,541 | 1/1970 | Boswell | 29/626 |
| 3,495,170 | 2/1970 | Biard et al. | 324/62 |
| 3,509,270 | 4/1970 | Dube et al. | 29/625 |
| 3,517,438 | 6/1970 | Johnson et al. | 29/627 |
| 3,550,645 | 12/1970 | Keough | 140/92.2 |
| 3,555,477 | 1/1971 | Hildebrandt | 336/192 |
| 3,567,846 | 3/1971 | Brorein et al. | 174/102 |
| 3,569,610 | 3/1971 | Gardner et al. | 174/102 |
| 3,590,480 | 7/1971 | Johnson, Jr. | 29/605 |
| 3,591,839 | 7/1971 | Evans | 317/234 |
| 3,611,061 | 10/1971 | Segerson | 317/234 R |
| 3,614,832 | 10/1971 | Chance et al. | 29/626 |
| 3,616,532 | 11/1971 | Beck | 174/68.5 |
| 3,623,649 | 11/1971 | Keisling | 228/15 |
| 3,627,124 | 12/1971 | Hance | 209/45 |
| 3,672,047 | 6/1972 | Sakamoto et al. | 29/628 |
| 3,673,681 | 7/1972 | Steranko | 29/626 |
| 3,680,037 | 7/1972 | Nellis et al. | 339/61 M |
| 3,680,206 | 8/1972 | Roberts | 29/580 |
| 3,683,105 | 8/1972 | Shamash et al. | 174/68.5 |
| 3,689,991 | 9/1972 | Aird | 20/577 |
| 3,719,981 | 3/1973 | Steitz | 29/423 |
| 3,724,068 | 4/1973 | Galli | 29/626 |
| 3,753,665 | 8/1973 | McCary et al. | 29/191.6 |
| 3,772,575 | 11/1973 | Hegarty et al. | 317/235 R |
| 3,795,037 | 3/1974 | Luttmer | 29/628 |
| 3,795,884 | 3/1974 | Kotaka | 339/17 LM |
| 3,811,186 | 5/1974 | Larnerd et al. | 29/626 |
| 3,825,353 | 7/1974 | Loro | 317/234 R |
| 3,832,632 | 8/1974 | Ardezzone | 324/158 P |
| 3,832,769 | 9/1974 | Olyphant, Jr. et al. | 29/626 |
| 3,839,727 | 10/1974 | Herdzik et al. | 357/71 |
| 3,842,189 | 10/1974 | Southgate | 174/52 S |
| 3,844,909 | 10/1974 | McCary et al. | 204/40 |
| 3,861,135 | 1/1975 | Seeger, Jr. et al. | 58/50 R |
| 3,862,790 | 1/1975 | Davies et al. | 339/17 LM |
| 3,862,791 | 1/1975 | Miller | 339/198 R |
| 3,864,728 | 2/1975 | Peltz et al. | 357/71 |
| 3,868,724 | 2/1975 | Perrino | 357/65 |
| 3,871,014 | 3/1975 | King et al. | 357/67 |
| 3,871,015 | 3/1975 | Lin et al. | 357/67 |
| 3,873,173 | 3/1975 | Anhault | 339/17 CF |
| 3,877,064 | 4/1975 | Scheingold et al. | 357 |
| 3,900,153 | 8/1975 | Beerwerth et al. | 228/246 |
| 3,904,262 | 9/1975 | Cutchaw | 339/17 CF |
| 3,917,900 | 11/1975 | Arnaudin | 174/107 |
| 3,921,285 | 11/1975 | Krall | 29/626 |
| 3,926,360 | 12/1975 | Moister, Jr. | 228/180 |
| 3,939,559 | 2/1976 | Fendley et al. | 29/628 |
| 3,940,786 | 2/1976 | Scheingold et al. | 357/74 |
| 3,982,320 | 9/1976 | Buchoff et al. | 29/630 R |
| 3,984,166 | 10/1976 | Hutchison | 339/17 CF |
| 3,990,689 | 11/1976 | Eklund, Sr. | 269/21 |
| 3,991,463 | 11/1976 | Squitieri et al. | 29/629 |
| 4,003,621 | 1/1977 | Lamp | 339/59 M |
| 4,009,485 | 2/1977 | Koenig | 357/68 |
| 4,034,468 | 7/1977 | Koopman | 29/628 |
| 4,067,104 | 1/1978 | Tracy | 29/626 |
| 4,074,342 | 2/1978 | Honn et al. | 361/411 |
| 4,080,722 | 3/1978 | Klatskin et al. | 29/580 |
| 4,139,936 | 2/1979 | Abrams et al. | 29/624 |
| 4,142,288 | 3/1979 | Flammer et al. | 29/628 |
| 4,149,135 | 4/1979 | Roespel et al. | 336/65 |
| 4,155,615 | 5/1979 | Zimmerman Jr. et al. | 339/14 L |
| 4,161,692 | 7/1979 | Tarzwell | 324/158 P |
| 4,179,802 | 12/1979 | Joshi et al. | 29/628 |
| 4,189,825 | 2/1980 | Robillard et al. | 29/574 |
| 4,195,193 | 3/1980 | Grabbe et al. | 174/52 FP |
| 4,216,350 | 8/1980 | Reid | 174/68.5 |
| 4,225,900 | 9/1980 | Ciccio et al. | 361/395 |
| 4,231,154 | 11/1980 | Gazdik et al. | 29/840 |
| 4,237,607 | 12/1980 | Ohno | 29/840 |
| 4,272,140 | 6/1981 | Lychyk et al. | 339/17 CF |
| 4,278,311 | 7/1981 | Scheingold et al. | 339/17 CF |
| 4,295,700 | 10/1981 | Sado | 339/61 M |
| 4,312,117 | 1/1982 | Robillard et al. | 29/589 |
| 4,322,778 | 3/1982 | Barbour et al. | 361/414 |
| 4,326,663 | 4/1982 | Oettel | 228/123 |
| 4,330,165 | 5/1982 | Sado | 339/59 |
| 4,332,341 | 6/1982 | Minetti | 228/180 A |
| 4,356,374 | 10/1982 | Noyori et al. | 219/121 PE |
| 4,374,457 | 2/1983 | Wiech, Jr. | 29/591 |
| 4,385,202 | 5/1983 | Spinelli et al. | 174/68.5 |
| 4,396,935 | 8/1983 | Schuck | 357/74 |
| 4,402,450 | 9/1983 | Abraham et al. | 228/180 A |
| 4,407,007 | 9/1983 | Desai et al. | 357/74 |
| 4,408,218 | 10/1983 | Grabbe | 357/70 |
| 4,410,905 | 10/1983 | Grabbe | 357/80 |
| 4,412,642 | 11/1983 | Fisher | 228/173 R |
| 4,417,392 | 11/1983 | Ibrahim et al. | 29/840 |
| 4,418,857 | 12/1983 | Ainslie et al. | 228/124 |
| 4,419,818 | 12/1983 | Grabbe | 29/832 |
| 4,422,568 | 12/1983 | Elles et al. | 228/111 |
| 4,442,938 | 4/1984 | Murphy | 206/329 |
| 4,442,967 | 4/1984 | van de Pas et al. | 228/159 |
| 4,447,857 | 5/1984 | Marks et al. | 361/395 |
| 4,453,176 | 6/1984 | Chance et al. | 357/51 |
| 4,462,534 | 7/1984 | Bitaillou et al. | 228/180 A |
| 4,472,762 | 9/1984 | Spinelli et al. | 361/386 |
| 4,509,099 | 4/1985 | Takamatsu et al. | 361/413 |
| 4,513,355 | 4/1985 | Schroeder et al. | 361/403 |
| 4,514,750 | 4/1985 | Adams | 357/70 |
| 4,520,561 | 6/1985 | Brown | 29/840 |
| 4,525,383 | 6/1985 | Saito | 427/89 |
| 4,532,152 | 7/1985 | Elarde | 427/96 |
| 4,542,438 | 9/1985 | Yamamoto | 361/403 |
| 4,545,610 | 10/1985 | Lakritz et al. | 29/589 |
| 4,546,406 | 10/1985 | Spinelli et al. | 361/386 |
| 4,547,833 | 10/1985 | Sharp | 361/386 |
| 4,548,451 | * 10/1985 | Benarr et al. | 439/85 |
| 4,551,746 | 11/1985 | Gilbert et al. | 357/74 |
| 4,553,192 | 11/1985 | Babuka et al. | 361/395 |
| 4,574,470 | 3/1986 | Burt | 29/590 |
| 4,581,291 | 4/1986 | Bongianni | 428/381 |
| 4,595,794 | 6/1986 | Wasserman | 174/138 |
| 4,597,522 | 7/1986 | Kobayashi | 228/179 |
| 4,597,617 | 7/1986 | Enochs | 339/17 CF |
| 4,600,138 | 7/1986 | Hill | 228/179 |
| 4,604,644 | 8/1986 | Beckham et al. | 357/80 |
| 4,615,573 | 10/1986 | White et al. | 339/17 M |
| 4,627,151 | 12/1986 | Mulholland et al. | 29/569 R |

| | | | | | | | |
|---|---|---|---|---|---|---|---|
| 4,628,406 | 12/1986 | Smith et al. | 361/386 | 4,878,846 | 11/1989 | Schroeder | 439/65 |
| 4,628,410 | 12/1986 | Goodman et al. | 361/413 | 4,884,122 | 11/1989 | Eichelberger et al. | 357/71 |
| 4,634,199 | 1/1987 | Anhalt et al. | 339/17 M | 4,887,148 | 12/1989 | Mu | 357/74 |
| 4,640,499 | 2/1987 | Hemler et al. | 267/160 | 4,890,194 | 12/1989 | Derryberry | 361/386 |
| 4,641,176 | 2/1987 | Keryhuel et al. | 357/74 | 4,893,172 | 1/1990 | Matsumoto et al. | 357/79 |
| 4,641,426 | 2/1987 | Hartman et al. | 29/839 | 4,902,606 | 2/1990 | Patraw | 430/314 |
| 4,642,889 | 2/1987 | Grabbe | 29/840 | 4,903,120 | 2/1990 | Beene et al. | 357/74 |
| 4,646,435 | 3/1987 | Grassauer | 29/840 | 4,903,889 | 2/1990 | Svendsen et al. | 228/180.2 |
| 4,647,126 | 3/1987 | Sobota | 339/17 CF | 4,907,734 | 3/1990 | Conru et al. | 228/123 |
| 4,647,959 | 3/1987 | Smith | 357/74 | 4,914,814 | 4/1990 | Behun et al. | 29/843 |
| 4,649,415 | 3/1987 | Herbert | 357/74 | 4,918,811 | 4/1990 | Eichelberger | 29/840 |
| 4,659,437 | 4/1987 | Shiba et al. | 204/28 | 4,922,376 | 5/1990 | Pommer et al. | 361/386 |
| 4,661,192 | 4/1987 | McShane | 156/292 | 4,924,353 | 5/1990 | Patraw | 361/400 |
| 4,664,309 | 5/1987 | Allen et al. | 228/180.2 | 4,926,241 | 5/1990 | Carey | 357/75 |
| 4,667,219 | 5/1987 | Lee et al. | 357/68 | 4,931,149 | 6/1990 | Stierman et al. | 204/15 |
| 4,670,770 | 6/1987 | Tai | 357/60 | 4,932,902 | 6/1990 | Crane, Jr. | 439/627 |
| 4,673,967 | 6/1987 | Hingorany | 357/70 | 4,937,203 | 6/1990 | Eichelberger et al. | 437/51 |
| 4,677,458 | 6/1987 | Morris | 357/74 | 4,941,033 | 7/1990 | Kishida | 357/75 |
| 4,681,654 | 7/1987 | Clementi et al. | 156/630 | 4,942,140 | 7/1990 | Ootsuki et al. | 437/211 |
| 4,685,998 | 8/1987 | Quinn et al. | 156/633 | 4,943,845 | 7/1990 | Wilby | 357/74 |
| 4,688,074 | 8/1987 | Iinuma | 357/79 | 4,954,878 | 9/1990 | Fox et al. | 357/81 |
| 4,695,870 | 9/1987 | Patraw | 357/74 | 4,955,523 | 9/1990 | Calomagno et al. | 228/179 |
| 4,695,872 | 9/1987 | Chatterjee | 357/75 | 4,956,749 | 9/1990 | Chang | 361/414 |
| 4,700,276 | 10/1987 | Freyman et al. | 361/403 | 4,967,261 | 10/1990 | Niki et al. | 357/70 |
| 4,700,473 | 10/1987 | Freyman et al. | 29/846 | 4,970,570 | 11/1990 | Agarwala et al. | 357/68 |
| 4,703,393 | 10/1987 | Yamamoto et al. | 361/405 | 4,975,079 | 12/1990 | Beaman et al. | 439/482 |
| 4,705,205 | 11/1987 | Allen et al. | 228/180.2 | 4,982,264 | 1/1991 | Cragon et al. | 357/75 |
| 4,707,657 * | 11/1987 | Boegh-Petersen | 324/537 | 4,983,907 | 1/1991 | Crowley | 324/158 P |
| 4,708,885 | 11/1987 | Saito et al. | 427/58 | 4,989,069 | 1/1991 | Hawkins | 357/74 |
| 4,709,468 | 12/1987 | Wilson | 437/209 | 4,998,885 | 3/1991 | Beaman | 439/66 |
| 4,710,798 | 12/1987 | Marcantonio | 357/80 | 5,006,673 | 4/1991 | Freyman et al. | 174/255 |
| 4,716,049 | 12/1987 | Patraw | 427/96 | 5,007,576 | 4/1991 | Congleton et al. | 228/103 |
| 4,721,993 | 1/1988 | Walter | 357/70 | 5,012,187 | 4/1991 | Littlebury | 324/158 P |
| 4,732,313 | 3/1988 | Kobayashi et al. | 228/179 | 5,014,111 | 5/1991 | Tsuda et al. | 357/68 |
| 4,739,125 | 4/1988 | Watanabe et al. | 174/52 FP | 5,024,372 | 6/1991 | Altman et al. | 228/248 |
| 4,746,300 | 5/1988 | Thevenin | 439/82 | 5,024,746 | 6/1991 | Stierman et al. | 204/297 W |
| 4,750,089 | 6/1988 | Derryberry et al. | 361/388 | 5,025,306 | 6/1991 | Johnson et al. | 357/75 |
| 4,751,199 | 6/1988 | Phy | 437/209 | 5,029,325 | 7/1991 | Higgins, III et al. | 357/80 |
| 4,751,482 | 6/1988 | Fukuta et al. | 333/247 | 5,037,023 | 8/1991 | Akiyama et al. | 228/102 |
| 4,754,316 | 6/1988 | Reid | 357/68 | 5,041,901 | 8/1991 | Kitano et al. | 357/70 |
| 4,757,256 | 7/1988 | Whann et al. | 324/158 P | 5,045,921 | 9/1991 | Lin et al. | 357/74 |
| 4,764,804 | 8/1988 | Sahara et al. | 357/81 | 5,045,975 | 9/1991 | Cray et al. | 361/412 |
| 4,764,848 * | 8/1988 | Simpson | 361/776 | 5,047,830 | 9/1991 | Grabbe | 357/68 |
| 4,767,344 | 8/1988 | Noschese | 439/83 | 5,053,922 | 10/1991 | Matta et al. | 361/386 |
| 4,772,936 | 9/1988 | Reding et al. | 357/80 | 5,055,780 | 10/1991 | Takagi et al. | 324/158 F |
| 4,777,564 | 10/1988 | Derfiny et al. | 361/405 | 5,057,461 | 10/1991 | Fritz | 437/220 |
| 4,783,719 | 11/1988 | Jamison et al. | 361/398 | 5,059,557 | 10/1991 | Cragon et al. | 437/208 |
| 4,784,872 | 11/1988 | Moeller et al. | 427/96 | 5,060,843 | 10/1991 | Yasuzato et al. | 228/179 |
| 4,793,814 | 12/1988 | Zifcak et al. | 439/66 | 5,065,281 | 11/1991 | Hernandez et al. | 361/388 |
| 4,796,078 | 1/1989 | Phelps, Jr. et al. | 357/68 | 5,066,907 | 11/1991 | Tarzwell et al. | 324/158 P |
| 4,807,021 | 2/1989 | Okumura | 357/75 | 5,067,007 * | 11/1991 | Kanji et al. | 257/701 |
| 4,811,082 | 3/1989 | Jacobs et al. | 357/80 | 5,071,359 | 12/1991 | Arnio et al. | 439/91 |
| 4,814,295 | 3/1989 | Mehta | 437/209 | 5,077,633 | 12/1991 | Freyman et al. | 361/403 |
| 4,816,426 | 3/1989 | Bridges et al. | 437/207 | 5,083,697 | 1/1992 | Difrancesco | 230/116 |
| 4,818,728 | 4/1989 | Rai et al. | 437/209 | 5,086,337 | 2/1992 | Noro et al. | 357/79 |
| 4,818,823 | 4/1989 | Bradley | 174/68.5 | 5,088,007 | 2/1992 | Missele | 361/386 |
| 4,821,148 | 4/1989 | Kobayashi et al. | 361/392 | 5,095,187 | 3/1992 | Gliga | 219/68 |
| 4,827,611 | 5/1989 | Pai et al. | 29/843 | 5,097,100 | 3/1992 | Jackson | 174/94 R |
| 4,837,622 | 6/1989 | Whann et al. | 324/158 P | 5,106,784 | 4/1992 | Bednarz | 437/214 |
| 4,842,184 | 6/1989 | Miller | 228/180.1 | 5,109,596 | 5/1992 | Driller et al. | 29/705 |
| 4,855,867 | 8/1989 | Gadzik | 361/306 | 5,110,032 | 5/1992 | Akiyama et al. | 228/102 |
| 4,857,482 | 8/1989 | Saito et al. | 437/209 | 5,118,027 | 6/1992 | Braun et al. | 228/180.2 |
| 4,858,819 | 8/1989 | Hill et al. | 228/179 | 5,123,850 | 6/1992 | Elder et al. | 439/67 |
| 4,860,433 | 8/1989 | Miura | 29/605 | 5,127,570 | 7/1992 | Steitz et al. | 228/103 |
| 4,861,452 | 8/1989 | Stierman et al. | 204/297 W | 5,128,612 | 7/1992 | Aton et al. | 324/158 |
| 4,868,638 | 9/1989 | Hirata et al. | 357/72 | 5,130,779 | 7/1992 | Agarwala et al. | 357/67 |
| 4,874,476 | 10/1989 | Stierman et al. | 204/15 | 5,130,783 | 7/1992 | McLellan | 357/74 |
| 4,874,721 | 10/1989 | Kimura et al. | 437/209 | 5,131,852 | 7/1992 | Grabbe et al. | 439/71 |
| 4,874,722 | 10/1989 | Bednarz et al. | 437/209 | 5,134,462 | 7/1992 | Freyman et al. | 357/74 |
| 4,878,098 | 10/1989 | Saito et al. | 357/68 | 5,136,366 | 8/1992 | Worp et al. | 357/72 |
| 4,878,611 | 11/1989 | Lo Vasco et al. | 228/180.2 | 5,136,367 | 8/1992 | Chiu | 357/74 |

| | | | |
|---|---|---|---|
| 5,139,427 * | 8/1992 | Boyd et al. ............................ 439/66 |
| 5,147,084 | 9/1992 | Behun et al. ....................... 228/56.3 |
| 5,148,103 | 9/1992 | Pasiecznik, Jr. ................... 324/158 P |
| 5,148,265 | 9/1992 | Khandros et al. ..................... 357/80 |
| 5,148,266 | 9/1992 | Khandros et al. ..................... 357/80 |
| 5,148,968 | 9/1992 | Schmidt et al. .................. 228/180.2 |
| 5,152,695 | 10/1992 | Grabbe et al. ......................... 439/71 |
| 5,154,341 | 10/1992 | Melton et al. .................... 228/180.2 |
| 5,157,325 | 10/1992 | Murphy ............................ 324/158 F |
| 5,173,055 | 12/1992 | Grabbe ................................... 439/66 |
| 5,180,977 | 1/1993 | Huff .................................. 324/158 P |
| 5,185,073 | 2/1993 | Bindra et al. ........................ 205/104 |
| 5,187,020 | 2/1993 | Kwon et al. .......................... 428/601 |
| 5,189,507 | 2/1993 | Carlomagno et al. ................ 257/777 |
| 5,192,018 | 3/1993 | Terakado et al. .................... 228/179 |
| 5,192,681 | 3/1993 | Chiu ..................................... 437/217 |
| 5,196,268 | 3/1993 | Fritz ..................................... 428/458 |
| 5,198,153 | 3/1993 | Angelopoulos et al. ............. 252/500 |
| 5,200,112 | 4/1993 | Angelopoulos et al. ............. 252/500 |
| 5,201,454 | 4/1993 | Alfaro et al. ......................... 228/110 |
| 5,202,061 | 4/1993 | Angelopoulos et al. ............. 252/500 |
| 5,210,939 | 5/1993 | Mallik et al. ........................... 29/840 |
| 5,214,563 | 5/1993 | Estes .................................... 361/386 |
| 5,217,597 | 6/1993 | Moore et al. ........................ 205/123 |
| 5,218,292 | 6/1993 | Goto ................................ 324/158 F |
| 5,221,815 | 6/1993 | Bostock et al. .................... 174/84 R |
| 5,227,662 | 7/1993 | Ohno et al. .......................... 257/676 |
| 5,228,861 * | 7/1993 | Grabbe ................................... 439/66 |
| 5,237,203 | 8/1993 | Massaron ............................. 257/688 |
| 5,239,199 | 8/1993 | Chiu ..................................... 257/706 |
| 5,239,447 | 8/1993 | Cotues et al. ........................ 361/744 |
| 5,241,133 | 8/1993 | Mullen, III et al. ................ 174/52.4 |
| 5,246,159 | 9/1993 | Kitamura ............................. 228/179 |
| 5,258,330 | 11/1993 | Khandros et al. .................... 437/209 |
| 5,263,246 | 11/1993 | Aoki ....................................... 29/843 |
| 5,282,312 | 2/1994 | DiStefano et al. .................... 29/830 |
| 5,283,104 | 2/1994 | Aoude et al. ......................... 428/195 |
| 5,285,949 | 2/1994 | Oikawa et al. .................... 228/179.1 |
| 5,288,007 | 2/1994 | Interrante et al. .................... 228/119 |
| 5,289,346 | 2/1994 | Carey et al. ......................... 361/777 |
| 5,294,039 | 3/1994 | Pai et al. .......................... 228/180.22 |
| 5,299,939 | 4/1994 | Walker ................................... 439/74 |
| 5,306,670 | 4/1994 | Mowatt et al. ...................... 437/209 |
| 5,308,797 | 5/1994 | Kee ...................................... 437/209 |
| 5,309,324 | 5/1994 | Hernandez et al. .................. 361/734 |
| 5,311,059 * | 5/1994 | Banerji et al. ........................ 527/778 |
| 5,313,368 | 5/1994 | Volz et al. ............................ 361/774 |
| 5,316,204 | 5/1994 | Takehashi et al. ................. 228/179.1 |
| 5,317,479 | 5/1994 | Pai et al. .............................. 361/773 |
| 5,321,277 | 6/1994 | Sparks et al. .......................... 257/48 |
| 5,326,643 | 7/1994 | Adamopoulos et al. .......... 428/472.2 |
| 5,327,327 | 7/1994 | Frew et al. ........................... 361/784 |
| 5,331,203 | 7/1994 | Wojnarowski et al. .............. 257/698 |
| 5,337,475 | 8/1994 | Aoude et al. ........................... 29/852 |
| 5,338,705 | 8/1994 | Harris et al. ......................... 437/217 |
| 5,339,027 | 8/1994 | Woith et al. ......................... 324/754 |
| 5,346,861 | 9/1994 | Khandros et al. .................... 437/209 |
| 5,347,159 | 9/1994 | Khandros et al. .................... 257/692 |
| 5,347,162 | 9/1994 | Pasch ................................... 257/773 |
| 5,350,947 | 9/1994 | Takekawa et al. ................... 257/702 |
| 5,355,283 * | 10/1994 | Marrs et al. .......................... 361/760 |
| 5,359,493 | 10/1994 | Chiu ..................................... 361/719 |
| 5,366,380 | 11/1994 | Reymond ............................... 439/66 |
| 5,367,764 | 11/1994 | DiStefano et al. ..................... 29/830 |
| 5,378,982 | 1/1995 | Feigenbaum et al. ................ 324/770 |
| 5,379,191 | 1/1995 | Carey et al. ......................... 361/777 |
| 5,381,848 | 1/1995 | Trabucco .............................. 164/102 |
| 5,382,898 | 1/1995 | Subramanian ....................... 324/754 |
| 5,386,341 * | 1/1995 | Olson et al. .......................... 361/749 |
| 5,386,344 | 1/1995 | Beaman et al. ....................... 361/785 |
| 5,388,327 | 2/1995 | Trabucco ............................... 29/830 |
| 5,390,844 | 2/1995 | Distefano et al. ............... 228/120.21 |
| 5,397,245 | 3/1995 | Roebuck et al. ..................... 439/264 |
| 5,398,863 | 3/1995 | Grube et al. ......................... 228/106 |
| 5,399,982 | 3/1995 | Driller et al. ........................ 324/754 |
| 5,414,298 | 5/1995 | Grube et al. ......................... 257/690 |
| 5,414,299 | 5/1995 | Wang et al. .......................... 257/702 |
| 5,422,574 | 6/1995 | Kister ................................... 324/754 |
| 5,424,652 | 6/1995 | Hembree et al. ..................... 324/765 |
| 5,432,677 | 7/1995 | Mowatt ................................ 361/719 |
| 5,435,482 | 7/1995 | Variot et al. ......................... 228/254 |
| 5,442,282 | 8/1995 | Rostoker et al. .................. 324/158.1 |
| 5,448,106 | 9/1995 | Fujitsu ................................. 257/668 |
| 5,453,583 | 9/1995 | Rostoker et al. .................... 174/267 |
| 5,455,390 | 10/1995 | DiStefano et al. ................... 174/262 |
| 5,471,151 | 11/1995 | DiFrancesco ........................ 324/757 |
| 5,477,611 | 12/1995 | Sweis et al. ............................ 29/840 |
| 5,489,749 | 2/1996 | DiStefano et al. ................... 174/261 |
| 5,491,302 | 2/1996 | DiStefano et al. ................... 114/260 |
| 5,518,964 | 5/1996 | DiStefano et al. ................... 438/209 |
| 5,525,545 | 6/1996 | Grube et al. ......................... 437/209 |
| 5,535,101 * | 7/1996 | Miles et al. .......................... 361/808 |

FOREIGN PATENT DOCUMENTS

| | | | |
|---|---|---|---|
| 0 528 367 | 2/1993 | (EP) ........................... H01L/25/065 |
| 0 593 966 | 4/1994 | (EP) ........................... H01L/23/538 |
| 2 643 753 | 8/1990 | (FR) ............................. H01R/4/50 |
| 2167228 | 5/1985 | (GB) . |
| 61-287254 | 12/1986 | (JP) ............................. H01L/25/04 |
| 62-250650 | 10/1987 | (JP) . |
| 3-142847 | 10/1989 | (JP) . |
| 2-105560 | 4/1990 | (JP) . |
| 2-181958 | 9/1990 | (JP) . |
| 3-138969 | 6/1991 | (JP) . |
| 3-225946 | 10/1991 | (JP) . |
| 5-102280 | 4/1993 | (JP) . |
| 1003 396 | 2/1980 | (SU) . |
| WO 91/12706 | 8/1991 | (WO) . |
| WO 94/03036 | 2/1994 | (WO) ............................. H05K/3/36 |

OTHER PUBLICATIONS

*Ney Contact Manual*, Electrical Contacts for Low Energy Uses, Kenneth E. Pitney, Jan., 1973.

*Nickel Plating*, by Robert Brugger, Robert Draper Ltd. (UK), 1970.

*Printed Circuits in Space Technology*, Albert E. Linden, Prentice–Hall, Inc., 1962.

Copper Corrosion With and Without Inhibitors, Brusic, et al., J. Electrochemical Society, vol. 138, pp 2253–2259, No. 8, Aug. 1991.

Electroplating Technology, Duffy, Noyes Data Corporation, 1981.

Reliability of $\mu$BGA Packaging Technology, Faraji, et al.

Bumped Flex on Chip: A Novel Approach to High Density Chip Packaging, DiStefano.

Flex on Chip for High Density Chip Packaging, Fjelstad and DiStefano.

Performance of a Novel Laminated Substrate for MCM Applications, Martinez et al.

A New Option for Meeting the Challenge of Known Good Die, DiStefano, et al.

Novel Uses of Flexible Circuit Technology in High Performance Electronic Applications, DiStefano and Fjelstad.

Multilayer Flexible Circuit Technology for High Performance Electronics, DiStefano et al.

*Plating Micro Bonding Used for Tape Carrier Package*, Ando, et al., NIST, VLSI Packaging Workshop, Oct. 11–13, 1993, one page.

* cited by examiner

INTERCONNECTION SUBSTRATES WITH RESILIENT CONTACT STRUCTURES ON BOTH SIDES

This application is a continuation of commonly-owned, U.S. patent application Ser. No. 08/340,144 filed Nov. 15, 1994 now U.S. Pat. No. 5,917,707, which is a continuation-in-part of application Ser. No. 08/152,812 filed on Nov. 16, 1993 U.S. Pat No. 5,476,211. This invention relates to an interconnection contact structure, interposer, semiconductor assembly and package using the same and method for fabricating the same.

Heretofore many types of interconnections which have been provided for use with the semiconductor devices have suffered from one or more disadvantages limiting their broad application in the semiconductor industry. There is therefore need for new and improved interconnection contact structure which overcomes such disadvantages so that it will be particularly useful in semiconductor assemblies and packages and which can be broadly used throughout the semiconductor industry.

In general, it is an object of the present invention to provide a contact structure, interposer, a semiconductor assembly and package using the same and a method for fabricating the same which makes it possible to use contact structures and particularly resilient contact structures attached directly to active silicon devices.

Another object of the invention is to provide a structure, interposer, assembly and method of the above character which makes it possible to make temporary contacts against pads for burn-ins on test substrates.

Another object of the invention is to provide a structure, interposer, assembly and method of the above character which makes it possible to utilize spacings or pitches at the originating points for the contact structures which are different from the terminating points for the contact structure.

Another object of the invention is to provide a structure, interposer, assembly and method which utilizes staggered contact structures making possible three-dimensional fanouts.

Another object of the invention is to provide a structure, interposer, assembly and method of the above character which make it possible for the contact structures to be attached to pads in area arrays, peripheral, edge or center line pad outs.

Another object of the invention is to provide a structure, interposer, assembly and method of the above character which with one sided edge pad outs, the contact can be shaped in a way that enables closely spaced edge mounting of chips on SIMM and other cards.

Another object of the invention is to provide a structure, interposer, assembly and method of the above character which makes it possible to mount contacts on devices in either wafer or singulated form.

Another object of the invention is to provide a structure, interposer, assembly and method in which contact attachment can be accomplished with automatic equipment.

Another object of the invention is to provide a structure, interposer, assembly and method which makes it possible to utilize under chip capacitors to save in real estate.

Another object of the invention is to provide a structure, interposer, assembly and method of the above character which can be utilized for providing more than one substrate precursor populated with card ready silicon on both sides which optionally can be interconnected with resilient contacts.

Additional objects and features of the invention will appear from the following description in which the preferred embodiments are set forth in the accompanying drawings.

In general the contact structure of the present invention is for use with a device which incorporates an electronic component having a surface and a conductive contact pad thereon accessible from the surface of the electronic component and also having a surface. A conductive, flexible, elongate element is provided which has first and second ends. Means is provided for bonding the first end to the contact pad to form a first intimate bond, with the second end being free. A conductive shell envelops the flexible elongate element and at least a portion of the surface of the contact pad immediately adjacent the means bonding the first end to the contact pad to provide a second intimate bond so that the bond strength between the contact pad and the conductive shell is greater than the bond strength between the contact pad and the flexible elongate element.

Figures 1, 2:
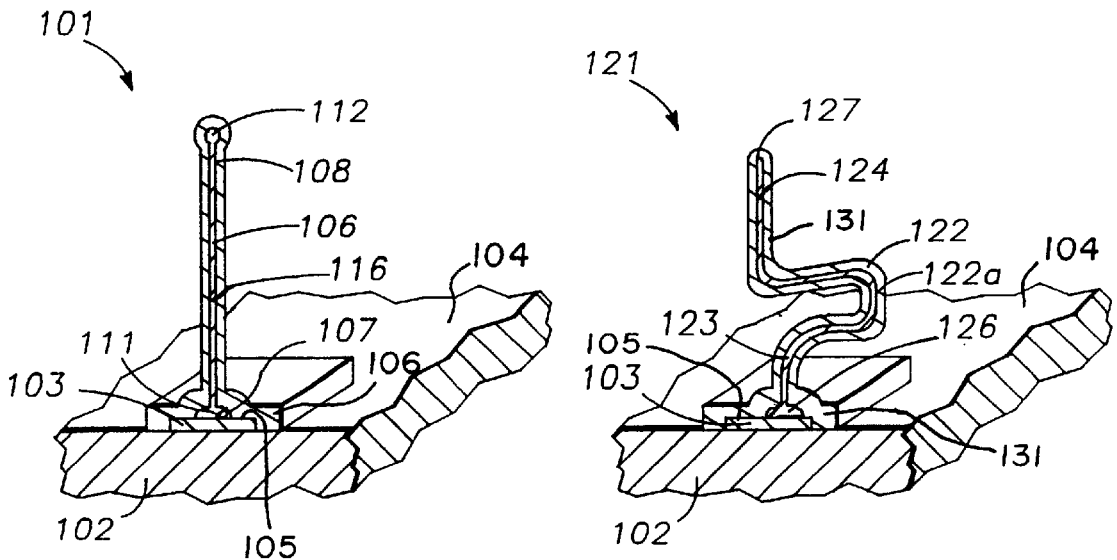
FIG. 1 is a partial isometric view of a "skeleton and muscle" contact structure incorporating the present invention which is in the form of a freestanding pin.
FIG. 2 is a partial isometric view similar to FIG. 1 but showing a resilient contact structure with a bend therein.

More particularly as shown in the drawings, the contact structure 101 in FIG. 1 is for use for making contact to an electronic component 102 which for example can be an active or passive semiconductor device or a plastic laminate, ceramic or silicon package carrying one or more semiconductor devices. It also can be an interconnection component such as a connector. Alternatively, it can be a production, test or burn-in socket for a semiconductor package or semiconductor device. In any event the electronic component 102, which also can be called a support structure, is utilized for carrying the contact structures 101. The electronic component is provided with one or more conductive contact pads 103 which typically lie in a plane on a surface 104 or which are accessible from or through the surface 104 of the electronic component 102 with the pads 103 being positioned at various locations and lying in various planes at various angles. The pads 103 can be peripherally positioned at the perimeter of the electronic component 102. They also can be placed in an area array, near an edge or in a central line pad-out or a combination of the above well known to those skilled in the art. Typically each pad 103 has an electrical function dedicated to it. In certain applications, the contact pads 103 may in fact lie in different planes, or overlie the edge of a component. The contact pads 103 can be of any desired geometry. For example they can be circular or rectangular in plan and have exposed surfaces 105. The pads 103 by way of example can have any dimension, but typically range from 2 to 50 mils.

The contact structure 101 includes an elongate element 106 which typically is flexible because of its small diameter, the flexibility intended for ease of shaping, and has first and second ends 107 and 108. It also can be called a core wire or "skeleton". The elongate element 106 is formed of a suitable conductive material such as gold, aluminum or copper, with small amounts of other metals, to obtain desired physical properties as for example beryllium, cadmium, silicon and magnesium. In addition, metals or alloys such as metals of the platinum group, can be utilized. Alternatively, lead, tin, indium or their alloys can be used to form the elongate element. The elongate element 106 can have a diameter ranging from 0.25 to 10 mils with a preferred diameter of 0.5 to 3 mils. The elongate element 106 can have any desired length but typically it would have a length commensurate with its use in conjunction with small geometry semiconductor devices and packaging would range from 10 mils to 500 mils.

Means is provided for forming a first intimate bond between the first end 107 of the conductive elongate element 106 and one of the contact pads 103. Any suitable means can be utilized for making this connection. For example, a wire bond utilizing a capillary tube (not shown) having the elongate element 106 extending therethrough and typically having a ball provided on the first end is brought into engagement with the pad 103 whereby upon the application of pressure and temperature or ultrasonic energy, a wire bond, typically a ball-type bond 111 is formed connecting the first end 107 of the elongate element 106 to the pad 103. After the desired wire bond 111 has been formed, the capillary tube can be raised to permit a desired length of the elongate element 106 to extend from the capillary tube and a cut can be made by locally melting the wire to sever the elongate element 106 and to cause a ball 112 to be formed on the second end 108 of the elongate element 106 and also to provide a corresponding ball on the remaining length of elongate element 106 in the capillary tube so that the next contact structure can be made utilizing the same wire bonding machine with the next pad if it is desired to make a ball-type bond connection. Alternatively, wedge-type bonds can be utilized.

In accordance with the present invention, a conductive shell 116 which also can be called "muscle" which covers the "skeleton", is formed over the elongate element 106 and completely surrounds the same as well as the surface area 105 of the contact pad 103 which immediately surrounds the wire bond 111 and preferably extends over the contact pad 103 to form a second intimate bond to the contact pad 103 by direct adhesion to the entire exposed surface of the contact pad. Thus, the contact structure 101 is anchored to the contact paid 103 by the first and second intimate bonds. The shell 116 in addition to having conductive properties also has other mechanical properties desired for the composite contact structure 101 as hereinafter explained.

The shell 116 is formed of a material to provide desired mechanical properties for the contact structure. The material of the shell should principally be of a material which has a high yield strength with at least thirty thousand pounds per square inch. In connection with the present contact structure, the adhesion strength between the contact structure 101 and the contact pad 103 is principally or predominantly due, i.e., more than 50%, to the adhesion between the shell 116 and the contact pad 103. The shell 116 typically has a wall thickness ranging from 0.20 mils to 20 mils and preferably has a wall thickness of 0.25 to 10 mils. The shell 116 in accordance with the present invention adheres to the elongate element or skeleton 106 along its length and to the surface of the pad 103 to provide in effect a unitary structure. Typically the hardness of the elongate element or skeleton 106 is less than that of the material on the shell. When it is desired to have a contact structure which deforms plastically, the shell 116 can be formed of a conductive material such as copper or solder, exemplified by lead-tin solder. When it is desired to have the shell 116 have spring properties, nickel, iron, cobalt or an alloy thereof can be used. Other materials which would render desirable properties to the shell 166 in certain applications are copper, nickel, cobalt, tin, boron, phosphorous, chromium, tungsten, molybdenum, bismuth, indium, cesium, antimony, gold, silver, rhodium, palladium, platinum, ruthenium and their alloys. Typically, the top layer comprising the shell, if it is required, consists of gold, silver, metals or alloys of metals of the platinum group or various solder alloys. certain materials, as for example nickel, when electroplated under certain bath conditions, onto the elongate element 106 will form internal compressive stresses to increase the stress required to deform or break a resulting contact structure 101. Certain materials such as nickel can provide a tensile strength in excess of 80,000 lbs. per square inch.

The shell or "muscle" 116, made of one or more of the materials listed above, typically can be formed onto the flexible elongate element or "skeleton" by the use of a conventional aqueous plating technique. The shell 116 also can be provided by enveloping the elongate element 106 using physical or chemical vapor deposition techniques utilized in conventional thin film processes and can include decomposition processes using gaseous, liquid or solid precursors as well as evaporating or sputtering.

Thus it can be seen that the final properties desired for the contact structure 101 can be readily designed into the contact structure 101 comprising the skeleton 106 and the muscle 116 while achieving the desired conductivity and other physical properties as for example a desired pull strength or adhesion for the first and second intimate bonds formed with the contact pad 103. The shell or muscle 116 which completely envelops the flexible elongate element or skeleton 106 overlies the contact pad 103 to form the second adhesive bond therewith.

In connection with the foregoing description, a single contact structure 101 has been described. However it should be appreciated that many hundreds of contact structures 101 can be created at the same time during the plating or deposition process on a single electronic component or a plurality of such electronic components.

As can be seen, the shell 116 has a substantial uniform thickness throughout its length and in overlying the contact pad 103. The thickness of the shell can alternatively vary by adjusting the nature of the layers comprising the shell or by varying deposition parameters. The uppermost free extremity of the contact structure or pin 101 is only slightly larger to reflect the shape of the ball 112 typically provided on the second or free end of the elongate element 106 below the shell 116. It should be appreciated that if desired, the ball 112 provided on the second end of the elongate element 106 can be eliminated if desired by using means cutting the continuous wire other than by the use of a melting technique. Thus the second end would be in the form of a substantially cylindrical member having the same diameter as the diameter of the elongate element 106.

When it is desired to provide resiliency in a contact structure, the contact structure 121 shown in FIG. 2 can be utilized. The contact structure 121 includes a flexible elongate conductive element 122 which can be formed of the same conductive materials as the elongate element 106 shown in FIG. 1. It is provided with first and second ends 123 and 124 with a ball-type bond 126 formed on the first end 123 and adhered to the pad 103 in the same manner as the ball bond 111. While the elongate conductive element 122 is being discharged through the capillary of the wire bonder, a cantilever or cantilever portion 122a forms a bend. Thus, there is provided a bend which forms at least one cantilevered portion. Such a cantilevered portion can give resilient capabilities to the contact structure 121 as hereinafter provided. After the bend 122a has been formed, a tip 127 is provided on the second end 124 by an appropriate severing operation. A shell 131 is thereafter formed on the elongate conductive element 122 in the same manner as the shell 116 hereinbefore described to encompass the elongate conductive element 122 and being adherent to and overlying the contact pad 103. It can be appreciated that a variety of shapes other than the exact one depicted in FIG. 2 can be utilized.

In order to impart additional strength to the contract structure 121, the shell 131 principally is formed of a material which will impart high yield strengthening properties, as for example a strong, conductive, hard material to a thickness as hereinbefore described in connection with FIG. 1. Such a conductive material can be selected from the group of nickel, cobalt, iron, phosphorous, boron, copper, tungsten, molybdenum, rhodium, chromium, ruthenium, lead, tin and their alloys.

In the contact structure 121 it can be seen that the elongate conductive element 122 defines the trajectory or shape of the contact structure 121 wherein the shell 131 defines the mechanical and physical properties of the contact structure as for example the springiness or resilience of the contact structure as well as the ability to provide a low resistance spring-loaded contact through a noble top layer. It can be seen by viewing FIG. 2 that as the second or free end of the contact structure 121 is moved upwardly and downwardly, the cantilever or bend 122a can readily accommodate the changes in position of the second free end and will spring back and provide a substantially constant yieldable force within the range of a given design attempting to return the second end of the contact structure 121 to its original position. The spring shape can be designed to respond in a resilient manner to a force directed at any angle relative to the surface of electronic components 102.

Figure 3:
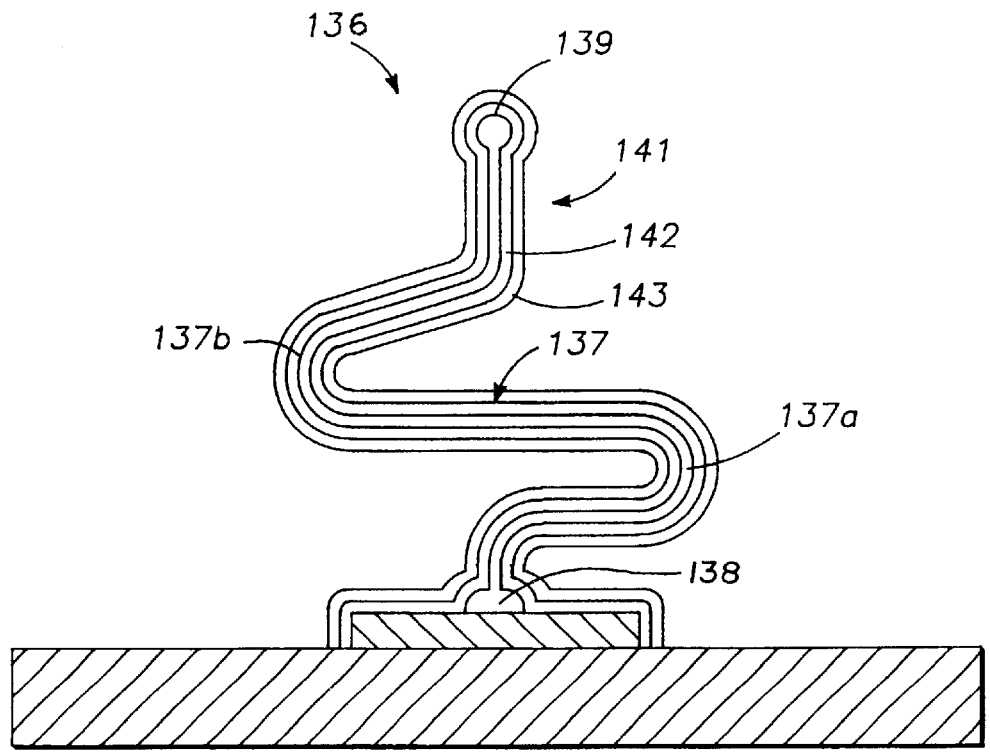
FIG. 3 is side elevational view in section showing a contact structure with multiple bends and with a multiple layer shell.

Another contact structure 136 incorporating the present invention is shown in FIG. 3 in which a flexible elongate conductive element 137 has been provided which has two bends, 137a and 137b formed therein and with a ball bond 138 at one end and a ball 139 at the other end. As can be seen, the bends 137a and 137b face in opposite directions. A shell 141 of the type hereinbefore described has been provided. However, it is formed of a first or inner layer 142 and a second or outer layer 143. By way of example, the first or inner layer 142 could be in the form of a coating of nickel or a nickel alloy of a suitable thickness as for example 1 to 3 mils to provide the desired springiness and/or yield strength for the contact structure. Assuming that it is desired to provide a particular outer surface for the contact structure 136, the second or outer layer 143 can be formed of gold or other suitable conductive material. In certain applications it may be desired to utilize the first or inner layer 142 as a barrier layer as for example to utilize the contact structure 136 with a solder contact to prevent the interaction of gold with solder. In such applications it may be desired to coat the flexible elongate conductive element 137 with a thin layer of copper or nickel followed by 1 to 1.5 mils of solder such as a lead-tin alloy. Thus it can be seen that by forming the shell of more than two layers, it is possible to obtain additional desirable features for the contact structure. It also should be appreciated that if desired, additional layers can be provided as a part of the shell in certain applications.

Figure 4:
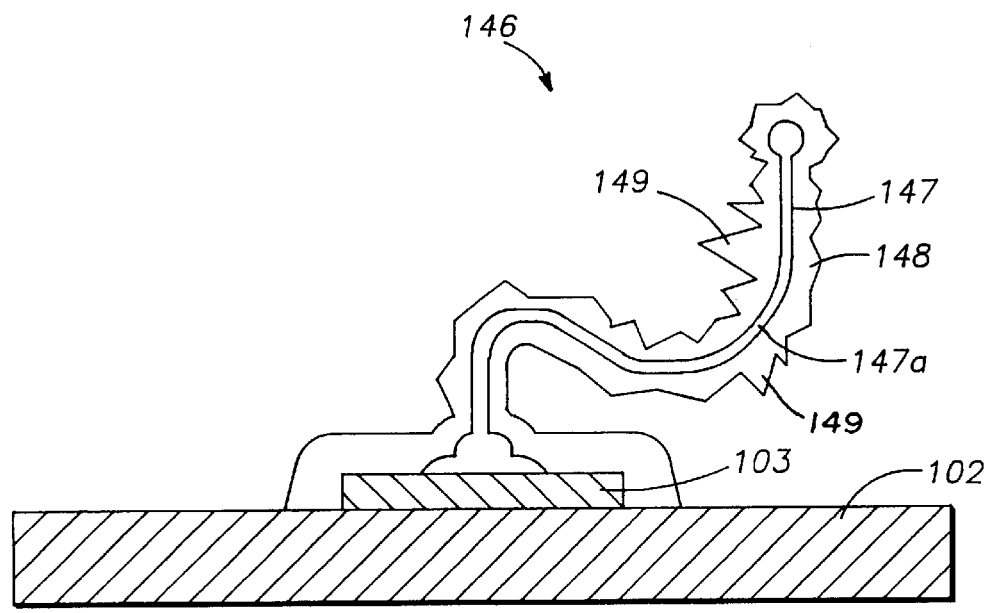
FIG. 4 is a side elevational view in section of another embodiment of a contact structure incorporating the present invention in which the shell is provided with protrusions.

Another contact structure 146 incorporating the present invention is shown in FIG. 4 in which a flexible elongate conductive element 147 is provided with an outwardly facing bend 147a in which a shell 148 has been provided which envelops the flexible elongate conductive member 147. However in this case, the shell 148 has been formed in such a manner so as to provide microprotrusions 149 on the outer surface thereof spaced longitudinally along the length of the shell. These protrusions or irregularities can be created in a number of ways as for example by adjusting the processing conditions in the plating bath to cause sharp nodules to be formed in the shell 148.

Figure 5:
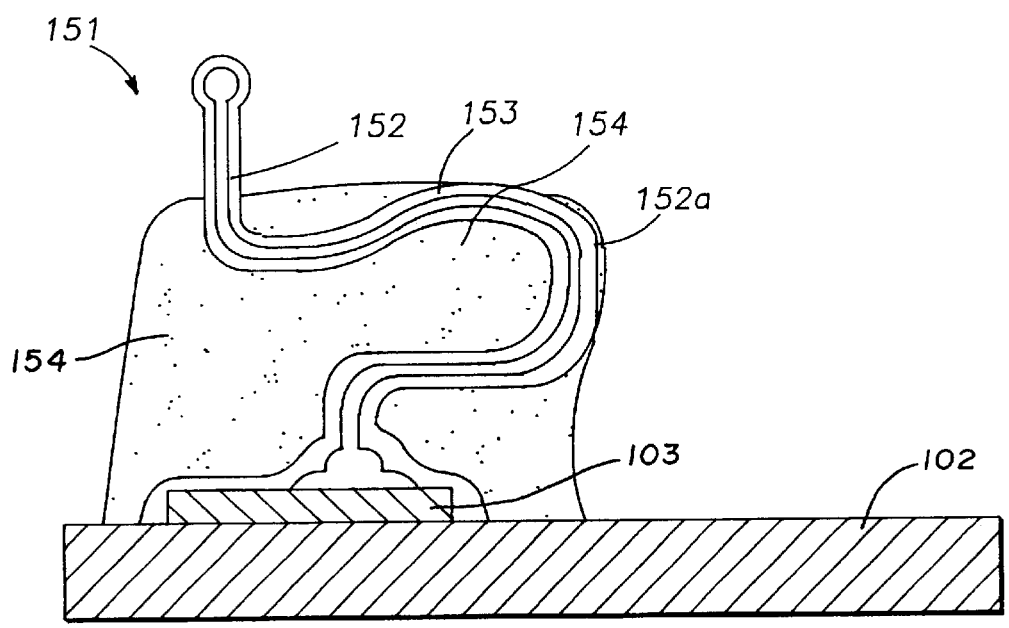
FIG. 5 is a side elevational view in section showing another embodiment of a contact structure incorporating the present invention in which the bend portion of the contact structure is shorted together by an electrically conducting filled compliant elastomeric layer.

Another contact structure incorporating the present invention is a contact structure 151 shown in FIG. 5 which includes a flexible elongate element 152 having a shell 153 thereon which is provided with a cantilever portion in the form of a U-shaped bend 152a. To reduce the electrical inductance which is created during the conduction of electrical current in the contact structure 151, the bend 152 is imbedded in an electrically conductive compliant polymer mass 154 of a suitable type such as silicon rubber filled with silver particles. The compliant electrically conductive elastomer 154 does not substantially restrain movement of the resilient portion 152a of the contact structure 151. The conductivity of the material 154 typically can range from $10^{-2}$ to $10^{-6}$ ohm centimeters.

Figure 6:
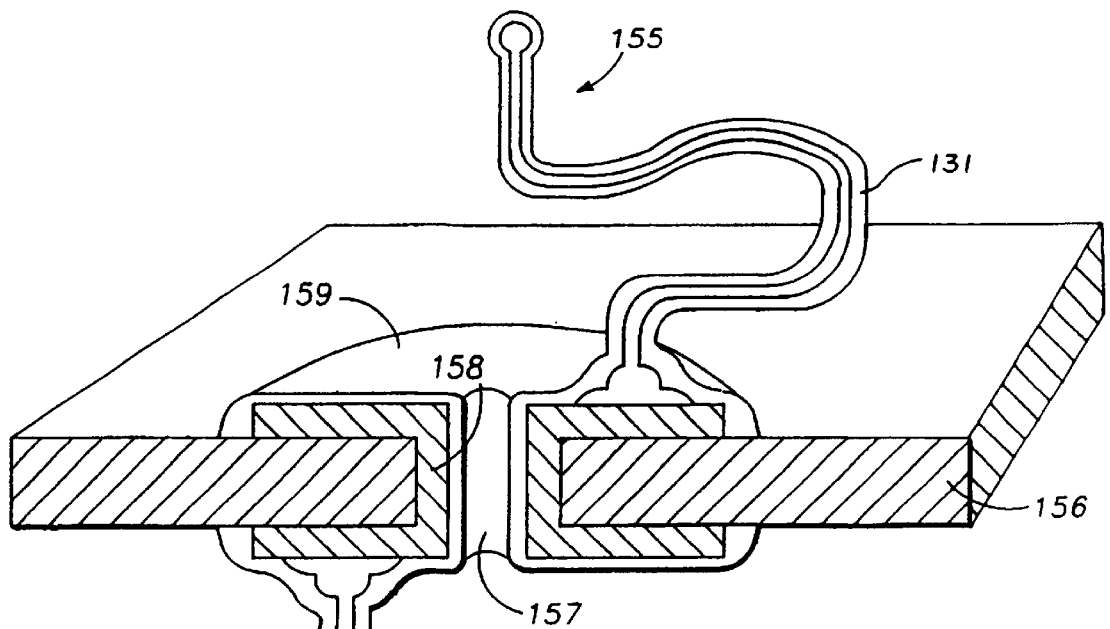
FIG. 6 is an isometric view in section of another contact structure incorporating the present invention utilized in conjunction with plated-through holes in a printed circuit board.

In FIG. 6, contact structures 155 similar to the type shown in FIG. 2 are utilized in connection with an electronic component in the form of a conventional printed circuit board 156. The printed circuit board 156 is provided with conventional vertical via conductors in the form of plated-through holes 157 in which a plating structure 158 extends through the holes 157 and forms annular rings 159 provided on the opposite surfaces of the board 156 so that electrical contact can be made from one side of the board 156 to the other side of the board. As shown, a contact structure 155 is provided on each side of the printed circuit board 156 and is in contact with the plating structure 158 forming the rings 159 which functions as a contact pad. Thus, the contact structure 155 serves to form an electrical connection between contact pads on two electronic components facing each side of the circuit board 156 provided on opposite sides of the plated-through hole 157. It can be seen that the shell 131 provided as a part of the contact structure 155 also extends through the plated-through hole 157 and is disposed on the annular plating 158 provided on both sides of the plated through hole 157. Such a construction can be readily manufactured merely by flipping the printed circuit board 156 from one side to the other during the process of attachment of the flexible elongate elements of the contact structure 155. As hereinafter described, this type of construction can be utilized in conjunction with an interposer. By utilizing the contact structures 155, compliance capabilities are provided on opposite sides of the printed circuit board making possible face-to-face connections between matching pads on electronic components by an interposer carrying the contact structures shown in FIG. 6.

Figure 7:
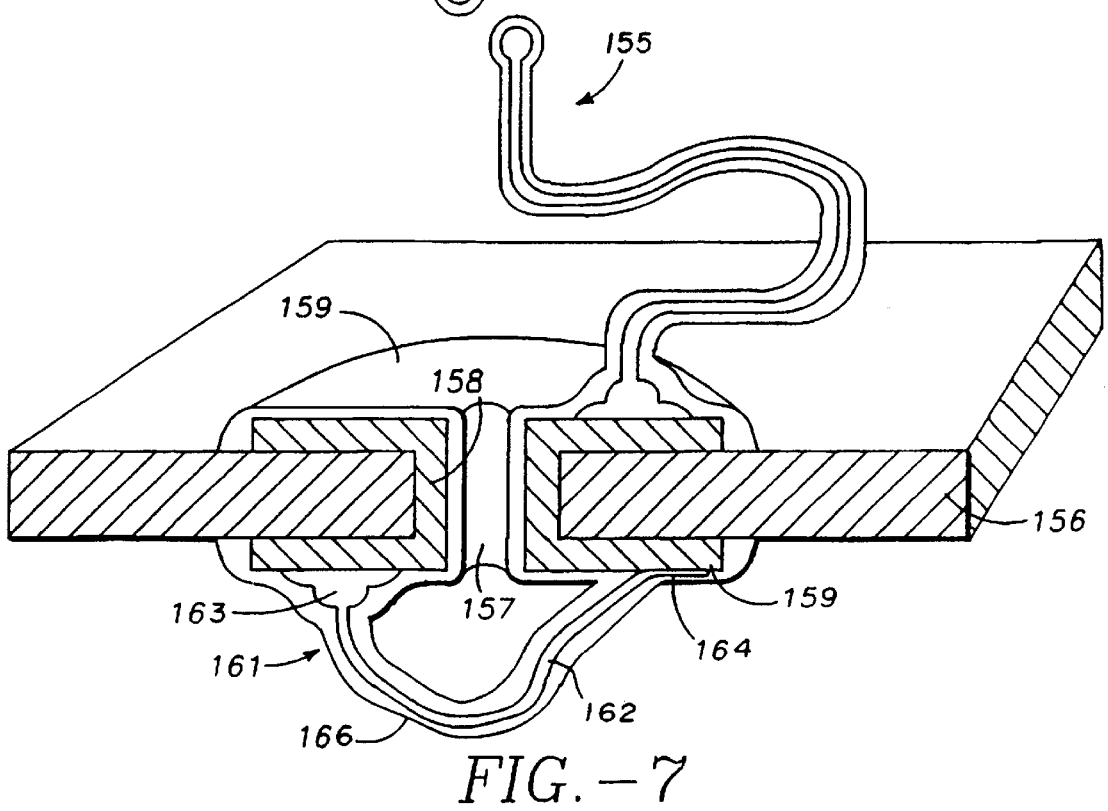
FIG. 7 is an isometric view in section of another embodiment of the contact structure incorporating the present invention utilized in conjunction with plated-through holes in a printed circuit board in which a resilient contact structure is provided on one side of the printed circuit board and in which the other side is provided with a contact structure that need not be resilient.

When compliance is only required on one side, a construction such as that shown in FIG. 7 can be utilized. In this embodiment, the contact structure 161 provided on one side as for example the bottom side as viewed in FIG. 7 includes a flexible elongate element 162 which has a first bond 163 in the form of a ball bond secured to the metallization 158. The contact structure 161 forms a loop which extends across the hole 157 and is bonded to the other side of the ring 159 by suitable means such as a second bond 164 in the form of a wedge bond of a type well known to those skilled in the art and use of wire bonding machines utilized in the semiconductor industry. The flexible elongate element 162 is covered by a shell 166 of a material of a type hereinbefore described. It also should be appreciated that since compliance is not needed on the lower side of the electronic component 156 that the contact structure 161 can be replaced by a straight pin-like contact structure 101 as shown in FIG. 1.

Figure 8:
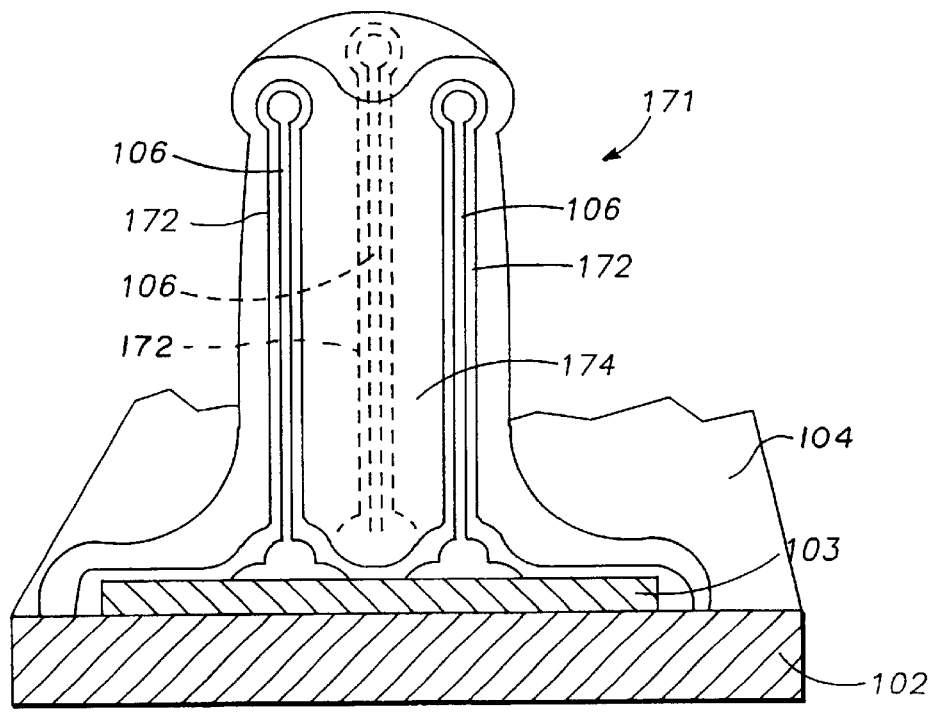
FIG. 8 is a side elevational view in section of another contact structure incorporating the present invention and in which a plurality of stems of the type described in FIG. 1 have been bridged together by a solder layer to form a solder column structure.

In FIG. 8 there is shown another embodiment of a contact structure 171 incorporating the present invention which is used to form a solder column. The contact structure 171 is a composite contact structure and is comprised of three "skeleton" structures 106 of the type shown in FIG. 1 which are spaced substantially 120° apart and which are mounted on a single contact pad 103. After the three "skeleton" structures 106 have been made, a first continuous shell layer 172 is deposited onto elongate "skeletons" 106 and the conductive pad 103 to form contact structures like contact structures 101. This structure is then completed into a solder post by placing solder layer 174 therebetween. The solder can be of a suitable type such as an alloy of lead and tin which bridges between the pin-like contact structures and the coated surface of terminal 103 to form the solder post contact structure 171. Depending on the use of the solder post, the solder post can be various sizes as for example it can have a diameter range from 10 to 50 mils with a typical diameter being from 10 to 20 mils. These solder posts can have a suitable height as for example 10 to 200 mils with a typical height of 20–150 mils. As explained hereinbefore, the balls 112 of the contact structures 101 can be eliminated if desired by the use of a non-melting severing operation.

Figure 9:
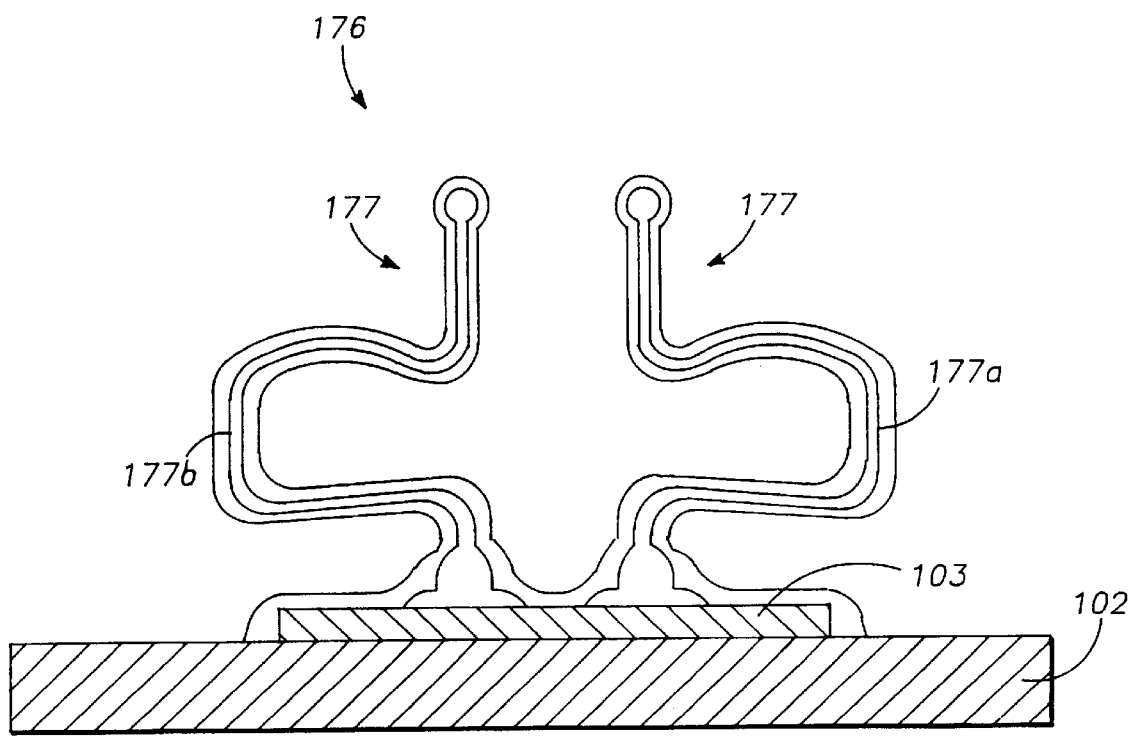
FIG. 9 is a side elevational isometric view in section of a contact structure incorporating the present invention in which two redundant resilient compliant contact structures are provided per contact terminal.

In FIG. 9 there is shown a composite contact structure 176 which is provided with two contact structures 177 mounted on a single pad 103 with cantilevered portions 177a and 177b facing in opposite directions to provide two redundant resilient compliant contact structures 177 for each contact pad.

Figure 10:
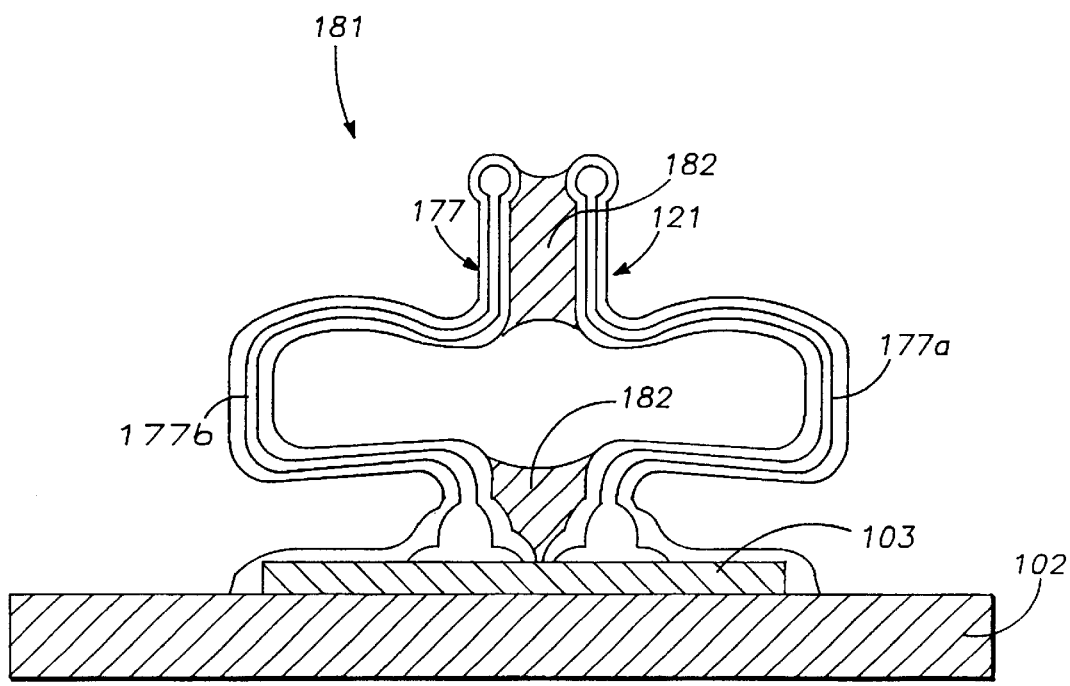
FIG. 10 is a side elevational isometric view in section of another contact structure incorporating the present invention in which three resilient contact structures are bridged together by a solder layer at the uppermost and lowermost extremities while leaving the intermediate bend portions free of the solder so that a compliant solder column is provided.

Another composite contact structure 181 is shown in FIG. 10 in which solder 182 is provided for bridging the upper and lower extremities of the contact structures 177 but not bridging the portions of the contact structures 121 having bends 177a and 177b therein so that compliance is still retained. With such an arrangement, it also should be appreciated that three of such contact structures 177 can be provided spaced 120° apart with solder 182 therebetween and that the contact structures 177 do not have to be resilient in order to form a solderable contact.

Figure 11:
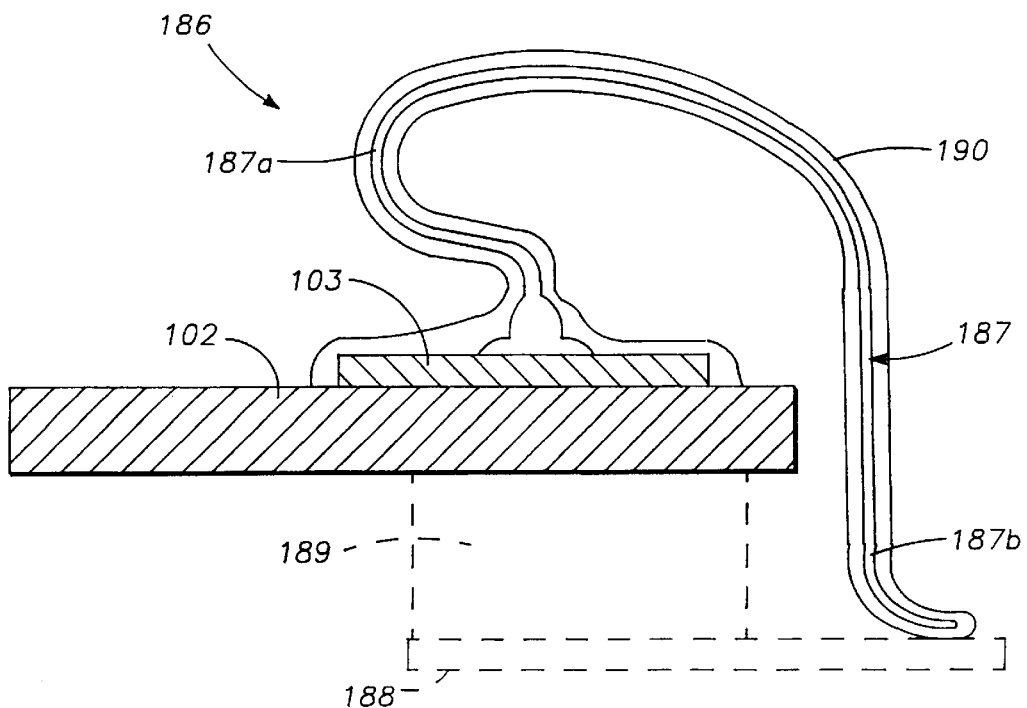
FIG. 11 is a side elevational view in section of another embodiment of a contact structure incorporating the present invention in which the contact structure extends over an edge of the substrate to form a probe contact.

Another embodiment of a contact structure incorporating the present invention is shown in FIG. 11 in which a probe-like contact structure 186 is shown. It includes a flexible elongate element 187 which has one end secured to the contact pad 103. The flexible elongate element 187 is provided with a bent cantilevered portion 187a. Another portion 187b extends downwardly over one edge of the electronic component 102, or alternatively through a feed-through hole of the type hereinbefore described and is bonded by suitable means such as a wedge bond to a sacrificial metal layer 188 as for example an aluminum layer which is secured to the component 102 by a thick photoresist 189 which serves as a standoff. After that step has been completed, the aluminum layer 188 can be sacrificed by etching it away with a suitable etch such as sodium hydroxide. The flexible elongate element 187 can then be coated in the manner hereinbefore described with a shell 190 formed of a nickel cobalt alloy or other suitable material as hereinbefore described to provide a free standing spring-like contact structure 186 which has its curved distal extremity disposed in a position below the component 102. The material utilized in the shell 190 makes it possible to control the deflection characteristics of the free extremity of the probe contact structure. Alternatively, the shell 190 can be completed first after which the sacrificial layer 188 can be etched away. Alternatively, it should also be appreciated that the bond of the elongate member to the terminal 103 can be of a wedge type and the bond to the sacrificial structure 188 can be a ball-type bond.

Figure 12:
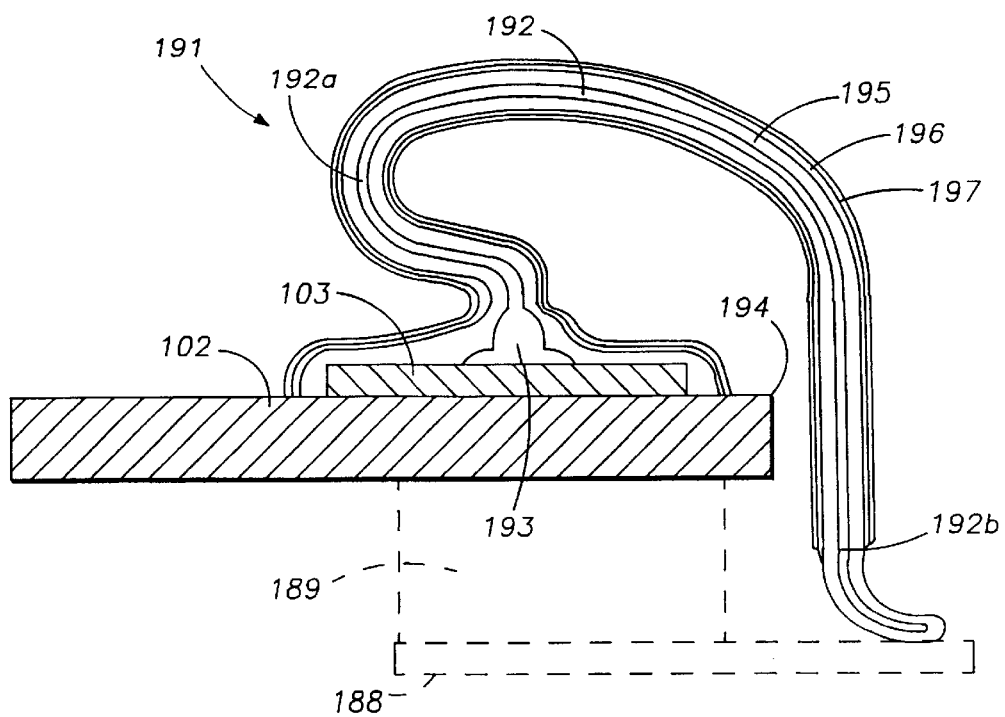
FIG. 12 is a side elevational view in section of another contact structure incorporating the present invention which shows use of a shielded contact probe.

In FIG. 12 there is shown another probing contact structure 191 which is provided with a flexible elongate element 192 that is bonded by a bond 193 to the contact pad 103. As in the previous embodiment, the flexible elongate element 192 is provided with a cantilever or bend 192a and a portion 192b. The portion 192b extends over the edge 194 or through a hole provided in the component 102. A shell 195 is provided over the flexible elongate element 192. Additional layers are provided over the shell 194 and consist of a layer 196 formed of a dielectric material which is followed by a metal layer 197. If layer 197 is grounded, there is provided a probe contact structure 191 which provides a shielded contact with controlled impedance. Thus it is possible to use a probe contact structure 191 in systems where shielding is desirable or necessary to improve electrical performance of the probing structure. As shown in FIG. 12, the distalmost extremity of the probe contact structure 191 can be left free of the dielectric layer 196 and the metal layer 197 so that direct contact can be made with another contact pad or another structure.

Figure 13:
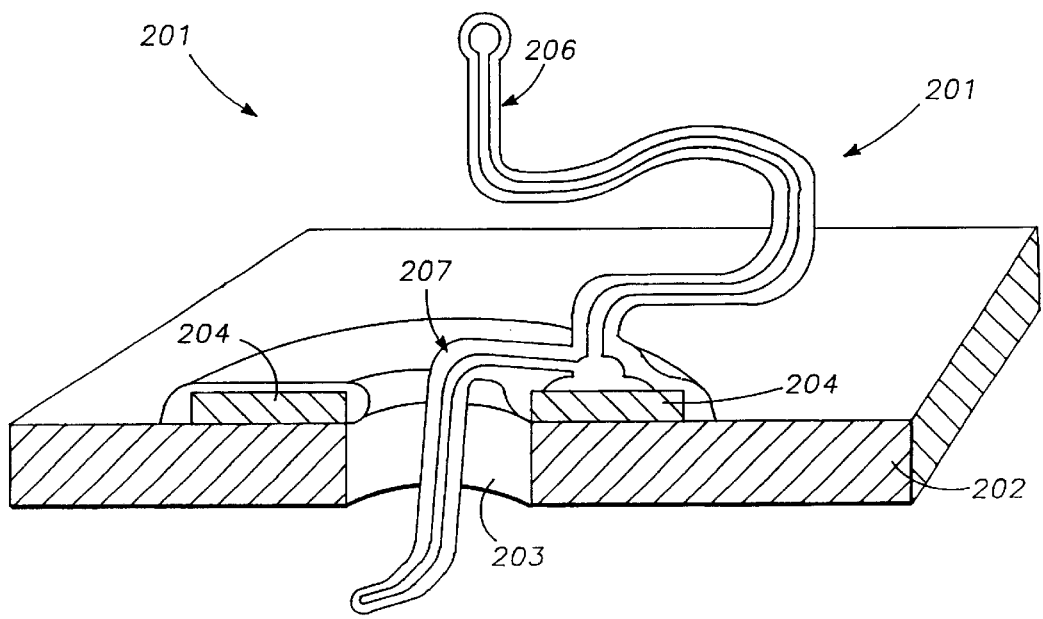
FIG. 13 is an isometric view partially in section of another contact structure incorporating the present invention in which contact structures can originate on one side of a contact carrier substrate such as a printed circuit board and have one of the contacts extend through a hole to the other side and having the other contact structure extending from the same side.

In FIG. 13 there is shown another embodiment of a contact structure 201 incorporating the present invention in which the electronic component 202 in the form of printed circuit board can be utilized as an interposer as hereinafter described. As in the previous embodiments, it is provided with a hole 203 having plating surrounding the hole 203 to provide contact pads 204. The contact structure 201 is of the type hereinbefore described which has a portion 206 that extends upwardly on one side of the electronic component 202 and another portion 207 that extends downwardly through the hole 203 to the other side of the electronic component 202. The portion 207 is temporarily bonded to a sacrificial substrate (not shown) which is removed by etching as hereinbefore described. With such a construction, it can be seen that electrical connections can be made from both sides of the electronic component 202.

Figures 14, 15:
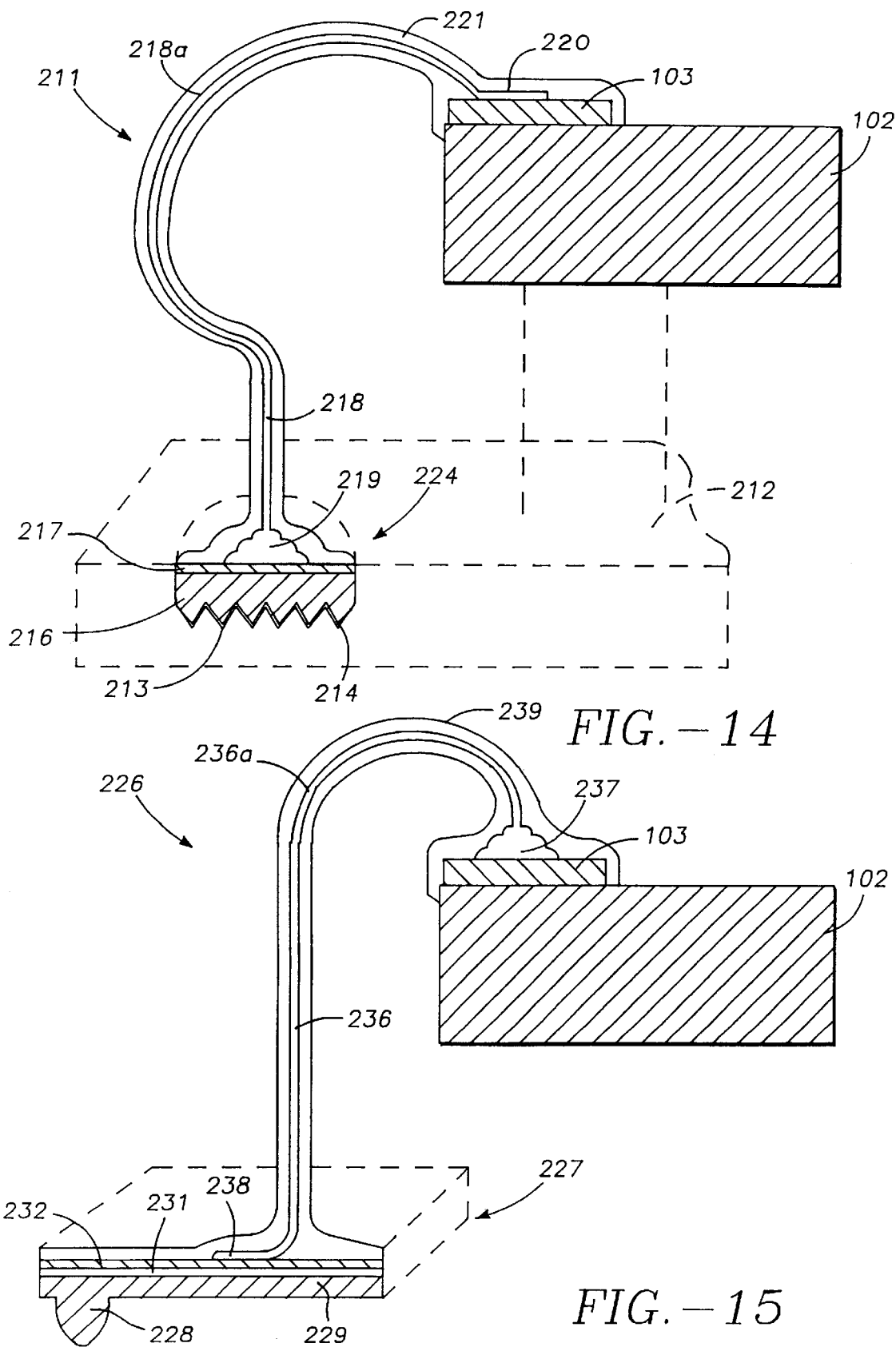
FIG. 14 is a combination side elevational and isometric view in section of another embodiment of the contact structure incorporating the present invention in which the probe is provided with a distal extremity which has a topography to minimize contact resistance when it is in engagement with another contact terminal.
FIG. 15 is a view similar to FIG. 15 but showing use of a cantilevered contact.

Another embodiment of a contact structure 211 incorporating the present invention is shown in FIG. 14 in which a sacrificial aluminum layer 212 is utilized during construction. In the area where it is desired to form a contact pad on the aluminum layer 212, a plurality of negative projections or holes 213 are formed in the surface of the aluminum layer 212. As shown, these negative projections or holes 213 can be in the form of inverted pyramids ending in apexes. The negative projections or holes 213 in the aluminum are then filled with a conducting material 214 such as gold or rhodium 214. This is followed by a nickel layer 216 and a layer of gold 217. A flexible elongate conductive element 218 formed of a suitable material such as gold or aluminum is then bonded to the gold layer 217 by suitable means such as a bond 219. The flexible elongate element 218 extends through a curve or bend 218 and then goes over one side of the electronic component 102 and extends over the top of the contact pad 103 and is bonded thereto in a suitable manner such as by a bond 220. Thereafter a shell 221 formed of a spring alloy material of the type hereinbefore described is deposited over the flexible elongate element 218 and extends over the contact pad 103 and over the gold layer 217 to complete the contact structure. By an appropriate combination of the properties of the shell 221 and the trajectory of the bend or curve 218, the desired resilience can be obtained.

During this plating procedure, the sacrificial aluminum layer 212 can be covered with a suitable resist in a manner well known to those skilled in the art. After the contact structure has been completed, the resist then can be removed and the sacrificial aluminum layer 212 can be dissolved in the manner hereinbefore described to provide a contact pad 224 at the free end of the contact structure 211. In this manner it can be seen that a contact pad can be constructed with a controlled geometry as for example one having a plurality of sharp points which can apply high local pressure forces to contact another pad as for example an aluminum pad on a semiconductor device to break any oxide present on the aluminum pad and to make good electrical contact therewith by causing deformation of the aluminum pad around the sharp points. These high contact forces can be created while applying a relatively low overall force on the contact pad 224.

Still another contact structure incorporating the present invention is shown in FIG. 15 which shows a contact pad 227 carried by the free end of the contact structure 226. The contact pad 227 has a depending mechanically shaped probe 228 carried at one end of a rectangular contact pad 227. The contact pad 227 is constructed in a manner similar to the contact pad 224 and by way of example can be provided with a nickel or rhodium tip or probe 228 and a layer 229 also formed of nickel or rhodium. The layer 229 is covered with another isolation layer 231 of a nickel alloy which is covered with a gold layer 232. A flexible elongate element 236 of a conductive material is connected to the pad 103 by a bond 237 and extends over the edge of the semiconductor structure 102 through a cantilever or bend 236a and is bonded to the gold layer 232 in a suitable manner such as by a bond 238. The flexible elongate element 236 as well as the bonds 237 and 238 are overplated with a shell 239. The shell 239 is of a strong alloy of the type as hereinbefore described and extends over the pad 103 and over the entire gold layer 232. With this type of a contact structure 226, it can be seen that a cantilevered probe 228 is provided which enhances the ability to control the deflection versus load behavior of the contact structure 226.

Figure 16:
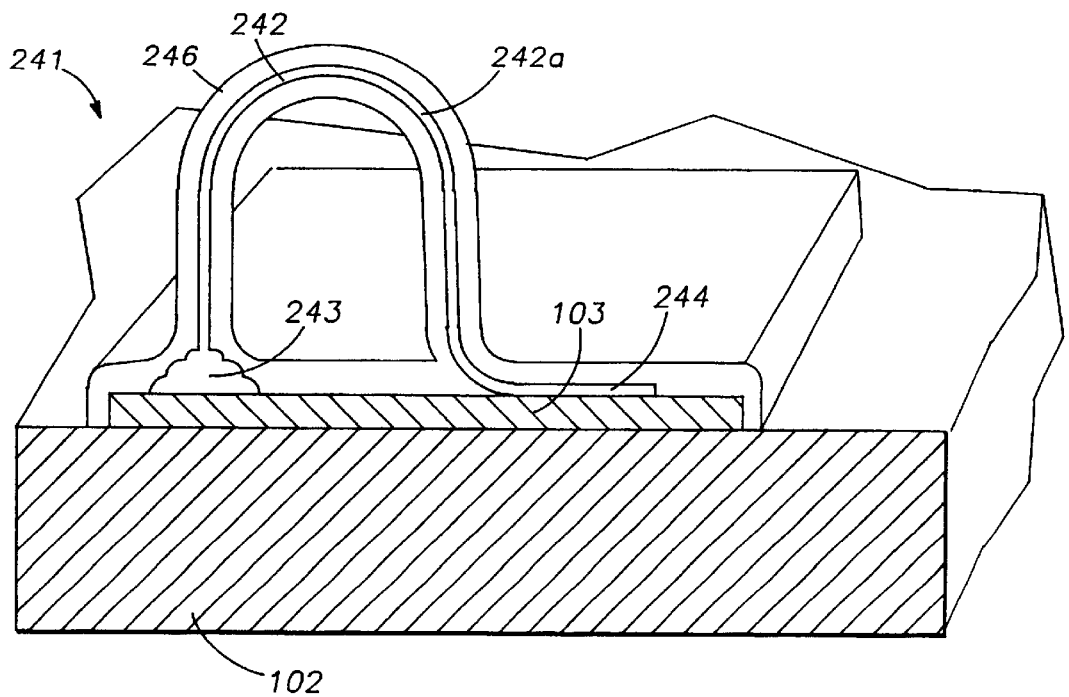
FIG. 16 is an isometric view partially in section of a contact structure incorporating the present invention in which the contact structures are formed into loops.

Another contact structure 241 incorporating the present invention is shown in FIG. 16. The contact structure as shown is bent into a loop. This is accomplished by taking a flexible elongate element 242 of a conductive material and bonding it to one side of the contact pad 103 in a suitable manner such as by ball bond 243 and then forming the flexible elongate element into an upside down loop 242a which is generally in the form of a "U" and then attaching the other end of flexible elongate element to the other side of the contact pad 243 by suitable means such as a wedge bond 244. A shell 246 can then be formed on the flexible elongate element 242 in the manner hereinbefore described which is deposited over the bonds 244 and 246 and over the edges of the contact pad 103. In this way it is possible to provide a relatively rigid contact structure 241. It should be appreciated that if desired, more than one of the looped contact structures 241 can be provided on a pad 103. For example, two of such structures can be provided which are spaced apart on the same contact pad 103.

Figure 17:
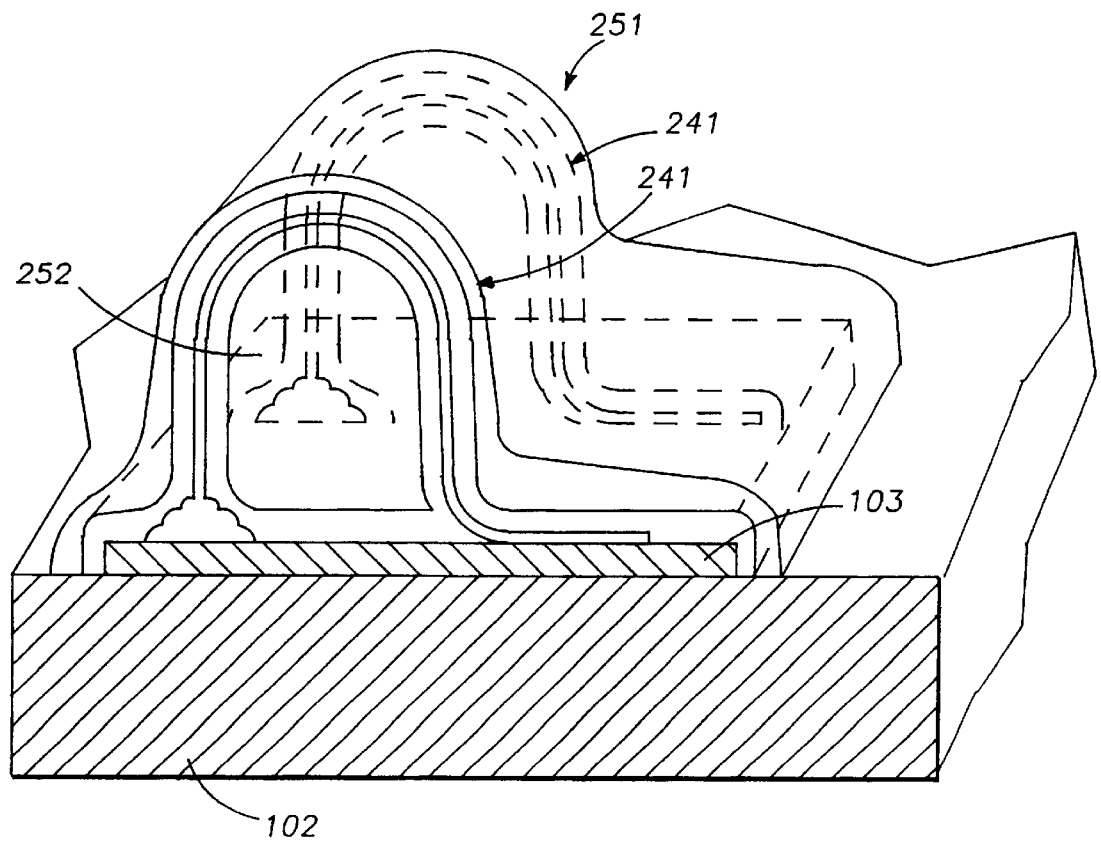
FIG. 17 is a view similar to FIG. 16 but showing two loops per contact and a solder layer bridged the loops to form a solder column.

Another contact structure 251 incorporating the present invention is shown in FIG. 17 and is comprised of two of the contact structures 241 hereinbefore described in conjunction with FIG. 17 which have been spaced apart and mounted on the same pad 103 and in which a solder layer 252 is formed over the contact structures 241 and bridges the U-shaped spaces provided between the contact structures 241. In addition as shown, the solder can bridge the two separate contact structures 241 to provide a unitary solder bump 253. It should be appreciated that if desired, the two contact structure 241 can be spaced far enough apart so that the solder will not bridge between the two contact structure 241 but will only bridge between the bridge formed in each of the contact structures 241 to provide separate solder bumps on a pad 103.

Figure 18:
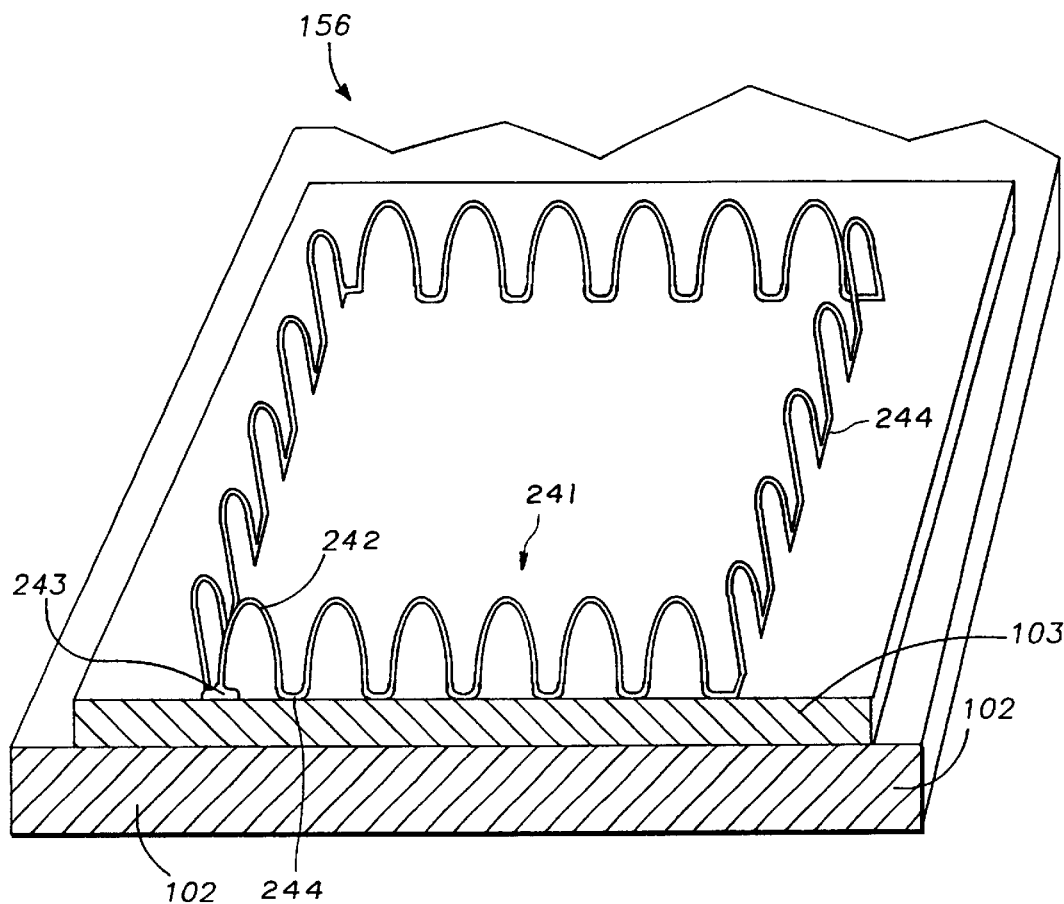
FIG. 18 is an isometric view partially in section showing a contact structure incorporating the present invention in which the contact structures are arranged to form a fence which can serve as a dam for a massive solder column as for example one utilized as a thermal interconnect.

Still another contact structure 256 is shown in FIG. 18 in which a large contact pad 103 is provided on the semiconductor component 102 or other electronic component and in which a plurality of contact structures 241 of the type hereinbefore described are placed around the outer perimeter of the pad 103. The bonding of the internal elongate element or skeleton is started with a ball bond 243 and successive loops are made with wedge bonds 244 therebetween to in effect form a rectangular fence enclosing a volume. The internal elongate element is then overcoated with a shell (not shown) of the type hereinbefore described. The rectangular fence then can be filled with solder (not shown) to provide a freestanding solder contact or a bump which can serve as a heat sink where that is desired.

Figure 19:
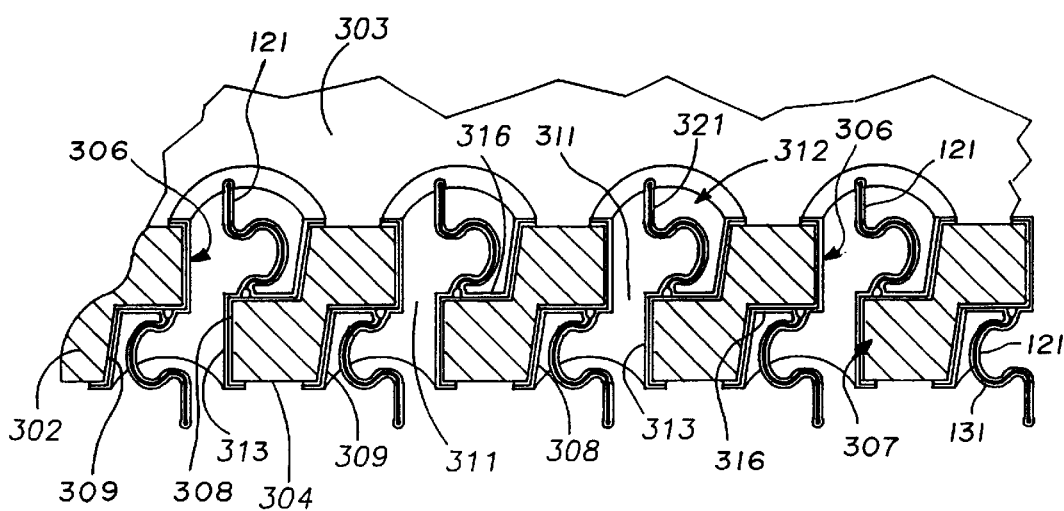
FIG. 19 is an isometric view partially in section showing an interposer incorporating the present invention.

An interposer 301 is shown in FIG. 19 and includes a substrate 302 having first and second planar surfaces 303 and 304. The substrate 302 can have a suitable thickness as for example ranging from 5 to 200 mils and preferably has a thickness of 20 to 100 mils. The substrate 302 can be formed of a suitable material such as a molded plastic which serves as an insulator and is provided with a plurality of spaced apart holes 306 extending through the first surface 303 and a plurality of spaced apart holes 307 extending through the second surface 304. The holes 306 and 307 can have any desired geometry in cross section as for example circular. As shown, the holes 306 and 307 are eccentric. Thus each of the holes 306 and 307 is provided with a straight sided wall portion 308 which extends perpendicular to the surface through which it extends and can include an inclined wall portion 309 which is inclined inwardly and downwardly into the hole. As can be seen from FIG. 19, the holes 306 and 307 are arranged in pairs in which the holes in each pair are offset slightly with respect to each other and are interconnected by passage 311 extending between the same so that in effect there is provided a single hole extending through the substrate 302 with one portion of the hole on one side being offset with respect to the portion extending through the other side of the substrate. Thus in effect there is provided a composite hole 312 which can be plated in a conventional manner as for example as utilized with printed circuit boards for providing a plated through holes which have a plating 313 formed of a material such as copper optionally overcoated with gold. Because of the offset provided between each pair of holes 306 and 307 there is provided a planar shoulder 316 in the bottom of each of the holes 306 and 307 on which the plating 313 is provided. The shoulders 316 with the plating 313 thereon form areas to which compliant contact structures 121 of the type hereinbefore described and as shown in FIG. 2 can be formed. The material forming the shells 131 of such contact structures also extends over the plating 313 provided for plating through the composite hole 312 to form an excellent bond between the contact structure 121 and the plating 313.

It can be seen from FIG. 19 that the contact structures have a suitable length such that their free ends extend beyond the planar surfaces 303 and 304 on opposite sides of the substrate 302 so they can make contact with electronic components as hereinafter described. The free ends of the interconnect structures 121 can be spaced a suitable distance apart as for example 10 to 200 mils and preferably between 20 and 100 mils. The substrate 302 can be formed of various types of plastics. For example they also can be polyetherimide, polysulfone or liquid crystal polymer based plastic molded materials.

In the arrangement shown in FIG. 19, the pairs of electrodes are electrically isolated from each other. However, it is apparent that the pairs of electrodes can be interconnected if that is desired merely by placing conductive portions of the plating 313 on the sides or surfaces 303 and 304 to make the appropriate interconnections. For example, the common plated portions on the surfaces 303 and 304 can represent power and ground planes which make appropriate interconnections to power and ground contacts.

Figure 20:
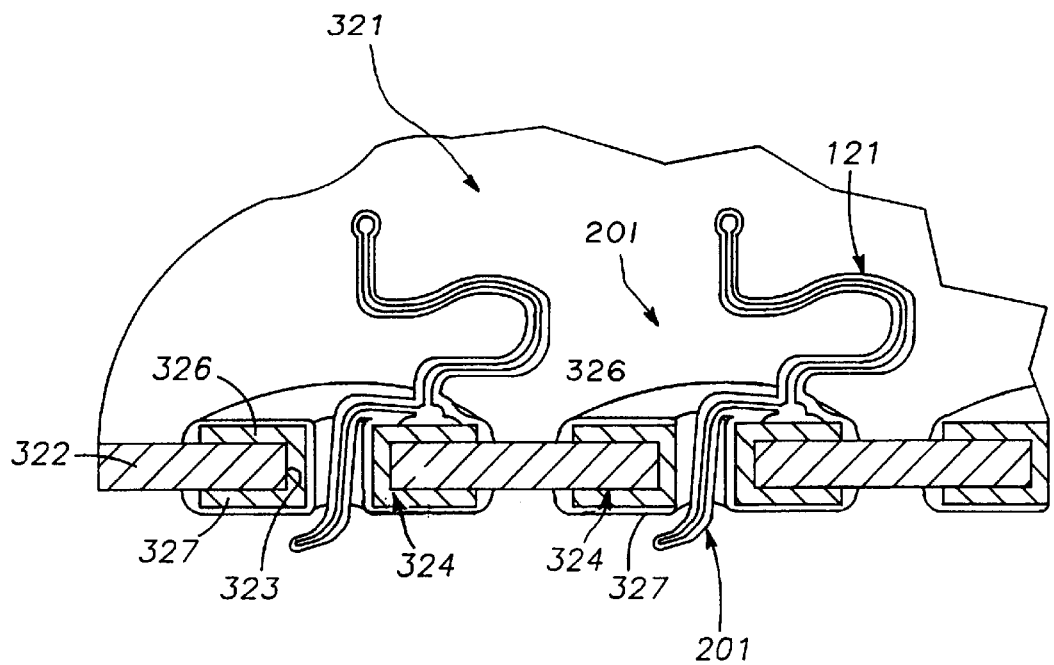
FIG. 20 is an isometric view partially in section showing a double-sided interposer.

In FIG. 20 there is shown a double-sided interposer 321 which includes a plastic substrate 322 in the form of a thin plastic sheet formed of a suitable material such as a polyimide. A plurality of spaced apart holes 323 can be drilled or molded into the substrate 322. The substrate also can be in the form of a reinforced epoxy laminate such as an epoxy reinforced with fiberglass and the holes 323 drilled therethrough. Plating 324 of a type hereinbefore described is used for plating through the holes 323 and for providing metallization 326 on the top side and metallization 327 on the bottom side of the substrate 322 as shown in FIG. 20. However in connection with the present invention, it can be seen that if desired the metallization 327 provided on the bottom side of the substrate 322 can be eliminated if desired. A contact structure 201 like that disclosed in FIG. 13 can be mounted on the conductive layer 326 adjacent the plated-through hole 323. This contact structure 201 includes a contact structure 121 which extends resiliently from the one side of the substrate 322 whereas the other contact structure 201 extends through the hole 323 and beyond the other side so a probe type contact is available from that side. It can be seen that if desired, circuitry can be provided on the substrate 322 and connected to the contact structures 121 and 201. In addition, pins (not shown) can be provided in the substrate 322 for registering the interposer 321 with other electronic components as hereinafter described.

Figure 21:
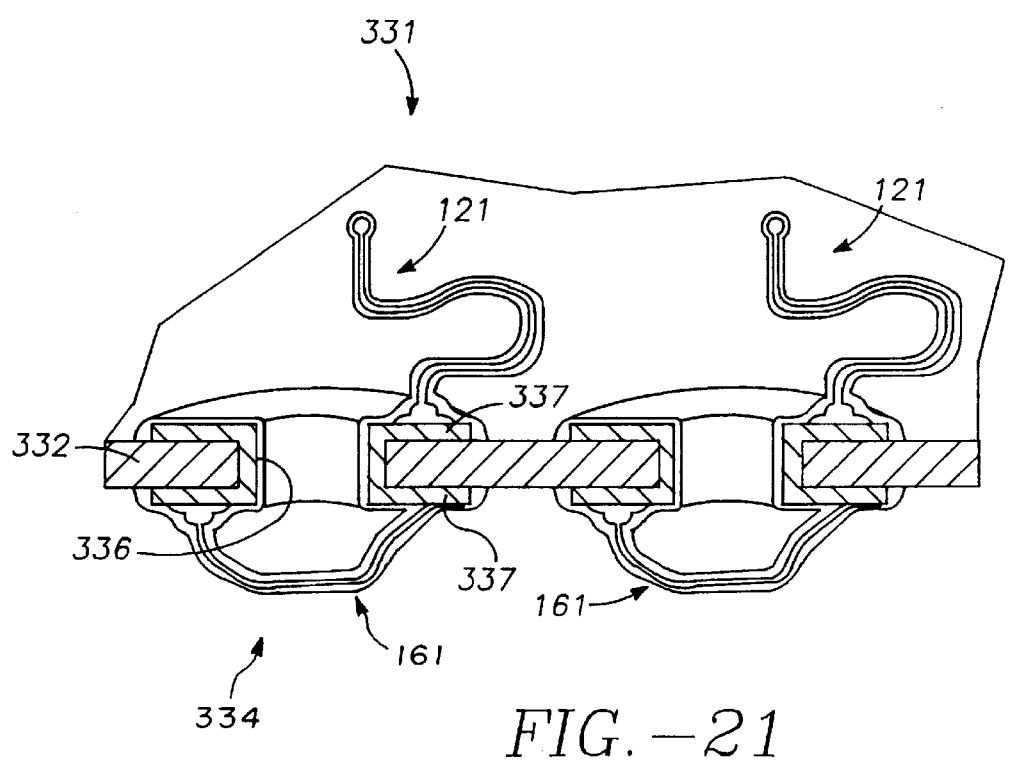
FIG. 21 is an isometric view partially in section of another interposer incorporating the present invention with resilient contact structures on one side and solderable contacts provided on the other side.

Another interposer 331 incorporating the present invention shown in FIG. 21 in which resilient contact structures 121 are provided on one side of a substrate 332 and solderable contacts 334 are provided on the opposite side. Plated-through holes or vertical via conductors 336 are provided in the substrate 332. Standoffs 161 of the type hereinbefore described in conjunction with FIG. 7 are provided on the opposite side of the substrate 332 and are connected to the plating 337 upon which the contact structures 121 and the standoffs 161 are mounted. Thus it can be seen that the interposer 331 provides the capability of making spring contacts from one side of the interposer and solder standoffs or solderable contacts from the other side of the interposer.

Figure 22:
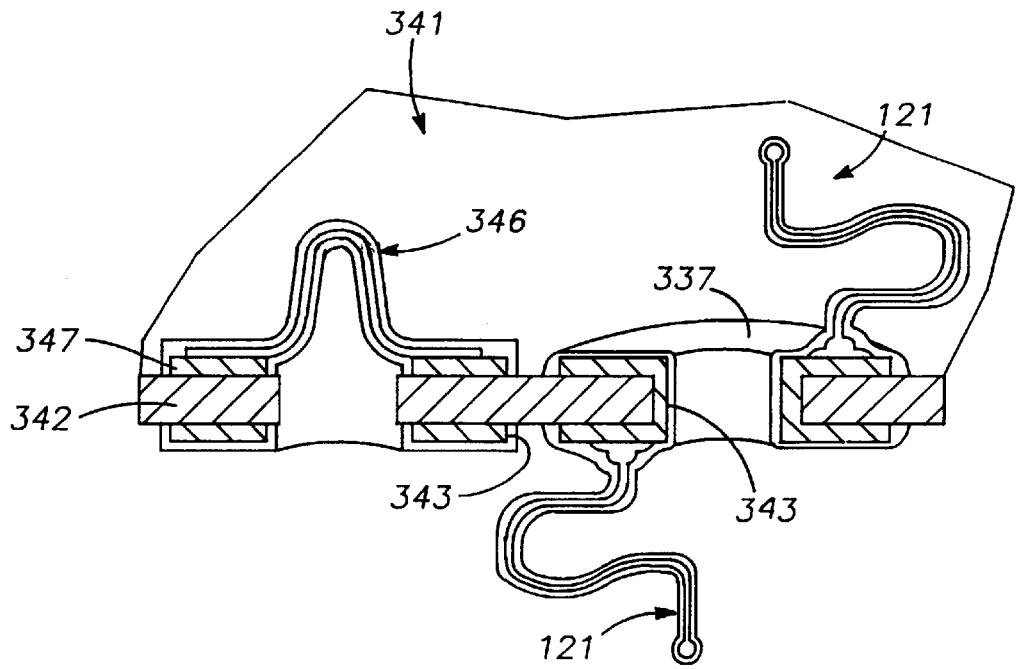
FIG. 22 is an isometric view partially in section showing another embodiment of an interposer incorporating the present invention utilizing double-sided resilient compliant contact structures and standoffs.

In FIG. 22 there is shown interposer 341 which is provided with double-sided resilient contact structures 121 which are disposed on opposite sides of a substrate 342 having plated through holes 343 therein and the standoffs 346. The standoffs 346 are loop-shaped and are mounted on the metallization 347 carried by the substrate 342 and can be positioned anywhere on the substrate 342. As can be seen from FIG. 22, the standoffs 346 have a height which is less than the height of the contact structure 121 so that in the event there is undue pressure applied by the electronic component making contact to the contact structure 121, compressive inward movement against the yieldable force of the contact structure 121 will be arrested by the standoffs 346. The standoffs 346 can be made in the same way as the contact structures 121 hereinbefore described with a skeleton covered by a shell. However, it should be appreciated that the bonds at both ends of the flexible elongate element internal of the standoffs can be wedge bonded if desired.

Figure 23:
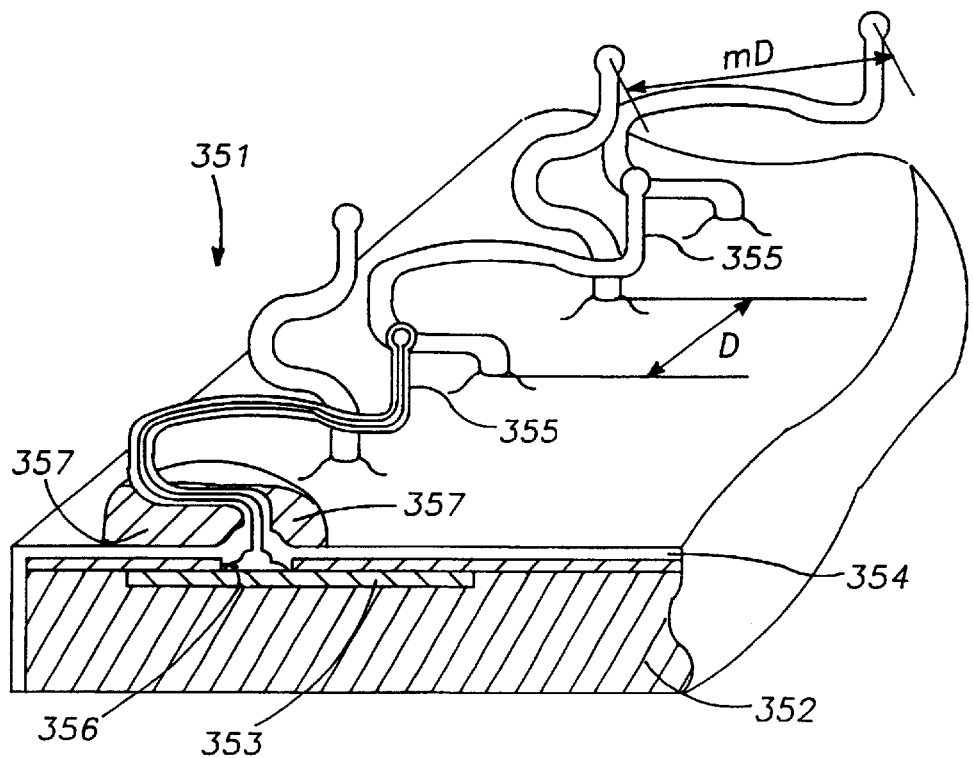
FIG. 23 is an isometric view partially in section of an active semiconductor assembly incorporating the present invention.

In FIG. 23 there is shown an active semiconductor device assembly 351 incorporating the present invention. Assembly 351 includes a semiconductor device 352 in the form of a silicon body which is constructed in a manner well known to those skilled in the art and has internal metallization layers and internal connections It is provided with a top aluminum alloy metallization 353 which is covered by a passivation layer 354. A plurality of contact structures 355 of the type hereinbefore described extend through holes 356 provided in the passivation layer 354 and make contact with the aluminum metallization 353. As can be seen in FIG. 23, the uppermost tip of the contact structures 355 are aligned in two rows with alternate contact structures 355 in each row being offset from the uppermost tip of the other contact structures 355 to provide a staggered arrangement making possible three dimensional fan-outs. The spacing between the aluminum pads on the semiconductor device 352 may be a certain distance apart as represented by the letter D which by way of example can be 5 mils. The staggered free extremities of the contact structures 355 can be a much greater distance apart represented by mD as shown in FIG. 23 which by way of example could be 10 mils or 15 mils. This different spacing for the free ends is readily achieved by providing different offsets for the free ends of the contact structures 355. Thus one set of contact structures 355 consisting of alternate contact structures 355 can be provided with a larger bend than the other contact structures 121 in the row so that the free ends of the contact structures 121 are offset by a desired amount. In this way, it can be seen that there can be a relatively close geometries provided on a semiconductor device with larger pad separations being possible for interconnection to another device.

If desired, an optional encapsulant 357 (see FIG. 23) can be provided which extends over the base of the contact structures 355 and which extends over the surface of the semiconductor device 352 overlying the passivation layer 354. Also, if desired, encapsulant 357 additionally can be provided on the lower extremities of the contact structures 355 as shown in FIG. 23 which serves to envelop the lower portion of the cantilever of the contact structure 355. If desired, all of the contact structure 355 can be provided with such additional encapsulant 357. The applied encapsulant 357 assists in preventing or at least limiting handling damage to semiconductor devices during assembly operations.

Figure 24:
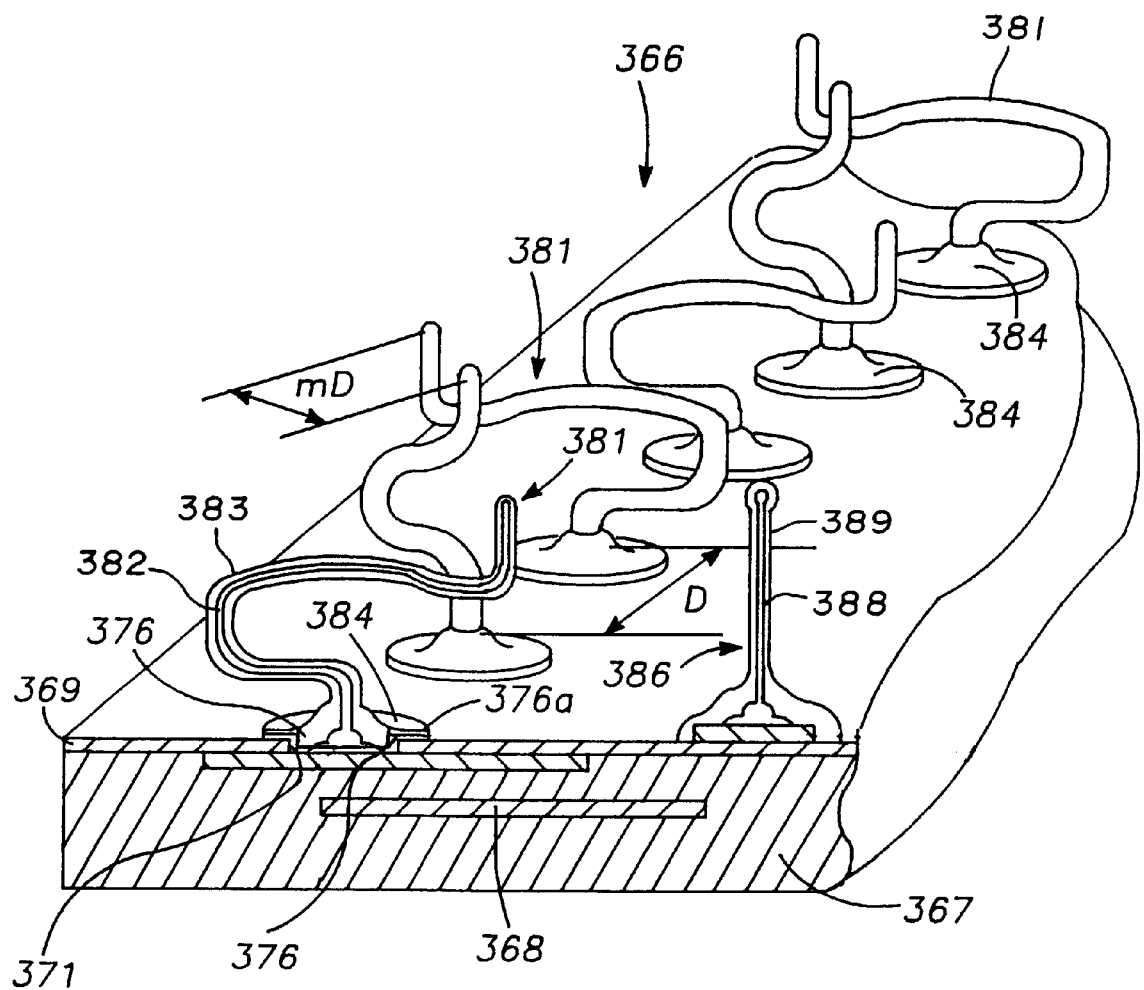
FIG. 24 is an isometric view partially in section showing staggered contact structures with alignment pins.

A semiconductor device assembly 366 incorporating another embodiment of the invention is shown in FIG. 24 and includes an active semiconductor device 367 which is provided with aluminum metallization forming contact pads or areas 368. By way of example, the active semiconductor device can be a memory chip or microprocessor. Most of the surface of the semiconductor device 367 is covered by a passivation layer 369. Holes or openings 371 are formed in the passivation layer 369 in a manner well known to those skilled in the art as for example by utilizing a photoresist and a suitable etch. After the holes 371 have been formed, a continuous shorting layer (not shown) is deposited over the passivation layer 369 and over the aluminum alloy contact pads 368. This is followed by a photoresist layer (not shown) after which holes (not shown) are formed in the photoresist which are in registration with the holes 371 and are of a greater diameter by 0.5 to 5 mils and preferably 1–3 mils. Thereafter, metallization 376 in the form of a suitable material such as a layer of nickel followed by a layer of gold is formed in the holes 371 and into the larger holes formed in the photoresist after which the photoresist is stripped in a conventional manner so that there remains the metallization 376, and the shorting layer is etched away, other than in the areas underneath the metallization 376. As shown in FIG. 24 the metallization is deposited to a thickness of 1–3 mils and provides an annular overhang portion 376a.

Contact structures 381 similar to the contact structures 121 are provided in the cup-shaped metallization 376 as shown with the flexible elongate member or skeleton 382 being ball-bonded to the cup shaped metallization 376 and with the shell 383 extending over the top of the annular overhang 376 to in effect provide a larger diameter cap. Alternatively, the contact structures 381 can be constructed in the holes 371 by bonding the skeletons in the holes followed by deposition of the shell or muscle, after which the photoresist can be stripped and the shorting metal layer is etched away.

As shown in FIG. 24, the contact structures 381 can have different configurations with some having larger bends and others having smaller bends with those with larger bends having longer cantilevered portions. Every other one of the contact structures 381 extend in an opposite direction so that the free standing ends have a pitch or spacing between adjacent free standing ends identified as mD which is different from the pitch or dimension D between adjacent contact structures 381 at the caps 376. It can be seen that by providing different angulation for the contact structures 381 as well as providing different shapes, the free standing ends can be disposed in a plane which is parallel to the plane of the active semiconductor device 367 but in which the spacing between the free ends can be significantly different from the spacing between individual contact structures at the bases of the contact structures to provide the desired spacing or pitches at the free standing ends. In other words, it can be seen from the semiconductor device assembly in FIG. 24 that it is possible to place contacts on a semiconductor device at a certain pitch whereas the same pitch or different pitches can be provided at the free upstanding ends of the contact structures provided thereon.

It is also shown in FIG. 24 in order to facilitate alignment of the semiconductor device assembly 366 with other electronic components as for example printed circuit boards and the like, alignment pins 386 can be provided which can be formed at the same time that the contact structures 381 are formed. Thus, although in FIG. 24 a single alignment pin 386 is shown, it should be appreciated that a plurality of such alignment pins can be provided on a semiconductor device assembly 366. In order to facilitate the formation of such alignment pins 386 when the metallization 376 is provided on the passivation layer 369, pads 387 of the metallization disposed in appropriate places are provided, typically placed on the passivation layer 369. The alignment pins 386 are then formed of a skeleton 388 and a shell 389 at the same time that the other contact structures 381 are formed. Thus it can be seen that it is very easy to provide the desired number of alignment pins in conjunction with the contact structures 381 without any substantial increase in cost of the completed semiconductor device assembly 366.

The active semiconductor devices 367 are typically made in a wafer form as for example 8" in diameter and with the wafers having a thickness ranging from 15 to 30 mils preferably from 15 to 25 mils although there is the capability of providing semiconductor device assemblies as thin as 10 mils. With the construction shown in FIG. 24, it is impossible to provide resilient contact structures 381 which can overhang the edge or outer boundary of each individual chip on a wafer so that it is possible to make contact to the semiconductor devices in the wafer prior to die cutting a wafer. This die cutting or dicing operation is typically described as singulation in which the wafer is cut into single semiconductor devices. In connection with the design of the semiconductor device assembly 366, it is desirable that the contact structures 381 be positioned in a manner shown in FIG. 23 so that a minimum surface area is required for die cutting to provide the desired singulation. Typically these regions in which the cutting is to take place are called scribe streets. By alternating the contact structures 381 provided on those pads to provide the offsets as shown in FIG. 24 it is possible to obtain increased pitches for making interconnections to other electronic components.

Thus it can be seen that the process of the present invention can be utilized with semiconductor devices in wafer form as well as with single semiconductor devices. Also with the arrangement shown in FIG. 24 it can be seen that interconnections can be made with the contact structures 381 at the same time that the alignment pins 386 are being utilized to achieve the proper alignment for the contact structures and the electronic component being mated therewith.

A semiconductor device assembly 366 of the type shown in FIG. 24 is capable of being tested at its full functional speed by yieldably urging the tips of the contact structures 381 into compressive engagement with matching contact terminals provided on a test substrate (not shown). Such testing can be carried out without the need of special probes carried by a test substrate. In order to ensure excellent contact between the contact terminals on the test substrate, the conductive shell 383 can be provided with an outer layer of a noble metal such as gold, rhodium or silver by providing a similar material on the contact pads of the test substrate, a low contact resistance is obtained. Heretofore it has been necessary for test probes to engage typically aluminum contacts which have a propensity to oxidize, resulting in high contact resistance.

The construction shown in FIG. 24, in addition to facilitating test procedures, can also be utilized for burn-in testing of the semiconductor device. Thus, in the same manner, the semiconductor device assembly 367 can have its contact structures 381 yieldably engage matching contact pads provided on a burn-in test substrate (not shown) which can be formed of the same material as the contact pads provided on the test substrate. The device 367 when in contact with the burn-in test substrate can be exercised during prolonged periods while being exposed to alternately high and low temperatures. In connection with such burn-in testing, it should be appreciated that multiple semiconductor devices 367 can be used to populate a burn-in board or substrate capable of receiving a plurality of such semiconductor devices 367 and retained in engagement therewith by spring clips of the types hereinafter described in connection with FIGS. 26 and 27. Registration of the semiconductor device assembly 367 with the test burn-in substrates can be facilitated by the use of the registration or alignment pins 386. The fan-out capabilities provided with the semiconductor structures 381 arranged in the manner shown in FIG. 24 makes it possible to have a fine pitch for the contact pads on the semiconductor device assembly 367 with a coarser pitch for the tips of the contact structures 381. This makes it possible to simplify the registration of such semiconductor devices with coarser and possibly a standard pitch for the contact pads on the test and burn-in substrates, making it possible to reduce the cost of such test and burn-in substrates.

After the testing and burn-in procedures have been performed on the semiconductor devices 367 and the performance of the devices has been validated, they can be removed from the test and/or burn-in substrates by removing the spring clips and thereafter bringing the free ends of the contact structures 381 into engagement with matching patterns of contact pads provided on an interconnection substrate of the type hereinafter described to provide a permanent interconnection. The fan-out capabilities of the contact structures 381 shown in FIG. 24 also make it possible to utilize a pitch on the contact pads carried by the interconnection substrate which differs from the pitch of the contact pads on the semiconductor device 367. The registration pins 386 can also aid in making the desired registration and simplifies making the permanent interconnections.

Figure 25:
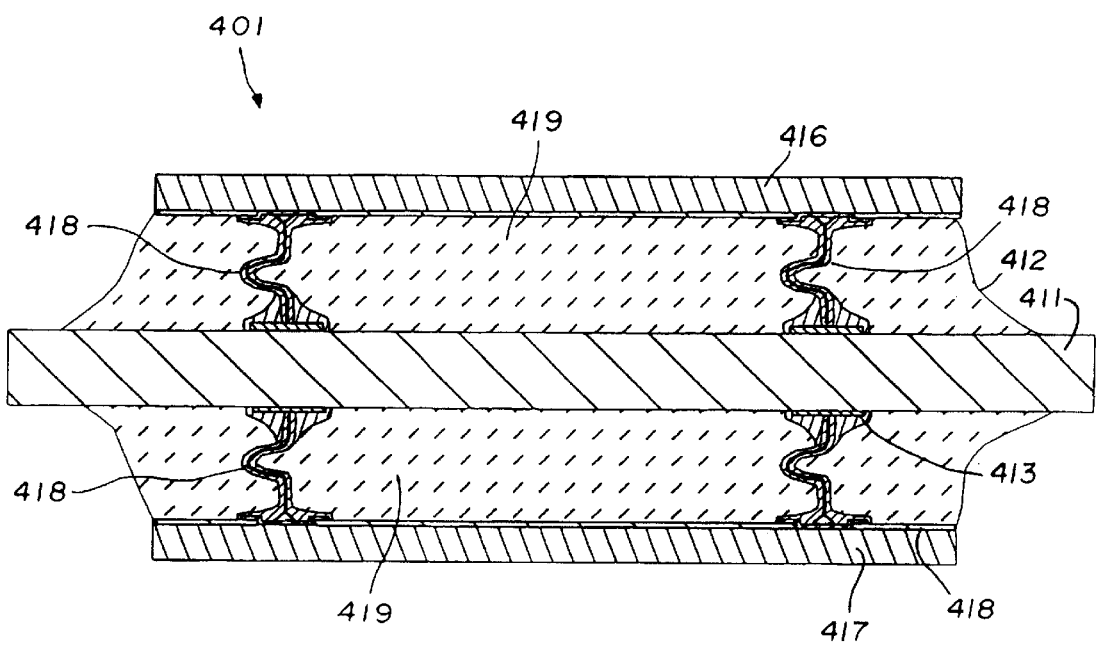
FIG. 25 is a side elevational view in section of a semiconductor package incorporating the present invention showing a double-sided flip chip attachment.

A semiconductor package assembly 401 is shown in FIG. 25. Mounted within the package assembly 401 is a printed circuit (PC) board 411 which carries circuitry which includes contact pads 412 on one side of the printed circuit board 411 and additional contact pads 413 on the other side of the PC board. Semiconductor devices 416 and 417 are provided on opposite sides of the printed circuit board and carry resilient contact structures 418 that are mounted thereon in a manner hereinbefore described to provide a double-sided flip chip attachment to the circuit board 411 with solderable terminals. The resilient contact structures 418 are bonded to the contact pads 412 and 413 by passing the assembly through a suitable furnace to cause the solder carried by the resilient contact structures 418 to form a solder joint with the contact pads 412 and 413. This process can be further assisted by the use of reflowable solder paste applied to contact pads 412 and 413, as is well known to those skilled in the art of surface mount assembly technologies. An encapsulant 419 formed of a suitable insulating material is disposed between the printed circuit board 411 and the semiconductor devices 416 and 417 to complete the package.

Figure 26:
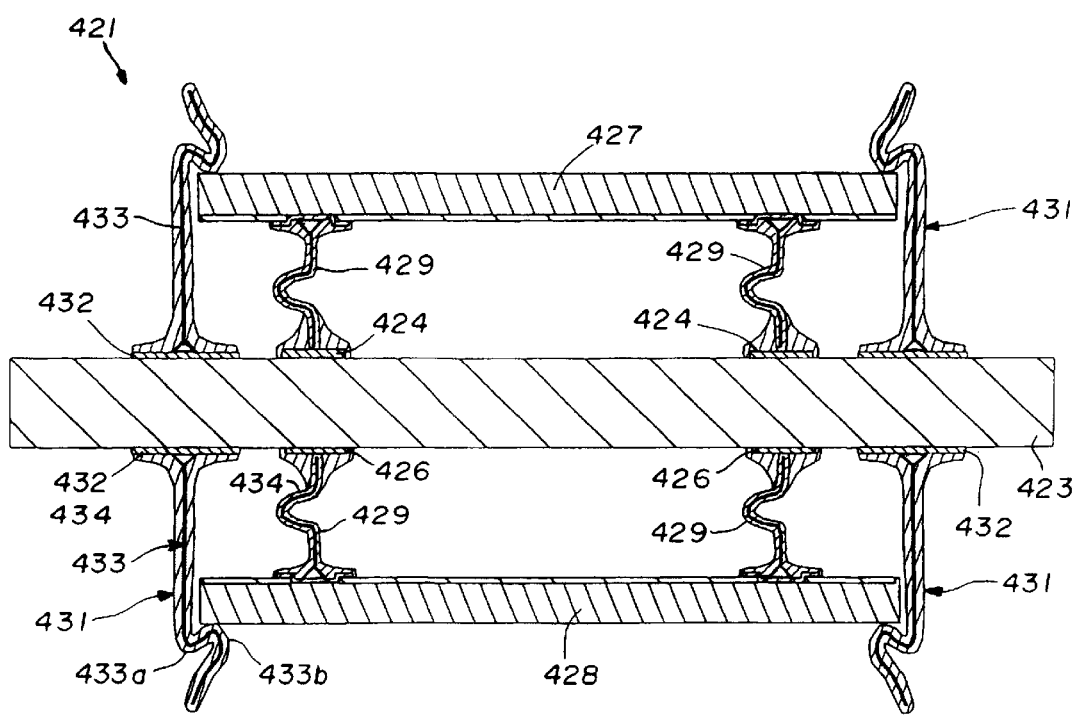
FIG. 26 is a side elevational view in section of a semiconductor package incorporating the present invention.
Figure 27:
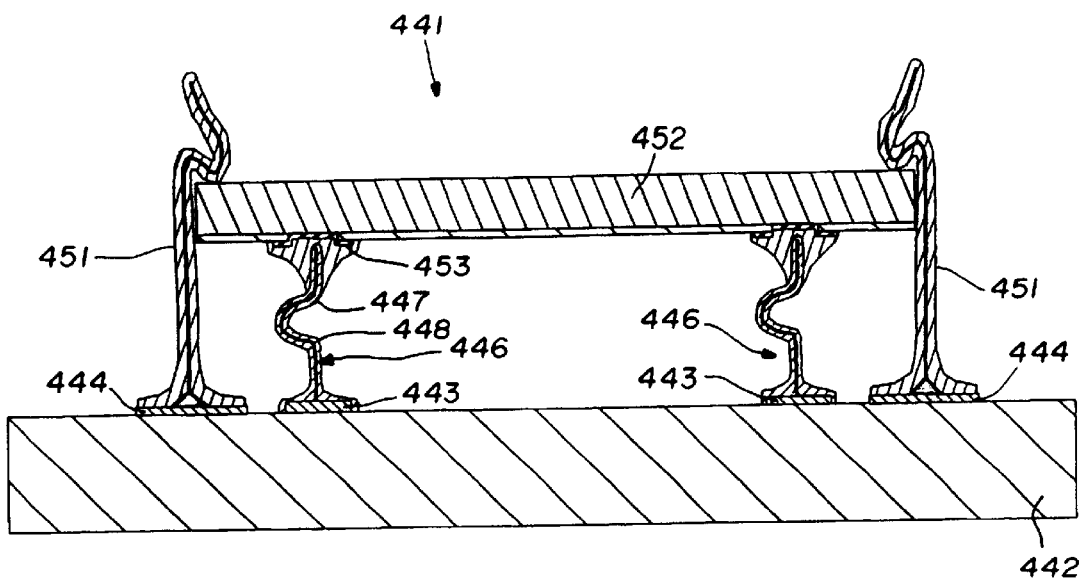
FIG. 27 is a side elevational view in section of another embodiment of a semiconductor package incorporating the present invention utilizing demountable contact structures.

Another semiconductor package assembly 421 incorporating the present invention is shown in FIG. 26 and includes a laminated printed circuit board 423 carrying pads 424 and 426 on opposite sides of the same. Semiconductor devices 427 and 428 are disposed on opposite sides of the PC board 423 and carry contact structures 429 of the type hereinbefore described. The contact structures 429 can be yieldably urged into engagement with the contact pads 424 and 426 by spring-like clips 431 which are secured to the printed circuit board and which snap over the edges of the semiconductor devices 427 and 428. These spring-like clips 431 can be dispersed around the perimeter of the semiconductor devices as for example for a rectangular semiconductor device at least four of such spring-like clips 431 can be provided with two on each of two opposite sides. The spring clips 431 as shown are bonded to contact pads 432 carried by the printed circuit board 423. Each of the clips 431 is provided with a flexible elongate element or skeleton 433 of the type hereinbefore described which is bonded in a suitable manner as for example by a ball bond to the pads 433. The skeleton 433 is provided with two bends 433a and 433b to form the spring-like clip which extends over one side of the semiconductor device as shown in FIG. 27. A shell 434 provides a suitable reinforcement or muscle for the clips 431 and augments the spring-like or clip-like characteristics of the bends 433a and 433b to retain the semiconductor devices 427 and 428 in place. With such an arrangement, it can be seen that the semiconductor devices 427 and 428 with their contact structures 429 are retained in intimate contact with the contact pads 424 and 426. This arrangement permits registration of contact structures 429 with the contact pads 424 and 426. When it is desired to remove the semiconductor devices 427 and 428, it is only necessary to push the spring clips 431 outwardly to release the semiconductor devices 427 and 428 carrying with them the contact structures 429 which become disengaged from the contact pads 424 and 426.

A solder coating can be provided either on the free ends of the contact structures or on the contact pads to be engaged thereby and by then passing the assembly through a furnace, the solder forms a joint mass which intimately encompasses the free ends of the contact structures and the surfaces of the pads leaving only an optional thin coating on the lengths of the contact structures to thereby provide a connection which is compliant in three directions, X, Y and Z directions.

An alternative semiconductor package assembly 441 is shown in FIG. 27 and includes a PC board 442 or other suitable substrate which carries contact pads 443 and 444 that are spaced apart on one surface of the PC board 442. Contact structures 446 are mounted on the pads 443 and are comprised of a skeleton 447 and shell 448 construction in the manner shown to provide a resilient contact structure. Spring clips 451 of the type shown in FIG. 26 are secured to the pads 444. As shown in FIG. 27 a semiconductor device 452 is clamped between the uppermost extremities of the contact structures 446 and removably engages metallized cup-shaped terminals 453 carried by the semiconductor device 452 of a type hereinbefore described. In this construction it can be seen that the semiconductor device 452 is demountable by merely pushing aside the spring clips 451 because there is no solder interconnection between the distal or free extremities of the contact structures 446 and the contact terminals 453 carried by the semiconductor device 452. It should be appreciated with the arrangement shown in FIG. 27 that if desired, the contact structures 446 can be mounted in the wells 453 carried by the semiconductor device 452 and that the free ends of the contact structures 446 removably engage the pads 443 carried by the printed circuit board and to thereby achieve substantially the same results as achieved by the arrangement shown in FIG. 27. It should be appreciated that in place of spring clips 451, external spring elements (not shown) can be used to spring load the contact structures 446 against metallized wells 453.

Figure 28:
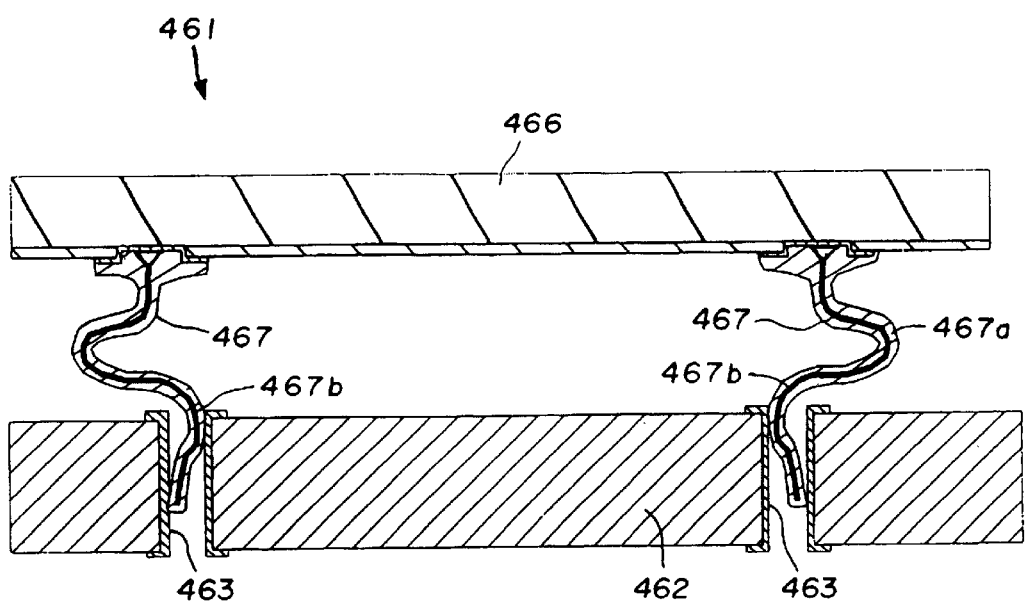
FIG. 28 is a side elevational view in section of another semiconductor package incorporating the present invention which utilizing resilient contact structures demountably interconnected and plated through holes.

Another semiconductor package 461 is shown in FIG. 28 which is particularly suited for use with printed circuit boards 462 having vertical via conductors or plated-through holes 463 extending therethrough. A semiconductor device 466 is provided which carries resilient contact structures 467 of a type hereinbefore described. The contact structures 467 as shown are provided with a plurality of bends 467a and 467b particularly at their free ends which bends are such so that they subtend a diameter which is greater than the diameter of the plated through holes 463 provided in the printed circuit board. Thus as shown in FIG. 28, when the semiconductor device is positioned so that the contact structures 467 are in registration with the plated through holes, the contact structures 467 can be pushed into the plated through holes to form spring-loaded fits between the contact structures 467 and the walls of the plated-through holes 463 to retain the semiconductor device 466 in a demountable or removably mounted position on the PC board 462 and making electrical contact with the plated-through holes so that contact can be made from the printed circuit board to the outside world.

Figure 29:
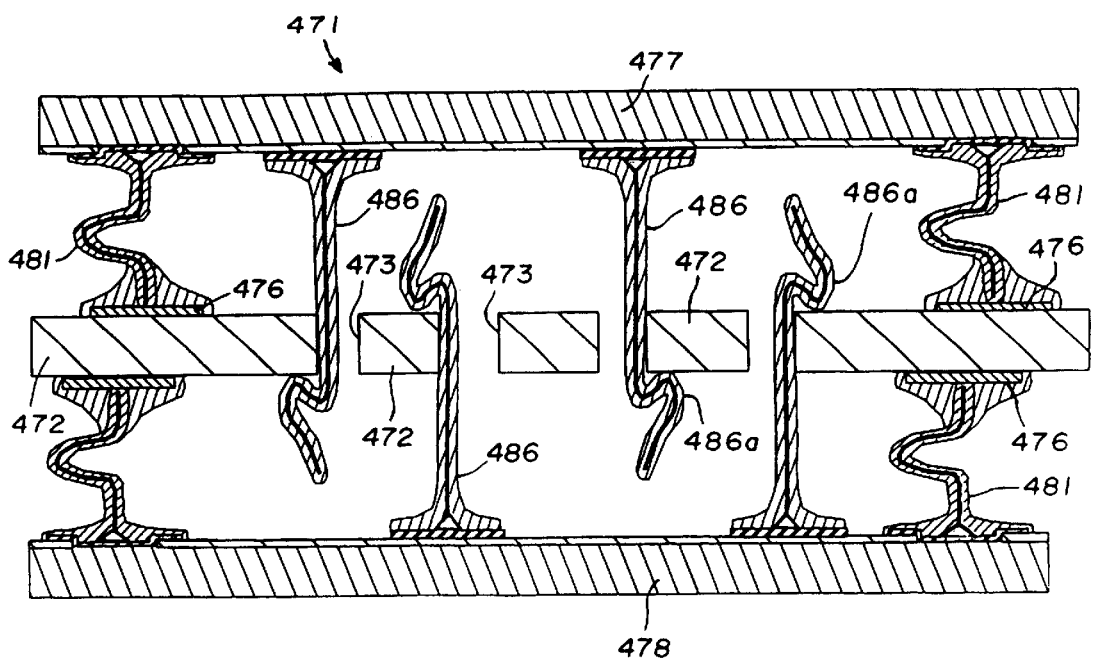
FIG. 29 is a side elevational view in section of another semiconductor package assembly incorporating the present invention utilizing latching springs.

Still another semiconductor package assembly 471 incorporating the present invention is shown in FIG. 29 in which there is provided a PC board 472 having a plurality of spaced apart holes 473 provided therein. Spaced apart contact pads 476 are provided on opposite sides of the PC board. Semiconductor devices 477 and 478 are provided on opposite sides and carry contact structures 481 of the type hereinbefore described which are of a resilient type and have free ends which are adapted to engage the contact pads 476. Spring clips 486 of the type also hereinbefore described are mounted on the semiconductor device in a manner hereinbefore described and are positioned on the semiconductor device so that they are in registration with the holes 473 provided in the printed circuit board 472. As shown, the semiconductor devices 477 and 478 can be clipped to the PC board 472 by having the spring clips 486 extend through the holes 473 and having portions 486a engaging the opposite sides of the printed circuit board as shown in FIG. 29. In this connection, a solder connection can optionally be formed between the free ends of the contact structures 481 and the contact pads 476. Alternatively as hereinbefore described, the free ends can be formed so that they can make a removable resilient contact with the pads 476. Such a construction can be readily made by providing free ends which are adapted to frictionally engage the contact pads 476 through spring loading.

Figure 30:
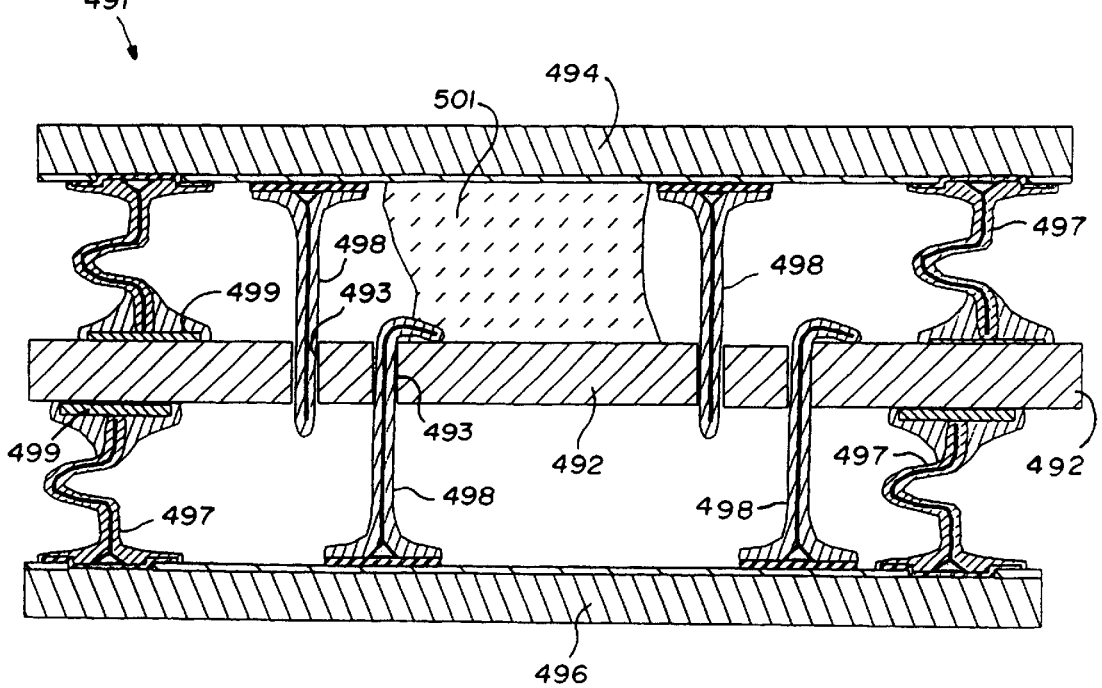
FIG. 30 is a side elevational view in section of another semiconductor package incorporating the present invention utilizing alignment pins.

Another semiconductor package assembly 491 is shown in FIG. 30 incorporating another embodiment of the invention in which a PC board 492 is provided having spaced apart holes 493 extending therethrough. Semiconductor devices 494 and 496 of the type hereinbefore described are provided and have mounted thereon contact structures 497. Similarly alignment pins 498 of the type hereinbefore described are mounted on the semiconductor devices 494 and 496.

In assembling the semiconductor package assembly 491, the semiconductor device 496 which can be in the form of a semiconductor chip which can be placed on a carrier (not shown) for automated handling after which the chips are selected and brought over the top with the holes 493 in registration with the alignment pins 498. Thereafter as shown, the upper extremities of the alignment pins 498 are bent over to retain the printed circuit board in engagement with the semiconductor device 496. This intermediate assembly of the semiconductor device 496 and printed circuit 492 is flipped. Thereafter, the second semiconductor device 494 is brought over the top of the printed circuit board 492 and turned upside down so that the alignment pins 498 are in alignment with other holes 493 in a printed circuit board and then moved into the holes 493 to cause the contact structures 497 carried thereby to move into engagement with the contact pads 499 on the printed circuit board. In order to additionally assist retaining the parts in an aligned condition, an adhesive 501 of a suitable type, with an appropriate solvent which shrinks upon curing due to solvent evaporation can be optionally placed between the printed circuit board 492 and the semiconductor devices 494. It can be seen that if desired when an adhesive is used, the free extremities of the alignment pins 498 carried by the semiconductor device 496 need not be bent over as shown.

Figure 31:
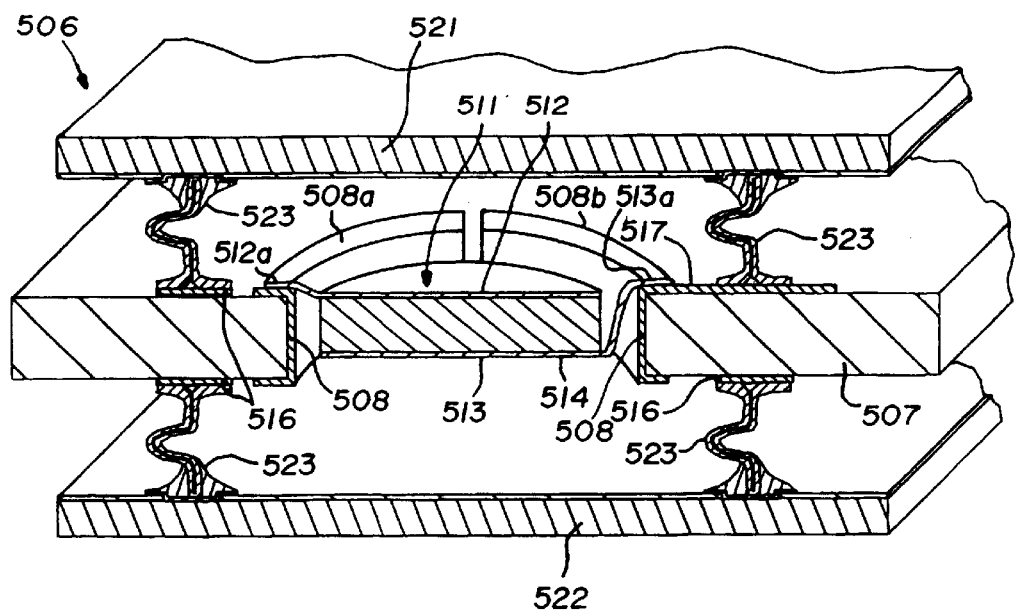
FIG. 31 is a side elevational view in section of another semiconductor package incorporating the present invention carrying a below-the-surface capacitor.

Another semiconductor package assembly 506 incorporating the present invention as shown in FIG. 31 includes a printed circuit board 507 which is provided with a large plated through opening or hole 508. A capacitor 511 is disposed in the large plated through hole 508 and includes first and second electrode plates 512 and 513 separated by a dielectric material 514. The free extension 512*a* of the plate 512 is bonded to the portion 508*a* of the plating for the plated through hole 508 and the free extension 513*a* of the other plate 513 is bonded to the plating portion 508*b* of the plating for the plated through hole 508. In this way it can be seen that the capacitor 511 is suspended in the plated through hole 508. A plurality of contact pads 516 are provided on the upper and lower surfaces of the substrate or the PC board 507 and are spaced apart from the plated through hole 508. Another contact pad 517 is provided on the printed circuit board and is in contact with the portion 508*b* of the plated through hole 508. Semiconductor devices 521 and 522 are provided and are of a type hereinbefore described and carry contact structures 523 of the type hereinbefore described which are soldered to the contact pads 516 and the contact pads 517 as shown.

Figure 32:
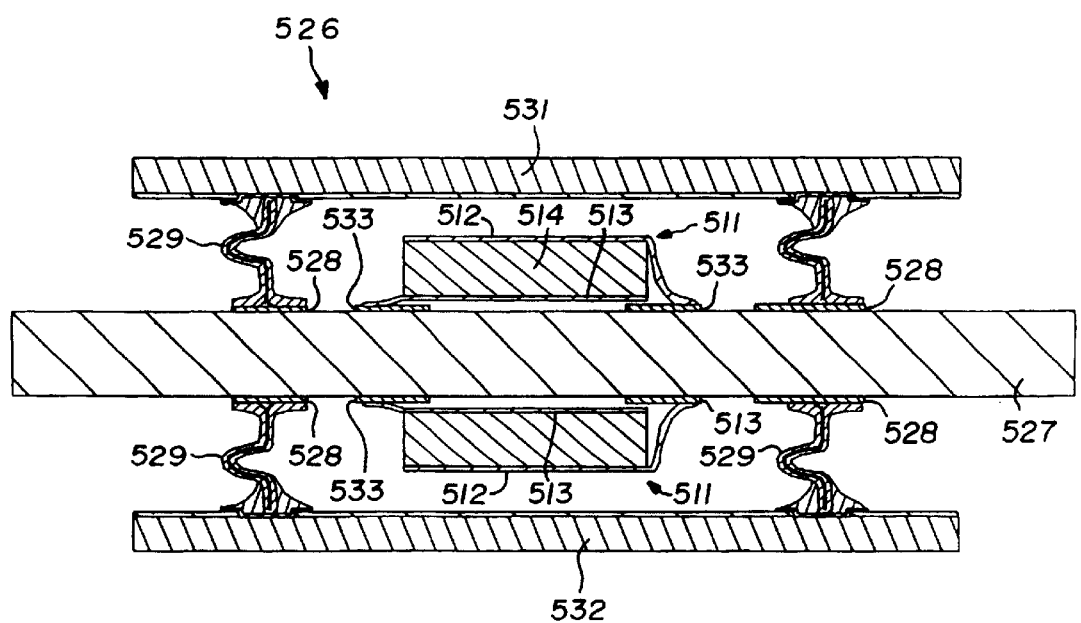
FIG. 32 is a side elevational view in section of another semiconductor package incorporating the present invention showing the mounting of a plurality of capacitors.

Another semiconductor device assembly 526 incorporating the present invention is shown in FIG. 32 and includes a PC board 527 which carries a plurality of spaced apart contact pads 528 on opposite sides of the same which are bonded to contact structures 529 of the resilient type hereinbefore described which are mounted on semiconductor devices 531 and 532. Capacitors 511 of the type hereinbefore described are disposed on opposite sides of the printed circuit board 527. The capacitors 511 are provided with plates 512 and 513 which are bonded to contact pads 533 provided on opposite sides of the printed circuit board 527. Thus it can be seen that the capacitors 511 are disposed in the spaces between the semiconductor devices 531 and 532 and opposite sides of the printed circuit board 527. There is adequate space for such capacitors as needed in connection with the semiconductor devices 531 and 532. It can be seen by adjusting the height of the resilient contact structures 529 that adequate space can be provided for the capacitors 511 and between the printed circuit board and the printed circuit board 527 and the semiconductor devices 531 and 532.

Figure 33:
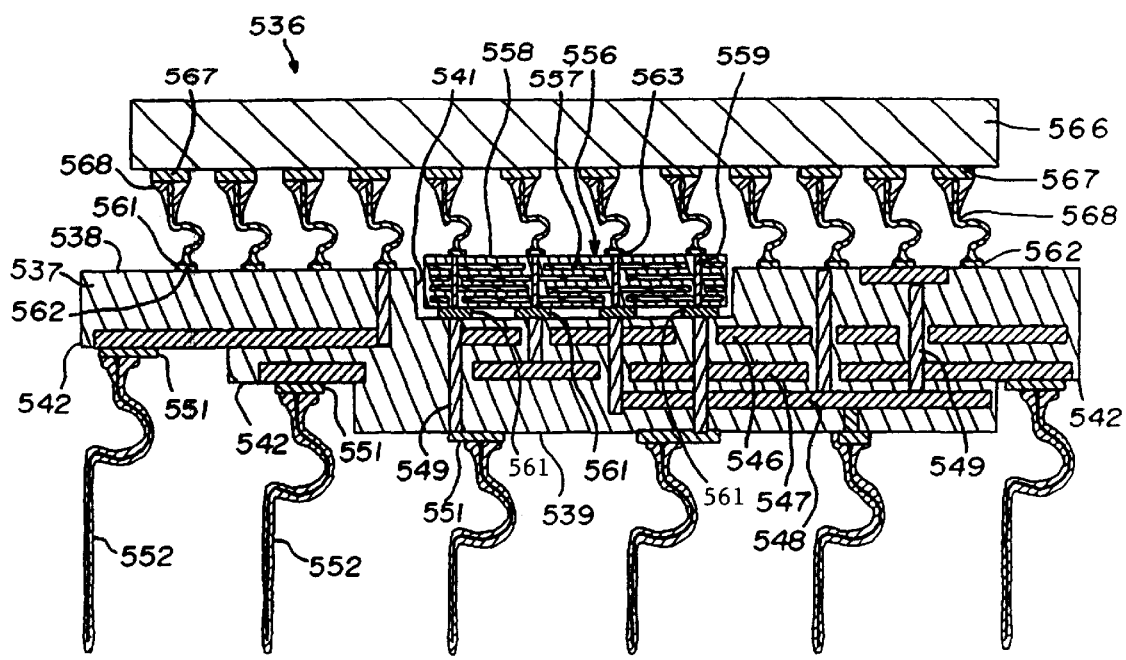
FIG. 33 is a side elevational view in section of another semiconductor package incorporating the present invention utilizing a decoupling capacitor.

Another semiconductor device assembly 536 incorporating the present invention is shown in FIG. 33 and as shown therein includes a multilayer printed circuit board or substrate 537 which is provided with first and second surfaces 538 and 539. A rectangular recess of 541 is provided in the PC board 537 which opens through the first surface 538. A plurality of spaced apart steps 542 are provided accessible through the side having a surface 539 thereon and are at various elevations with respect to the surface 539 so as in effect to form depressions or recesses surface 539. As shown, the printed circuit board 537 is provided with at least three different levels of metallization identified as 546, 547 and 548. It is also provided with a plurality of vertical via conductors or vertical vias 549 which as shown extend in directions perpendicular to the surfaces 538 and 539 and make various interconnections as shown in FIG. 33. The vertical vias 549 can be formed of a suitable material such as molybdenum or tungsten in a ceramic substrate or in the form of plated-through holes in laminated printed circuit boards. A plurality of contact pads 551 are provided in the side carrying the second surface 539 and as shown are disposed on the steps 542 as well as on the surface 539 and are thereby directly connected to several levels of metallization. Resilient contact structures 552 of the type hereinbefore described are bonded to each of the contact pads 551 and are of various lengths as shown in FIG. 33 so that their free extremities substantially lie in a single plane which is generally parallel to the surface 539 and the surfaces of the steps 542.

A through-hole decoupling capacitor 556 is provided which is comprised of multiple capacitors formed by a plurality of parallel conducting plates 557 disposed in a dielectric material 558 of a type well known to those skilled in the art. The plates 557 are connected to vertical vias 559. The vertical vias 559 on one side are connected to contact pads 561 which are disposed within the recess 541 and make contact with the vertical vias 549 carried by the printed circuit board 537.

As can be seen in FIG. 33, the upper surface of the decoupling capacitor 556 just extends slightly above the surface 538 of the printed circuit board 537. Metallization is provided on the surface 538 of the printed circuit board and provides contact pads 562. Additional contact pads 563 are provided on the decoupling capacitor 556 which are in contact with the vertical vias 559. A semiconductor device or chip 566 is provided which has a plurality of contact pads 567. Resilient contact structures 568 of the type herein described are mounted on the contact pads 562 and 563 with the uppermost points of the contacts 568 terminating substantially in common horizontal plane so that the free ends of the contact structures 568 are bonded to the contact pads 567 on the integrated semiconductor device 566. Thus it can be seen that the resilient contact structures 568 readily accommodate the disparity in the levels of the planar surfaces of the decoupling capacitor 556 and the surface 538 of the printed circuit board 537. This makes it possible to bond the planar surface of a chip 566 to surfaces which may not be planar as shown in FIG. 33.

This type of construction makes it possible to provide very low inductance coupling to the decoupling capacitor 556 which is a very important parameter defining the performance of a microprocessor. As explained previously, all of the contacts on the other side of the printed circuit board 537 do not originate in the same plane which facilitates making direct connections to the contact pads on the different planes as shown. This makes it possible to reduce the number of vias and conductors required for interconnections within the substrate.

Although the final outside packaging for the semiconductor package assembly 536 is not shown, it can be readily appreciated by those skilled in the art, packaging of the type hereinbefore described can be utilized. Alternatively, the under chip 566 which is shown in FIG. 33 can be encapsulated (not shown) in a suitable polymer or epoxy based compound.

It should be appreciated that if desired, the printed circuit board 537 can be on a larger scale so that it can accommodate several semiconductor face-down connected chips on the surface 538 by utilizing the same principles which are shown in FIG. 33. Thus flip chips 566 can be provided adjacent to each other arranged in rows extending in both the X and the Y directions as desired.

Figure 34:
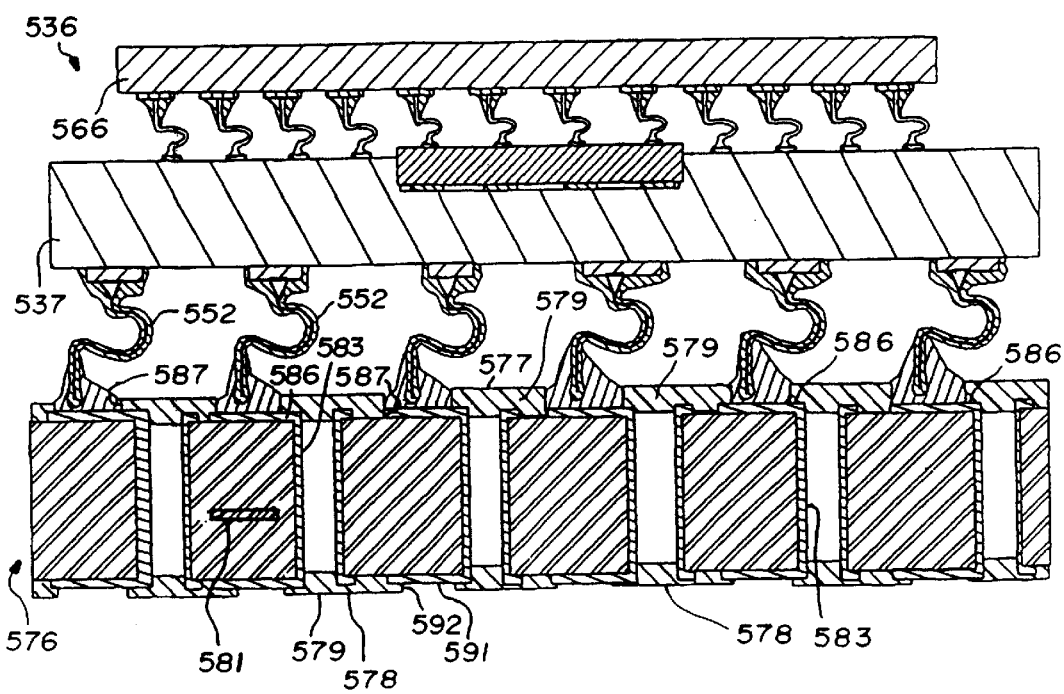
FIG. 34 is a side elevational view in section of another semiconductor package incorporating the present invention utilizing a motherboard.

Another semiconductor package assembly 571 incorporating the present invention is shown in FIG. 34 and as shown therein is in a form of a composite structure which by way of example can include a semiconductor package assembly 536 of the type hereinbefore described in conjunction with FIG. 33 showing the way that it can be mounted on another printed circuit board 576 which can be characterized as a motherboard or an integration substrate. As shown, the motherboard 576 is provided with first and second surfaces 577 and 578 provided by solder layers 579, often called solder masks, disposed on opposite sides of the motherboard 576. The motherboard also has multiple layers of metallization 581 and a plurality of spaced-apart vertical plated-through holes 583 extending perpendicular to the surfaces 577 and 578. The plated-through holes 583 are provided with contact surfaces 586 which are accessible through openings 587 provided in the surface 577. They are also provided with contact surfaces 591 accessible through holes 592 in the layer 579 which extend through to the surface 578. As shown in FIG. 34, the contact surfaces 586 are engaged by the free extremities of the resilient contact structures 552 and are bonded thereto by suitable means such as a solder or an electrically conductive epoxy to complete the assembly.

It should be appreciated that with a large motherboard a plurality of semiconductor package assemblies 536 of the type shown in FIG. 33 can be mounted on the same mother printed circuit board or integration substrate. Similarly, semiconductor package assemblies 536 can be mounted on the other side of the mother printed circuit board which are prepared in a manner similar to that hereinbefore described.

In connection with mounting the semiconductor package assembly 536 on a mother circuit board, rather than the direct solder contacts shown in FIG. 34, it should be appreciated that if desired, the contact structures 552 can be in the form of demountable contact structures such as the contact structures 467 shown in FIG. 28 to make electrical and spring-loaded contact with the conductive terminals connected to plated-through holes 583 provided in the motherboard. Thus in this manner, spring loaded fits can be provided between the motherboard 576 and the semiconductor package assembly 536. Such a construction is desirable because it makes it possible to replace a semiconductor package in the field. Thus, for example by utilizing such spring loaded contacts, the semiconductor package assembly 536 can be removed and replaced by another one of greater capabilities. For example, a microprocessor in a notebook computer could be upgraded in this manner. In this case, a methodology for the use of integrated resilient contacts includes burn-in and test of the assembly 536 by engaging the resilient contacts against pads on an appropriate test or burn-in substrate and then spring loading the component to the board 576 as heretofore described.

Figure 35:
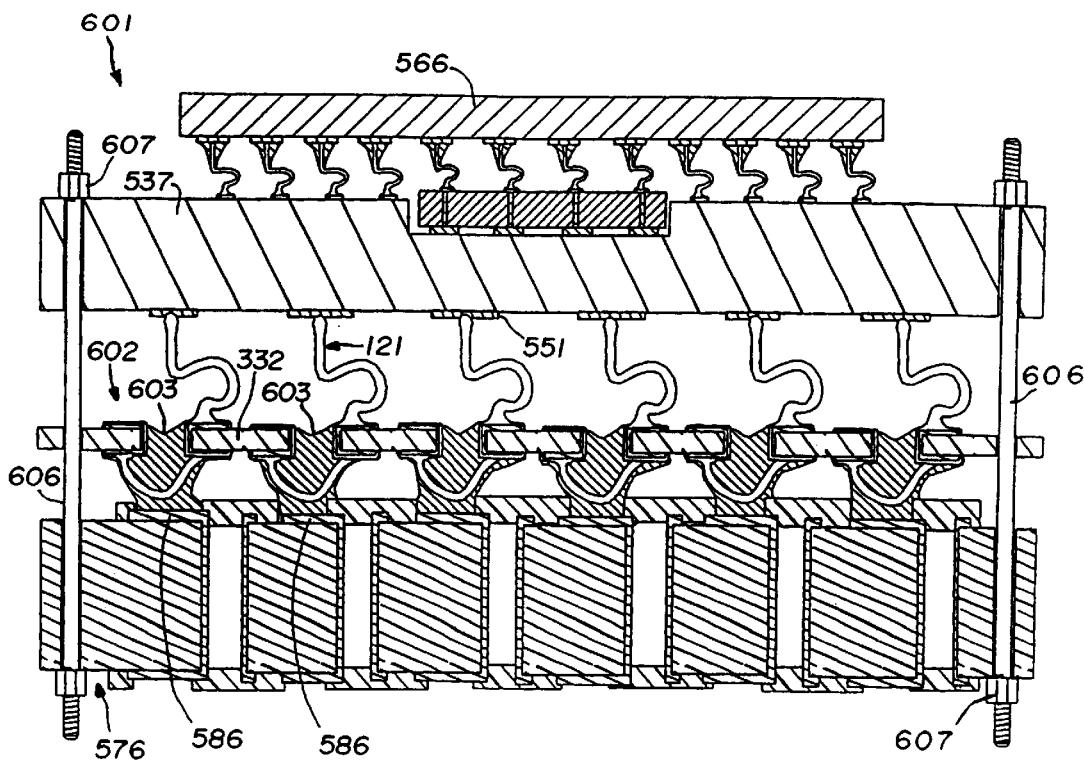
FIG. 35 is a side elevational view in section of another semiconductor package incorporating the present invention utilizing an interposer.

Another composite semiconductor package assembly 601 incorporating the present invention is shown in FIG. 35 and shows a printed circuit board 537 with the semiconductor device 566 mounted thereon and with a mother printed circuit board 576 of the type hereinbefore described with an interposer 602 of the type shown in FIG. 21 being utilized between the printed circuit board 537 and the mother printed circuit board 576 with solder 603 being utilized for bonding the contact structures 161 of the interposer 602 to the contact surfaces 586. Similarly, the contact structures 121 of the interposer 602 are yieldably retained in engagement with the contact pads 551 and are retained in engagement therewith by suitable means such as through bolts 606 provided with nuts 607 extending through the printed circuit board 537 and through the mother circuit board 576 and through the interposer 602 to form a composite assembly in which the compression on the contact structures 121 is maintained to provide good electrical contact with the contact pads 551 carried by the printed circuit board 537.

In place of the bolts 606 it should be appreciated that other fastening means can be utilized as for example spring clips to retain the compression on the contact structures 121 and to fasten the printed circuit boards together as hereinbefore described. Rather than the interposer 602 being formed as an interposer of the type shown in FIG. 21, an interposer of the type shown in FIG. 20 can be utilized with removable electrode contacts being formed on both sides of the interposer and by having the contact structures 121 yieldably engage the contact pads 551 and having the contact structures 201 yieldably engage the surfaces 586. With such a construction it can be seen that changes can be readily made in a composite semiconductor package assembly merely by removing the bolts and replacing certain other components as well as the interposer if desired. The interposer is demountable to facilitate such changes.

Figure 36:
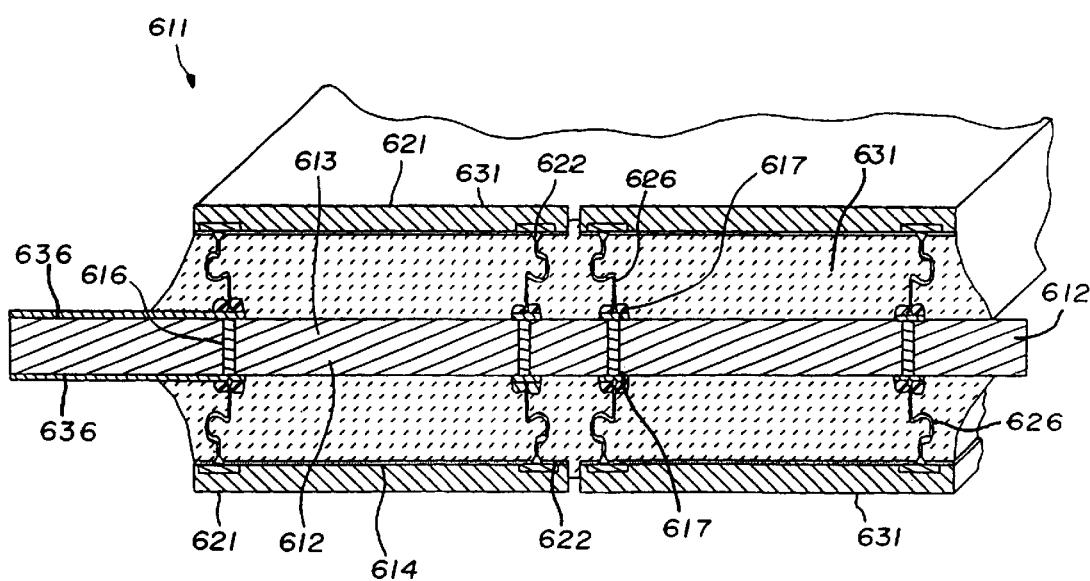
FIG. 36 is an isometric view partially in section of a semiconductor package incorporating the present invention utilizing an interconnection substrate.

Another semiconductor package assembly incorporating the present invention is shown in FIG. 36. The assembly 611 discloses the manner in which packing of silicon on cards can be obtained and includes an interconnection substrate 612 formed of a suitable insulating material which is provided with first and second surfaces 613 and 614. Such an interconnecting substrate can be of the type of the printed circuit boards hereinbefore described and for example can contain a plurality of levels of metallization (not shown) as well as through-hole conductors or via conductors 616 which are in contact with contact pads 617 provided on the surfaces 613 and 614.

Semiconductor devices in the form of face-down mounted chips 621 are provided which are adapted to be disposed on opposite sides of the interconnection substrate 612. As described in connection with the previous semiconductor devices, these devices are provided with a plurality of contact pads 622 which have a resilient contact structures 626 of the type hereinbefore described mounted thereon and which are turned upside down to make electrical contact to the contact pads 617 provided on the interconnection substrate 612. The space between the flip chips 621 and the interconnection substrate 612 can be filled with a suitable encapsulant 631 as shown.

All of the electrical connections are provided within the various flip chips can be brought out to a plurality of contacts 636 provided on one edge of the assembly 611 as shown in FIG. 36 serve as precursors and so that the semiconductor package assembly 611 can be fitted into conventional sockets for example as provided in a desktop computer and the like. With such a construction, it can be seen that silicon chips can be face down mounted on both sides of the interconnection substrate 612.

Figure 37:
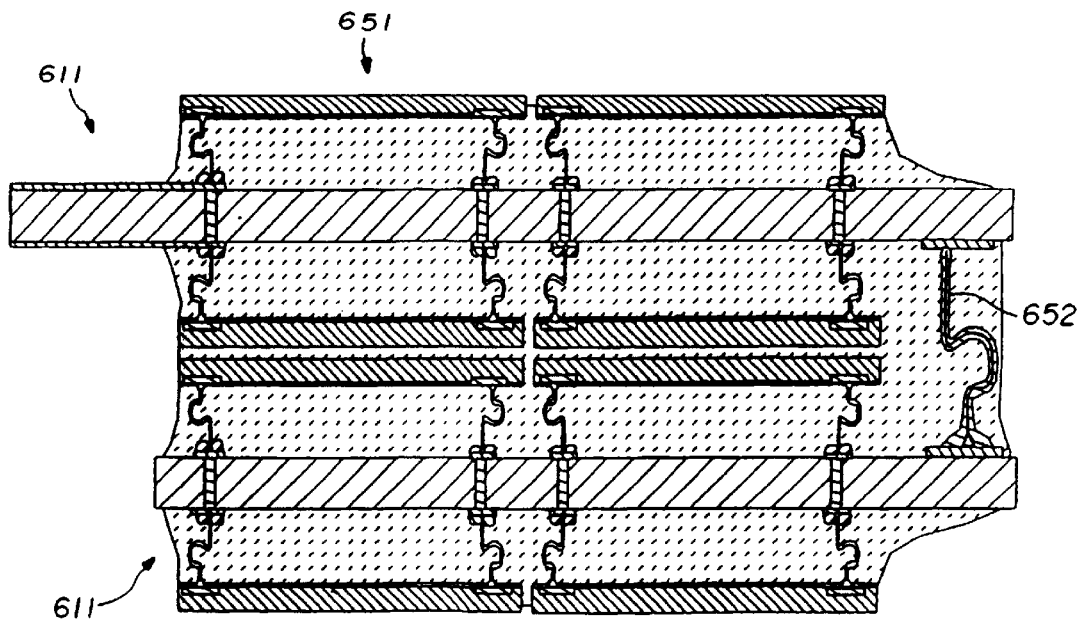
FIG. 37 is a side elevational view of a semiconductor package incorporating four layers of semiconductor devices in the form of double-sided precursors.

Another semiconductor package assembly 651 incorporating the present invention is shown in FIG. 37 and shows the manner in which the semiconductor package assembly 611 shown in FIG. 36 can be vertically stacked with the device semiconductor package assembly 611 being described as a double stacked card. As shown in FIG. 37 two of these double-sided silicon precursors have been mounted vertically with respect to each other with additional contact structures 652 having interconnections between the two interconnection substrates 612 of the precursors 611. The entire assembly can be optionally encapsulated with a polymeric or epoxy material for added rigidity and protection.

Figure 38:
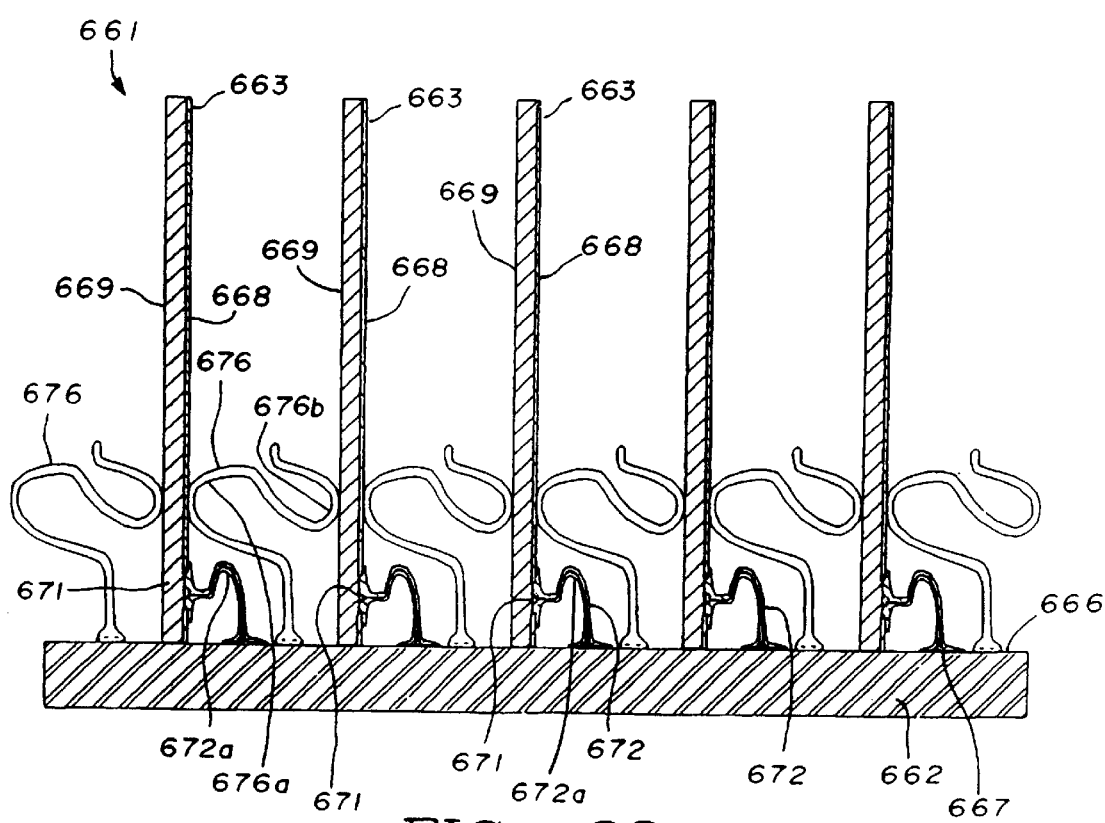
FIG. 38 is a side elevational view in section of a semiconductor package incorporating the present invention showing vertically stacked silicon chips.

Another semiconductor package assembly 661 incorporating the present invention is shown in FIG. 38. It shows an assembly 661 in which a substrate 662 of the type hereinbefore described can be provided, as for example a printed circuit board made of a plastic/laminate or ceramic or silicon with the substrate 662 lying in a plane. A plurality of silicon chips or semiconductor devices 663 are stacked vertically in spaced-apart positions on the substrate 662 and extend in a direction generally perpendicular to the plane of the substrate 662. The substrate 662 is provided with a planar surface 666 which has contact pads 667 connected to circuitry in the substrate 662. Similarly, the silicon chips 663 are provided with parallel spaced-apart surfaces 668 and 669 with contacts 671 being exposed through the surface 668. Contact structures 672 of the type hereinbefore described are provided for making contacts between the contacts 671 of the silicon semiconductor devices 663 and the pads 667 carried by the substrate 662. Thus as shown, a contact structure 672 is provided for each of the silicon chips 663. The contact structures 672 can be of a resilient type and are provided with bends 672a.

Additional contact structures 676 have been provided of the resilient type and are provided with first and second bends 676a and 676b. The bends 676a and 676b are sized in such a manner so that when a contact structure 676 is secured to another pad 678 provided on the surface 666 of the substrate 662, they will engage opposite surfaces of the silicon chip 663 to resiliently support the chip 663 in their vertical positions with respect to the substrate 662.

In connection with the foregoing, it should be appreciated that in place of the single contact structure 676 between each pair of silicon chips, it is possible to provide two separate resilient contact structures with one facing in one direction and the other in the opposite direction to provide the same support as is provided by the single resilient contact structure.

From the foregoing it can be seen that the semiconductor package assembly 661 shown in FIG. 38 lends itself to mass production techniques as for example for stacking memory chips.

In connection with the description of the interconnecting contact structures, interposers and semiconductor assemblies and packages, the methods utilized in fabricating the same have been generally described. The flexible elongate elements, as for example, 106 serving as the skeletons for the contact structures and used as interconnects can be formed utilizing automated wire bonding equipment which is designed to enable bonding of wires using ultrasonic, thermal or compression energy or a combination thereof utilizing such equipment to provide a wire having a continuous feed end and then intimately bonding the feed end to a contact pad or terminal by a combination of thermacompression or ultrasonic energy and thereafter forming from the bonded free end a pin or stem which protrudes from the terminal and has a first stem end. If desired, the second stem end can be bonded to the same contact pad or terminal or to a different contact pad or terminal. The pin or stem can then be severed at the second stem end to define a skeleton. Thereafter, a conductive material is deposited on the skeleton to form a shell as hereinbefore described and on an immediately adjacent area of the contact pad or terminal. This procedure can be replicated to provide additional contact structures.

These are basic steps in the present method for forming the contact structures for making interconnections as hereinbefore described, which also can be characterized as forming protuberant conductive contacts. These contact structures or protuberant conductive contacts can be incorporated into and utilized in conjunction with many conventional semiconductor processes for fabricating semiconductor wafers. As hereinbefore explained, chip passivation utilizing oxide, nitride or polymer dielectric layers can be provided. In addition, shorting layers of a suitable material such as an aluminum, copper, titanium, tungsten, gold or a combination thereof can be utilized. Such a shorting layer makes it possible to use wire bonding equipment which uses high voltage discharge for the severing operations. The shorting layer, optionally electrically grounded, prevents possible damage to the active semiconductor device. Typically, such a shorting layer can be provided and overcoated with a resist and then the skeletons are mounted on the contact pads, defined by the openings in the resist. The skeletons then are overplated with a conductive material to form the shell or muscle, after which the resist and shorting layer can be removed as hereinbefore described. The wafers can then be singulated or diced. Thereafter, the diced chips can be optionally coated with a protective polymer which extends over the region in which the bonds are made to the contact pad.

In connection with such a method, the openings in the resist can be made of a larger size than that of the contact pads. Thereafter, metal can be plated up through the opening in the resist to provide a larger size contact pad or well. The resist and the shorting layer can then be removed, except underneath the larger area contact pad provided.

By providing such a larger area for the contact pad, there is a greater surface to promote adhesion to the contact structures fabricated in accordance with the present invention. Such augmented contact pads can be of any desired shape, such as circular, oval, rectangular and the like. The plated-up metal contact pads have an additional advantage in that they serve to hermetically seal the typically aluminum contact pads from the atmosphere.

Heretofore a method was described in which a contact pad was provided for the free end of a contact structure on which a sacrificial layer was removed after the deposition of the overcoating muscle layer or shell. It should be appreciated that if desired the sacrificial structure can be removed prior to deposition of the overcoating or shell and then the overcoating or shell being formed thereon with CVD, electroless plating or electroplating with a shorting layer for contact.

Also heretofore described was a method for the fabrication of a probe-like contact structure with the use of a sacrificial member such as aluminum or copper. Such a method also can be utilized for the gang transfer of a plurality of contacts onto a package prior to placing the semiconductor chip in the package. In the event of the failure of a package, the expense of the semiconductor chip will be saved with the only resulting loss being in the package and the contacts therein. Thus in accordance with the present invention, the plurality of contacts can be formed on a transfer/sacrificial substrate according to any method heretofore and thereafter gang attached to the package after which the transfer sacrificial substrate can be removed. The attachment of a plurality of contacts on a sacrificial substrate carrier can be readily accomplished by utilizing a software data file to create the required pattern on the transfer substrate without the use of special molds.

By the use of resilient contact structures carried by semiconductor devices as hereinbefore disclosed and using the same to make yieldable and disengageable contacts with contact pads carried by test and burn-in substrates, testing and burn-in can be readily accomplished to ascertain that desired performance characteristics have been met and thereafter the same semiconductor device can be removed from the test and burn-in substrates and without change incorporated into permanent packaging as hereinbefore described by placing multiple semiconductor devices on a common substrate and thereby avoiding the need for first level semiconductor packaging. Thus, in accordance with the present invention, the active semiconductor device can be tested when it is unpackaged and also after it has been packaged into permanent package assembly.

From the foregoing, it can be seen that there has been provided a contact structure for making interconnections with interposers, semiconductor assemblies and packages using the same and a method for fabricating the same. As hereinbefore described, the contact structure has great versatility and can be utilized in many different applications in the semiconductor industry to facilitate mass production of semiconductor assemblies and packages. The contact structures provide increased reliability and high structural integrity making the semiconductor assemblies and packages incorporating the same capable of being utilized in rather adverse environments. Because of the versatility and resiliency of the contact structures of the present invention, it is possible to use the same in many different semiconductor assemblies and package configurations with the contacts being made at different elevations and with different pitches. The contact structure can be utilized in many different configurations for the pads permitting the mounting of semiconductor chips on SIMM and other cards. The contact structures and methods herein disclosed make it possible to fabricate card-ready devices with directly mounted resilient contacts. The method is suitable for mounting contact semiconductor devices either in wafer or singulated form. The equipment utilized for performing the method utilizes micromechanical hardware which is similar to conventional wire bonders already in use in the industry.

Synopsis of the invention

The following numbered paragraphs provide a synopsis of the many aspects of the disclosed invention(s):

1. An interconnection contact structure assembly comprising an electronic component having a surface, a conductive contact terminal carried by the electronic component and accessible through the surface, an internal flexible elongate member having first and second ends and with paid first end forming a first intimate bond to the surface of said conductive contact terminal without the use of a separate bonding material and an electrically conductive shell formed of at least one layer of a conductive material with said at least one layer enveloping the elongate member and forming a second intimate bond with at least a portion of the conductive contact terminal immediately adjacent the first intimate bond.

2. A structure as in Paragraph #1 wherein the strengths of the first and second intimate bonds as measured by pull, shear and/or bend can be characterized as being greater for the second intimate bond than the first intimate bond.

3. A structure as in Paragraph #2 wherein the strength of the second intimate bond is at least twice that of the first intimate bond.

4. A structure as in Paragraph #1 wherein said at least one layer is compressively stressed.

5. A structure as in Paragraph #1 wherein said internal flexible elongate member and said at least one layer of the shell are formed to provide a cantilever to impart a resilient characteristic to the interconnection contact structure.

6. A structure as in Paragraph #1 wherein said shell has an outer layer and wherein said outer layer is a solder alloy.

7. A contact structure for use as an interconnect with an assembly which incorporates a semiconductor device, the assembly including an electronic component which includes a surface having at least one conductive contact pad thereon, said contact pad having a surface, said contact structure comprising at least one conductive flexible elongate element having first and second ends, means bonding the first end to the surface of the contact pad to form a first intimate bond, a shell substantially enveloping the flexible elongate element and at least a portion of the surface of the conductive contact pad immediately adjacent the means bonding the first end of the flexible elongate element to the contact pad to provide a second intimate bond so that the strength of the second intimate bond is greater than that of the first intimate bond.

8. A structure as in Paragraph #7 wherein said shell is formed of at least one layer of a conductive material.

9. A structure as in Paragraph #8 wherein said flexible elongate element is provided with at least one cantilever forming a bend.

10. A structure as in Paragraph #9 wherein said conductive shell has a high-yield strength.

11. A structure as in Paragraph #10 wherein said conductive material of said shell is principally formed of s material selected from the group of nickel, cobalt, iron, phosphorous, boron, copper, tungsten, molybdenum, rhodium, chromium, ruthenium, silver, palladium and their alloys.

12. A structure as in Paragraph #8 wherein said shell includes a layer which provides internal compressive stresses.

13. A structure as in Paragraph #7 wherein said second and is a free end.

14. A structure as in Paragraph #13 wherein said free end has a ball-like configuration.

15. A structure as in Paragraph #7 together with an outer conductive layer adherent to the shell of a conductive material, said outer conductive layer being formed of a material to which good electrical connections can be made.

16. A structure as in Paragraph #7 wherein said shell has an exterior surface, said exterior surface having micro protrusions formed therein.

17. A structure as in Paragraph #9 together with a conductive flexible material mass extending from said surface of the contact pads and over the bend to minimize the inductive characteristics of the bend while permitting flexure of the bend.

18. A structure as in Paragraph #13 wherein said free end extends above the surface of the electronic component.

19. A structure as in Paragraph #13 wherein said free end extends down below the surface of the electronic component.

20. A structure as in Paragraph #7 together with a layer of dielectric material disposed on the shell and an additional layer of conductive material disposed on the dielectric material to provide a shielded contact structure.

21. A structure as in Paragraph #10 wherein said second end is free so that the second end can serve as a resilient probe contact to resiliently engage the contact terminal.

22. A contact structure as in Paragraph #21 wherein said contact structure includes a depending portion serving as an electrical contact.

23. A contact structure as in Paragraph #13 wherein said free end is provided with a contact pad carried by the free end and having at least one layer with a plurality of spaced apart protrusions.

24. A structure as in Paragraph #23 wherein said layer having protrusions is formed of a hard conductive material.

25. A structure as in Paragraph #24 wherein said hard conductive material is selected from the group nickel, cobalt, rhodium, iron, chromium, tungsten, molybdenum, carbon and their alloys.

26. A structure as in Paragraph #10 wherein said probe and is provided with a cantilevered portion adjacent the free end.

27. A structure as in Paragraph #7 together with means bonding the second end to the same conductive contact pad to which the first end is bonded and solder enveloping said contact structure and serving to form a solder bump.

28. A structure as in Paragraph #27 wherein said shell has an exterior layer which is formed principally of a solder material.

29. A structure as in Paragraph #7 wherein said flexible elongate element is formed into loops extending over the contact pad and enclosing a planar surface area therebetween with the shell being formed on the flexible elongate element and solder means secured to the shell of the flexible elongate element and forming a solder bump covering the enclosed planar area.

30. An interposer for use in a semiconductor assembly, a substrate formed of an insulating material having first and second spaced apart surfaces and having s plurality of spaced apart contact pads on at least one of said surfaces and a plurality of contact structures mounted on the contact pads on said at least one of the surfaces, each of said contact structures including at least one flexible elongate element having first and second ends, means bonding the first ends to a contact pad and having a shell of conductive material formed on the flexible elongate elements and bonded to the contact pad, the second end being free and extending above the substrate.

31. An interposer as in Paragraph #30 wherein said substrate is provided with holes extending through the substrate together with additional flexible elongate elements secured to the contact pads and extending through the holes and a shell formed of a conductive material on the additional flexible elongate elements.

32. An interposer as in Paragraph #31 wherein said flexible elongate element is formed with a bend therein having a cantilever portion and wherein said shell is formed of a material having a high yield strength of at least thirty thousand pounds per square inch.

33. An interposer as in Paragraph #31 wherein said holes have portions which are offset with respect to each other extending through the first and second surfaces and providing shoulders which are recessed with respect to the first and second surfaces together with contact pads disposed on said shoulders and wherein said contact structures are secured to the contact pads disposed on the shoulders and have free ends which extend outwardly through the holes beyond the first and second surfaces to provide free ends which lie in the spaced parallel planes.

34. An interposer as in Paragraph #31 wherein said holes having conductors extending therethrough.

35. An interposer as in Paragraph #31 wherein said holes are in the form of plated-through holes and wherein said contact structures are disposed on contact pads on one of the first and second surfaces together with additional contact structures extending across the plated-through holes and being bonded to contact pads on the other side of the substrate, said additional contact structures including flexible elongate elements and a shell formed on the flexible elongate elements.

36. An interposer as in Paragraph #35 wherein said additional contact structures are substantially loop-shaped in elevation together with solder formed on the additional contact structure to provide a solder bump.

37. A semiconductor device assembly comprising an active semiconductor device having surface with contact pads formed thereon and a plurality of contact structures mounted on the contact pads, each of said contact structures including a flexible elongate element having first and second ends, means bonding the first end to the contact pad with the second end being free and a shell formed on the flexible elongate element and formed of a conductive material which extends over the flexible elongate element and at least a portion of the contact pad to which it is secured, said flexible elongate element having a cantilever portion forming a bend therein, said contact pads being spaced apart at predetermined distances, the free second ends of said contact structures being spaced apart at greater distances than the spacing between the first ends of the flexible elongate elements bonded to the contact structures.

38. An assembly as in Paragraph #37 wherein the second free ends are staggered with respect to the first ends of the flexible elongate elements.

39. A semiconductor assembly as in Paragraph #37 together with registration pins secured to and mounted on the surface of the semiconductor device, said registration pins being formed of a flexible elongate element and a shell formed on the flexible elongate element.

40. An assembly as in Paragraph #39 wherein said flexible elongate element and said shell of the registration pins being formed of the same materials as the contact structures.

41. A semiconductor package assembly comprising a substrate formed of an insulating material having first and second surfaces and having contact pads disposed on at least one of the first and second surfaces, at least one active semiconductor device having a first surface and having contact pads and interconnecting resilient contact structures having first and second ends and having the first ends adapted to be bonded to either the pads carried by one surface of the substrate or to the contact pads of the semiconductor device to form bonds therewith and having the second ends adapted to make contact with the contact pads of the semiconductor device or the contact pads carried by one surface of the substrate free of bonds, said interconnecting contact structures each being comprised of a flexible elongate element having a cantilevered portion forming a bend therein and a shell of a conductive material having a high yield strength of at least thirty thousand pounds per square inch disposed on the flexible elongate element and serving to provide spring characteristics to the interconnecting contact structures to resiliently secure the active silicon device to the substrate.

42. An assembly as in Paragraph #41 together with at least one additional active semiconductor device having contact pads and means connecting the contact pads with the at least one additional active semiconductor device to the contact pads in the other surface of the substrate.

43. An assembly as in Paragraph #42 wherein said means connecting the contact pads of the at least one additional semiconductor device to the contact pads on the other surface of the substrate includes interconnecting contact structures of the same construction as the first named interconnecting contact structures.

44. An assembly as in Paragraph #41 wherein the shells formed of a conducting material are intimately bonded to the contact pads so as to provide additional pull strength securing the contact structures to the contact pads.

45. An assembly as in Paragraph #41 wherein said substrate is a printed circuit board and wherein said printed circuit board is provided with a plurality of layers of metallization and vertical via conductors extending therethrough and wherein the contact pads are in contact with the vertical via conductors.

46. An assembly as in Paragraph #41 together with spring clip means secured to the substrate and extending over the semiconductor device to retain the at least one active semiconductor device in a predetermined position with respect to the substrate and placing compressive forces on the interconnecting resilient contact structures.

47. An assembly as in Paragraph #46 wherein said spring clip means is formed of the same materials as the interconnecting resilient contact structures.

48. An assembly as in Paragraph #45 wherein the interconnecting contact structures have second free ends and wherein the second free ends extend through the vertical via conductors in the printed circuit board and frictionally engage the vertical via conductors to form electrical contact therewith while serving to retain the semiconductor device in a predetermined position with respect to the substrate.

49. An assembly as in Paragraph #41 wherein said substrate is provided with a plurality of holes and spring clip means secured to the semiconductor device and extending through the holes and engaging the printed circuit board for retaining the semiconductor device in a predetermined position with respect to the substrate and to place compressive forces upon the resilient contact structures connecting the contact pads on the substrate to contact pads on the semiconductor device.

50. An assembly as in Paragraph #41 wherein said substrate is provided with a plurality of alignment holes, alignment pins mounted on said semiconductor device and extending through said holes in said substrate for maintaining alignment of the semiconductor device with respect to the substrate and adhesive means disposed between the semiconductor device and the substrate for retaining the semiconductor device in the predetermined position with respect to the substrate in the alignment determined by the alignment pins.

51. An assembly as in Paragraph #50 wherein said alignment pins are formed of elongate elements having shells formed thereon to provide additional structural support for the flexible elongate elements.

52. An assembly as in Paragraph #41 together with a capacitor disposed between said first semiconductor device and said substrate, said capacitor having contact terminals and means coupling said contact terminals to the contact pads of the first semiconductor device.

53. An assembly as in Paragraph #52 wherein said substrate is formed with a recess therein and wherein the capacitor is disposed therein.

54. An assembly as in Paragraph #52 wherein said means coupling the contact terminals to the contact pads with the first active semiconductor device includes contact pads disposed adjacent the recess.

55. An assembly as in Paragraph #41 wherein said substrate is provided with a second surface having steps therein at different levels and wherein contact pads are provided on the steps and wherein contact structures are secured to the pads on the steps and have free ends extending into the same horizontal plane.

56. An assembly as in Paragraph #41 wherein said substrate is provided with a recess extending through the first surface, a capacitor disposed in the recess and additional contact structures carried by the capacitor and terminating in the same plane as the contact pads with the semiconductor structure and secured to the semiconductor device and making electrical contact to the semiconductor structure.

57. An assembly as in Paragraph #41 together with an integration substrate having a plurality of contact pads thereon together with additional resilient contact structures interconnecting the contact pads of the substrate to the contact pads of the integration substrate.

58. An assembly as in Paragraph #57 together with a plurality of additional substrates mounted on the integration substrate and contact structures connecting the additional substrates to the integration substrate.

59. An assembly as in Paragraph #58 wherein said contact structures interconnecting said substrates to said integration substrate include an interposer having a first and second sides and having contact pads thereon with electrical interconnections between at least certain of contact pads on the first and second sides, said contact structures making contact with the contact pads on the interposer and contact pads on the substrate and solder means forming a connection between the contact pads of the interposer and the contact pads of the integration substrate.

60. An assembly as in Paragraph #59 wherein said resilient contact structures yieldably engage the contact pads of the interposer, the substrate or the integration substrate and restraining means interconnecting the substrate to the integration substrate so that compressive forces are applied to the contact structures so that the contact structures remain in electrical contact with the contact pads.

61. An assembly as in Paragraph #60 wherein said restraining means is in the form of removable fastening means.

62. A semiconductor package assembly comprising a substrate formed of an insulating material having first and second surfaces and having conductive contact pads on the first and second surfaces, a plurality of semiconductor devices having contact pads facing the contact pads on the first and second surfaces of the substrate and resilient contact structures for electrically interconnecting the contact pads of the semiconductor devices and the contact pads carried by the substrate and for supporting the semiconductor devices in spaced-apart positions from the surfaces of the substrate so that the semiconductor devices lie in first and second parallel planes on opposite sides of the substrate and contact means carried by the substrate for making electrical contact to the semiconductor devices through the contact structures.

63. An assembly as in Paragraph #62 wherein said contact means is disposed in a plane and is disposed in a row.

64. A method for providing a structural contact for engagement with a contact pad carried by an electronic component by the use of a flexible elongate conductive element having first and second ends, securing the first end to the contact pad to form a first bond and forming a conductive material on the flexible elongate element to form a shell which extends over the flexible elongate element to provide the structural contact and which extends over first the bond and over the contact pad to adhere thereto so as to provide additional strength between the contact pad and the structural contact.

65. A method as in Paragraph #64 together with the step of forming a bend in the flexible elongate element between the first and second ends and forming the shell over the bend to provide yieldable spring-like properties for the contact structure.

66. A method as in Paragraph #65 together with the steps of providing an additional electronic component having a contact pad thereon together with the step of contacting the second end of the flexible elongate element to the contact pad on the additional electronic component to establish an electrical connection between the same.

67. A method as in Paragraph #66 together with the step of applying compressive forces between the electronic component and the additional electronic component so that compressive forces are maintained on the contact structures.

68. A method as in Paragraph #64 together with the step of securing the second end to the same contact pad to form a second bond.

69. A method for mounting a protuberant conductive contact to a conductive terminal on electronic component, the method comprising sequential steps of providing a wire having a continuous feed end intimately bonding the feed end to the terminal, forming from the bonded feed end a stem which protrudes from the terminal and has a first stem end thereat, bonding a second stem end into a sacrificial member mounted in spaced relationship from the component, severing the stem at the second stem end to define a skeleton, depositing a conductive material to envelop the skeleton and at least an adjacent surface of the component and eliminating the sacrificial member.

70. The method as in Paragraph #69 wherein during the eliminating step, the second stem end is severed from the sacrificial member.

71. The method as in Paragraph #69 wherein the conductive material is provided with a multitude of microprotrusions on its surface.

72. The method as in Paragraph #69 wherein the depositing step includes placement of a plurality of layers each differing from one another.

73. The method as in Paragraph #73 wherein at least one of the layers comprising conductive material has a jagged topography in order to reduce contact resistance of the protuberant conductive contact when mated to a matching terminal.

74. A method for mounting a protuberant conductive contact to a conductive terminal on an electronic component, the method comprising sequential steps of providing a wire having a continuous feed end to the terminal, intimately bonding the feed end to the terminal, forming from the feed end a stem which protrudes from the terminal and has a first stem end thereat, severing the stem at a second stem end to define a skeleton, depositing a conductive material to envelop the skeleton and adjacent surface of the terminal, performing the same steps on a plurality of terminals, at least one electronic component and wherein the terminals are in different planes, the forming steps resulting in a plurality of free standing protuberant stems, the severing steps being performed on the respective stems, all in a common plane.

75. A method as in Paragraph #74 wherein the terminals are in different planes and wherein the forming steps are carried out on the different planes.

76. A method for performing test and/or burn in procedures on a semiconductor device having a plurality of resilient contact structures mounted thereon by the use of a separate test or burn-in substrate having contact pads thereon arranged in a predetermined pattern, the method comprising positioning the semiconductor device with the plurality of resilient contact structures under compressive forces with respect to the test or burn-in substrate to yieldably urge the resilient contact structures associated with the semiconductor device into engagement and electrical contact with the contact pads of the test or burn-in substrate, performing tests on the semiconductor device while the resilient contact structures are in engagement with the contact pads of the test or burn-in substrate and removing the semiconductor device with the plurality of resilient contact structures from engagement with the contact pads of the test or burn-in substrate after completion of the testing or burn-in.

77. A method as in Paragraph #76 for use with an integration substrate having a plurality of contact pads thereon arranged in a predetermined pattern, and following completion of the testing or burn-in procedures, performing the additional steps of placing the resilient contact structures of the semiconductor device into engagement with the contact pads on the integration substrate and forming a permanent connection between the contact structures and the contact pads of the integration substrate.

78. A method as in Paragraph #76 wherein said contact structures have base and free ends together with the step of changing the spacing between the free ends so that the spacing is different from the base ends and corresponds to the spacing of the contact pads on the substrate.

79. A method for mounting a protuberant conductive contact to a conductive terminal on an electronic component, the method comprising the steps of providing a wire having a continuous feed end, intimately bonding the feed end to the terminal, forming from the feed end a stem which protrudes from the terminal and has a first stem end thereat, severing the stem at a second stem end to define a skeleton, depositing a conductive material to envelop the skeleton and adjacent surface of the terminal.

80. A method as in Paragraph #79 wherein the forming steps and the severing steps are performed by a wire bonding apparatus and after the severing steps but before the depositing step shaping the skeleton by means of a tool external to the apparatus.

81. A method as in Paragraph #79 wherein the conductive material is provided with a multitude of microprotrusions on its surface.

82. A method as in Paragraph #79 with the depositing step including placement of a plurality of layers each differing from one another.

83. A method as in Paragraph #79 wherein the depositing step includes placement of a plurality of layers each different from one another.

84. A method as in Paragraph #79 performed on a plurality of the terminals and wherein the forming steps result in a plurality of free standing protuberant stems, the severing steps are performed on the respective stems all in a common plane.

85. A method as in Paragraph #79 performed on a plurality of the terminals on at least one electronic component and wherein the terminals are in different planes, the forming steps resulting in a plurality of free standing protuberant stems, the severing steps being performed on the respective stems all in a common plane.

86. A method as in Paragraph #79 performed on at least one terminal on an electronic component wherein the wire is made primarily of a metal selected from a group consisting of gold, copper, aluminum, silver, indium and alloys thereof, the skeleton being coated with a first layer of conductive material selected from a group consisting of nickel, cobalt, boron, phosphorous, copper, tungsten, titanium, chromium and alloys thereof, and the top layer of the conductive material is a solder selected from a group consisting of indium, bismuth, antimony, gold, silver, cadmium and their alloys.

What is claimed is:

1. A space transformer comprising:
   a first substrate provided with first electrical contact areas on one side thereof;
   first resilient contact structures, each having an elongate springable shape and a respective portion connected to a respective first electrical contact area of said first electrical contact areas, and extending from the respective first electrical contact area;
   a second substrate provided with second electrical contacts on one side thereof and third electrical contacts on an opposite side thereof, the second contact areas facing the first contact areas and each first resilient contact structure having a respective contact region connected to a respective one of the second electrical contacts, the second substrate being demountable from the first substrate; and
   second resilient contact structures, each having an elongate springable shape and a respective portion connected to a respective third electrical contact area of said third electrical contact areas and extending from the respective third electrical contact area,
   selected ones of the first resilient contact structures are interconnected with selected ones of the second contact structures, and
   selected ones of the first contact areas are spaced from one another by first distances, and selected ones of the second resilient contact structures have contact regions, remotely located from the portions thereof, which are spaced from one another by second distances which are different from the first distances.

2. A space transformer, according to claim 1, wherein:
   the first substrate is a printed circuit board.

3. A space transformer, according to claim 1, wherein:
   selected ones of the second electrical contact areas and selected ones of the third electrical contact areas are annular rings of plating around plated-through holes.

4. A space transformer, according to claim 1, wherein selected ones of the first resilient contact structures comprise:
   a flexible elongate core element having a first end and a second end and formed of a readily-shaped material;
   an electrically conductive shell of a different material than the flexible elongate core element, formed of at least one layer of conductive material on the elongate core element.

5. A space transformer, according to claim 4, wherein:
   the flexible elongate core element is selected from:
      (a) gold, aluminum and copper with small amounts of beryllium, cadmium, silicon and magnesium, and
      (b) metals of the platinum group, and
      (c) lead, tin, indium and their alloys.

6. A space transformer, according to claim 4, wherein:
   the flexible elongate core element has a diameter in the range of from 0.25 to 10 mils.

7. A space transformer, according to claim 6, wherein:
   the flexible elongate core element has a diameter in the range of from 0.5 to 3 mils.

8. A space transformer, according to claim 4, wherein:
   the flexible elongate core element has a length in the range of from 10 mils to 500 mils.

9. A space transformer, according to claim 4, wherein:
   at least one layer of the electrically conductive shell is formed of a material which is selected for its ability to provide mechanical properties selected from the group consisting of spring properties, resiliency yield strength and compliance for the first resilient contact structures.

10. A space transformer, according to claim 4, wherein:
    at least one layer of the electrically conductive shell is formed of a material selected from nickel, iron, cobalt and their alloys.

11. A space transformer, according to claim 4, wherein:
    at least one layer of the electrically conductive shell is formed of a material selected from copper, nickel, cobalt, tin, boron, phosphorous, chromium, tungsten, molybdenum, bismuth, indium, cesium, antimony, gold, silver, rhodium, palladium, platinum, ruthenium, and their alloys.

12. A space transformer, according to claim 4, wherein:
    at least one layer of the electrically conductive shell is formed of a material selected from nickel, cobalt, iron, phosphorous, boron, copper, tungsten, molybdenum, rhodium, chromium, ruthenium, lead, tin and their alloys.

13. A space transformer, according to claim 4, wherein:
    the electrically conductive shell has a thickness in the range of from 0.20 mils to 20 mils.

14. A space transformer, according to claim 13, wherein:
    the electrically conductive shell has a thickness in the range of from 0.25 mils to 10 mils.

15. A space transformer, according to claim 1, wherein:
    the substrate is a multi-layer interconnection substrate.

* * * * *